(12) United States Patent
Anezaki

(10) Patent No.: US 7,998,806 B2
(45) Date of Patent: Aug. 16, 2011

(54) SEMICONDUCTOR DEVICE AND METHOD OF MANUFACTURING THE SAME

(75) Inventor: Toru Anezaki, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 284 days.

(21) Appl. No.: 12/187,851

(22) Filed: Aug. 7, 2008

(65) Prior Publication Data

US 2009/0039411 A1 Feb. 12, 2009

(30) Foreign Application Priority Data

Aug. 10, 2007 (JP) ................... 2007-209410

(51) Int. Cl.
*H01L 21/8238* (2006.01)

(52) U.S. Cl. ........ 438/225; 438/207; 438/221; 438/297; 438/439

(58) Field of Classification Search .................. 438/207, 438/221, 225, 294, 296, 297, 439; 257/E21.625, 257/E21.628

See application file for complete search history.

(56) References Cited

U.S. PATENT DOCUMENTS

| | | | | |
|---|---|---|---|---|
| 5,843,835 | A | * | 12/1998 | Liu ................................ 438/585 |
| 6,380,020 | B1 | * | 4/2002 | Shimizu ......................... 438/225 |
| 7,119,412 | B2 | | 10/2006 | Yamamoto |
| 7,419,864 | B2 | * | 9/2008 | Ohkawa et al. ................ 438/199 |

FOREIGN PATENT DOCUMENTS

| | | |
|---|---|---|
| JP | 2005-129760 A | 5/2005 |
| JP | 2005-142362 A | 6/2005 |
| JP | 2006-19661 A | 1/2006 |
| KR | 10-2005-0009617 A | 1/2005 |

OTHER PUBLICATIONS

Korean Office Action dated Jun. 11, 2010, issued in corresponding Korean Patent Application No. 1020080077453.

* cited by examiner

*Primary Examiner* — Andy Huynh
(74) *Attorney, Agent, or Firm* — Westerman, Hattori, Daniels & Adrian, LLP

(57) ABSTRACT

A method of manufacturing a semiconductor device includes forming an oxidation film over a first and a second device region, forming an first etching preventing film extending over a first and a second area, removing the first etching preventing film over the first area; removing the oxidation film over the first device region, forming a first gate insulating film over the first device region, removing the oxidation film over the second device region, forming a second gate insulating film over the second device region, forming a first gate electrode over the first gate insulating film, forming a second gate electrode over the second gate insulating film, forming first source and drain regions in the first device region at both sides of the first gate electrode, and forming second source and drain regions in the second device region at both sides of the second gate electrode.

9 Claims, 59 Drawing Sheets

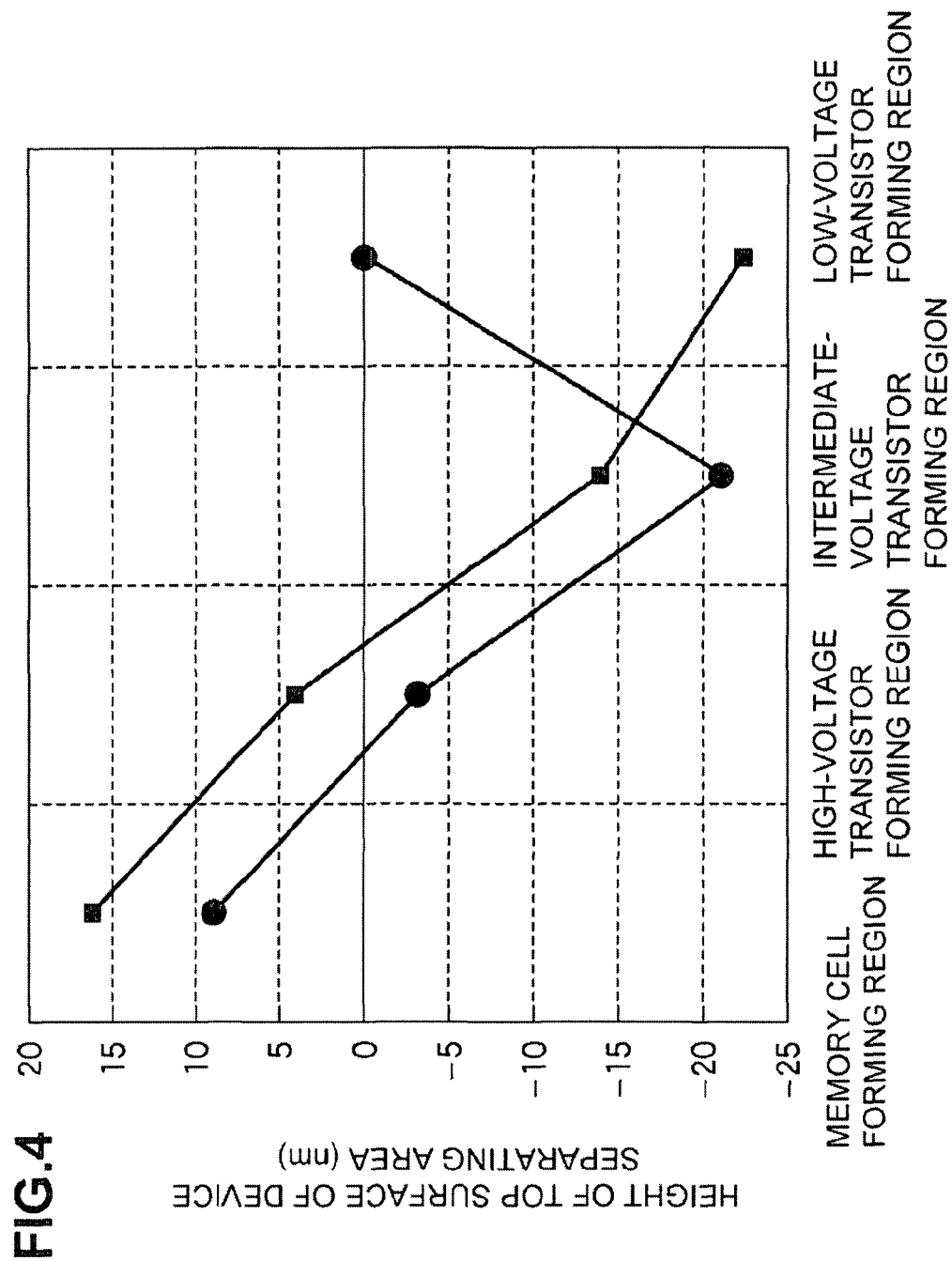

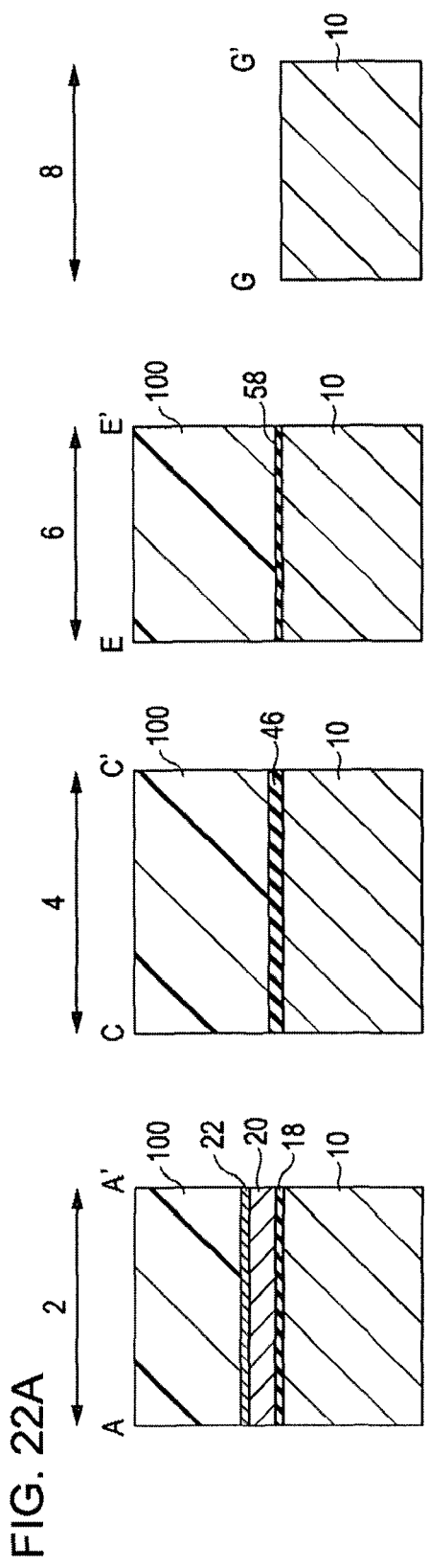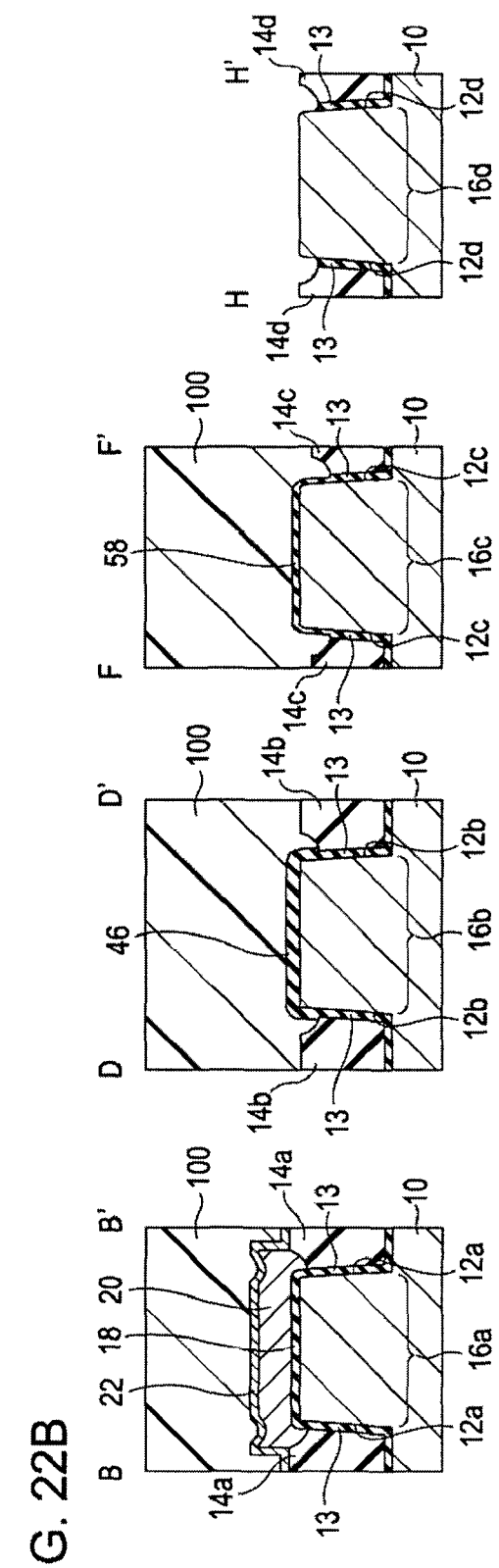
FIG. 22A
FIG. 22B

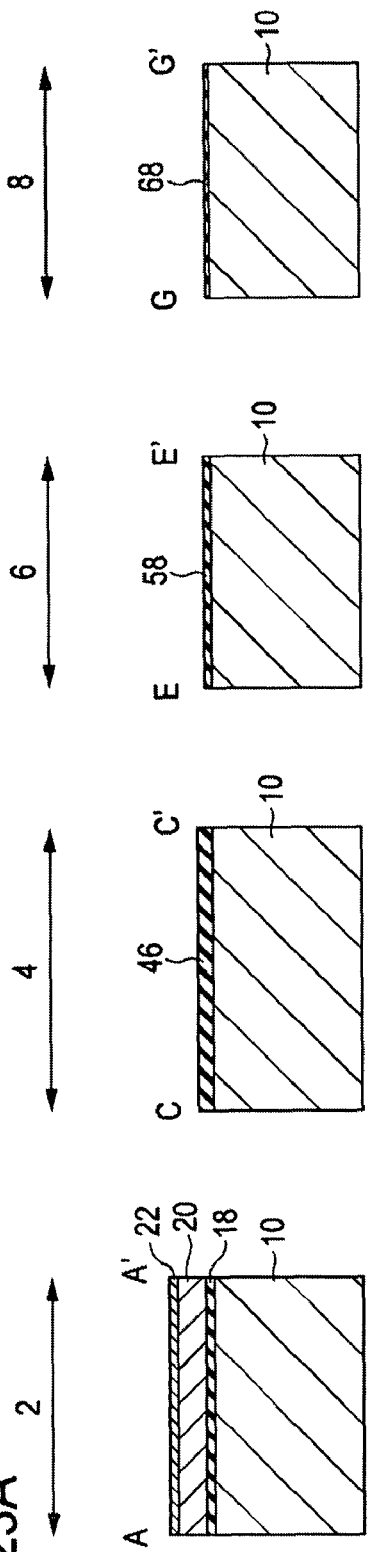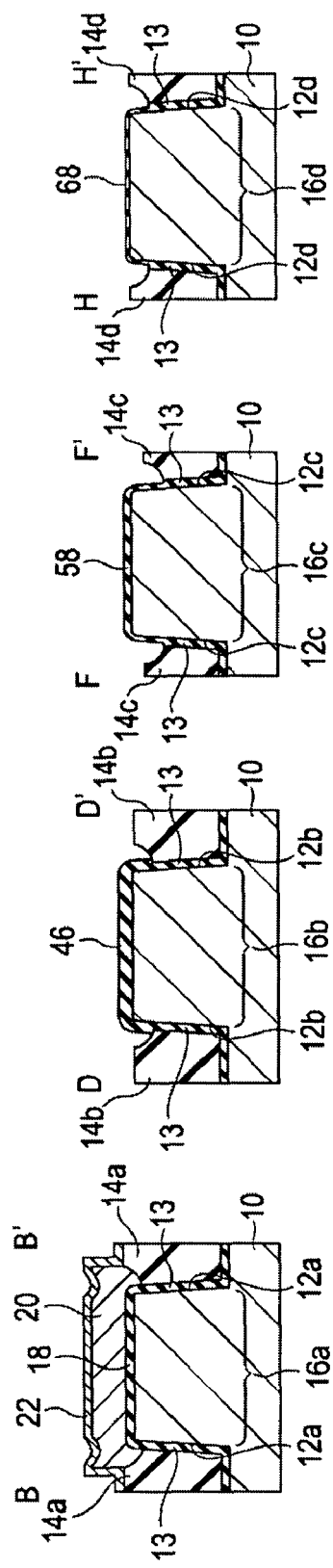
FIG. 23A
FIG. 23B

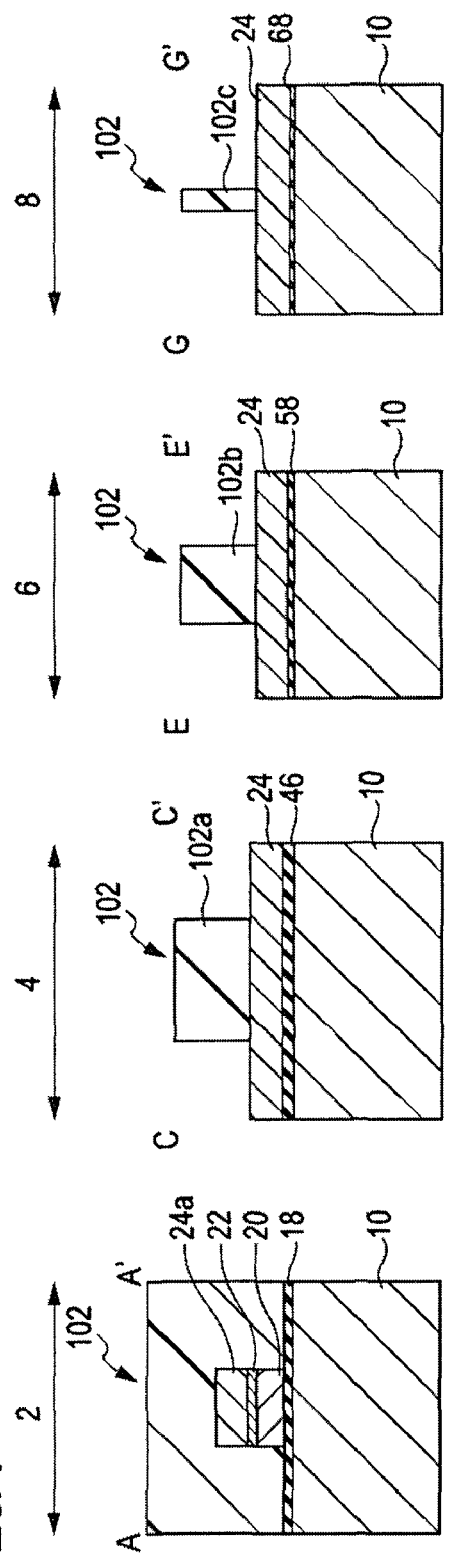
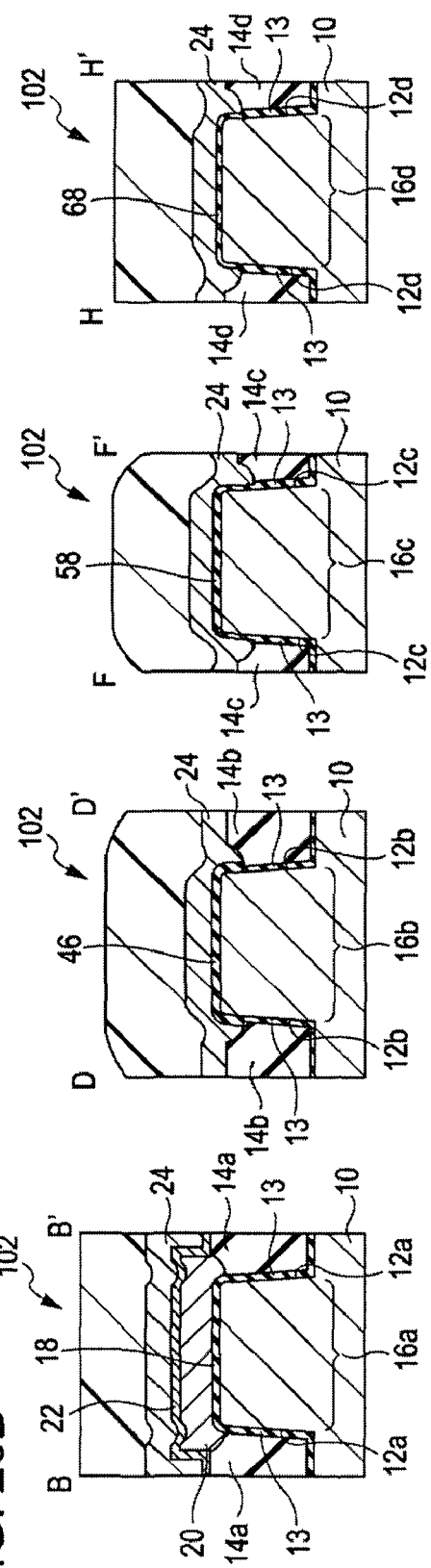
FIG. 26A
FIG. 26B

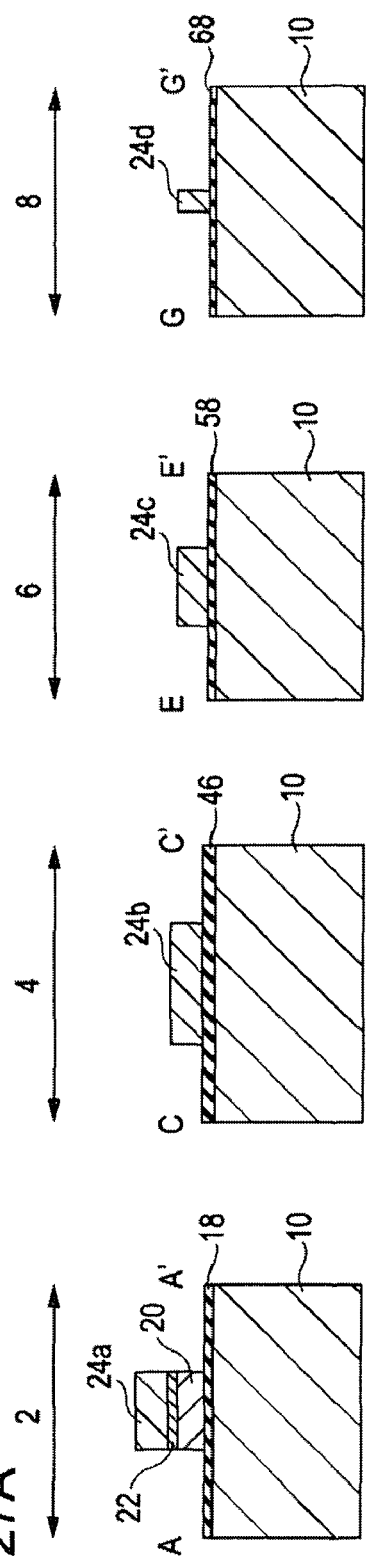
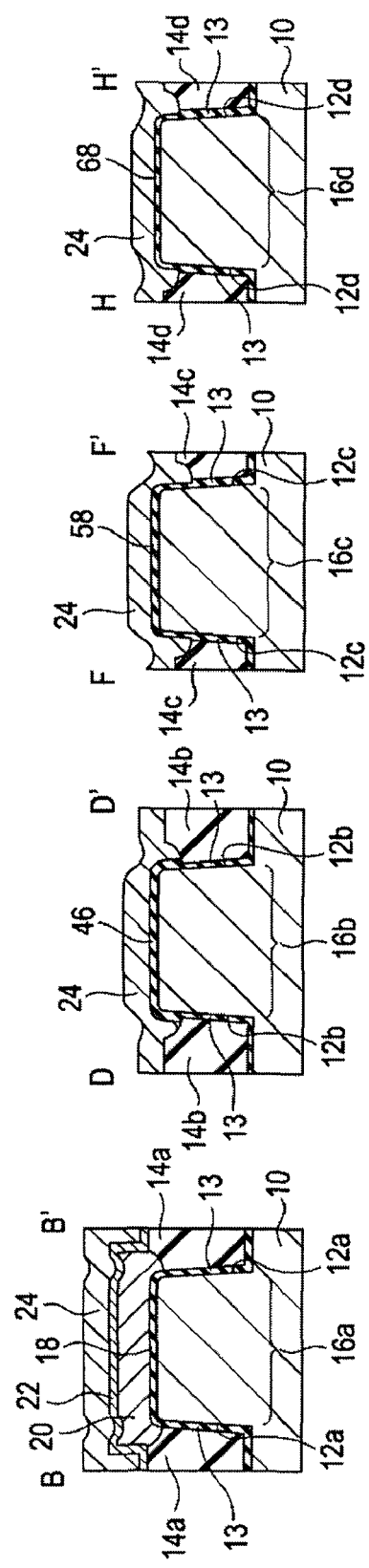
FIG. 27A
FIG. 27B

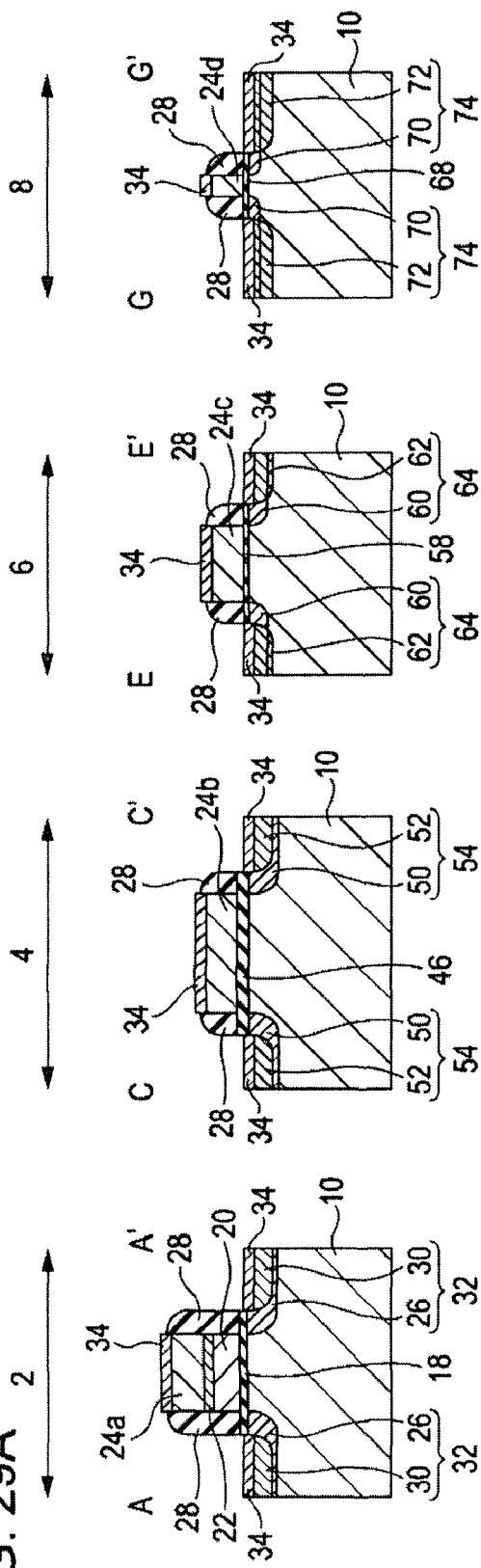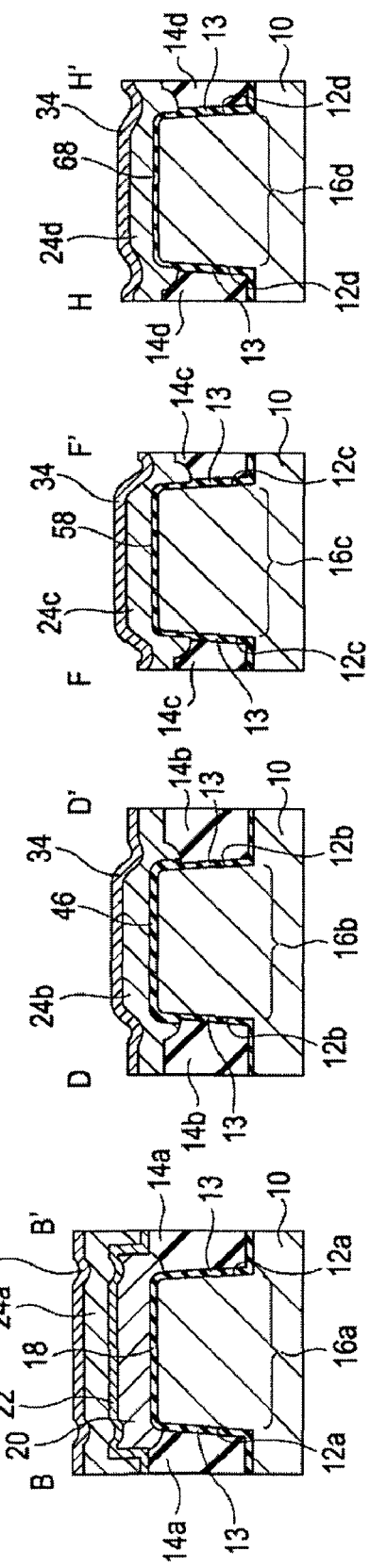

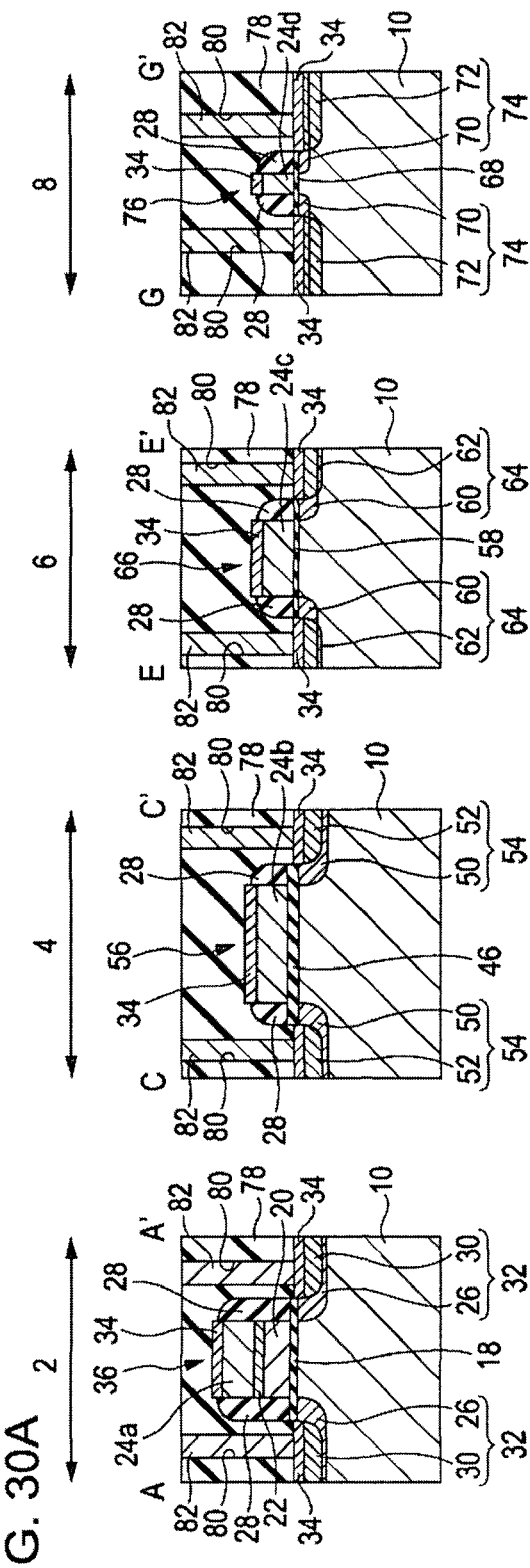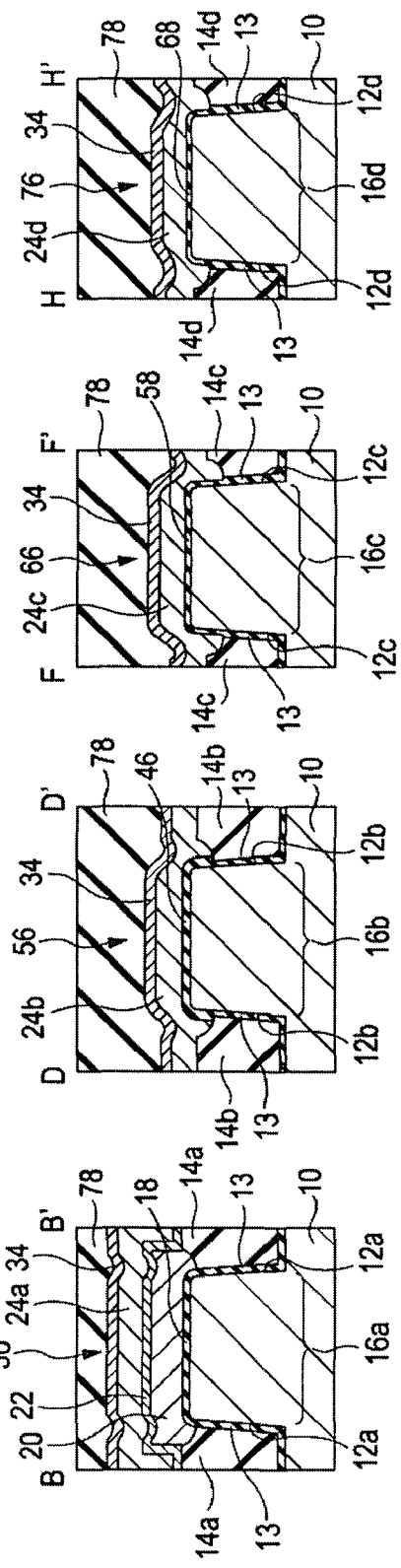
FIG. 30A
FIG. 30B

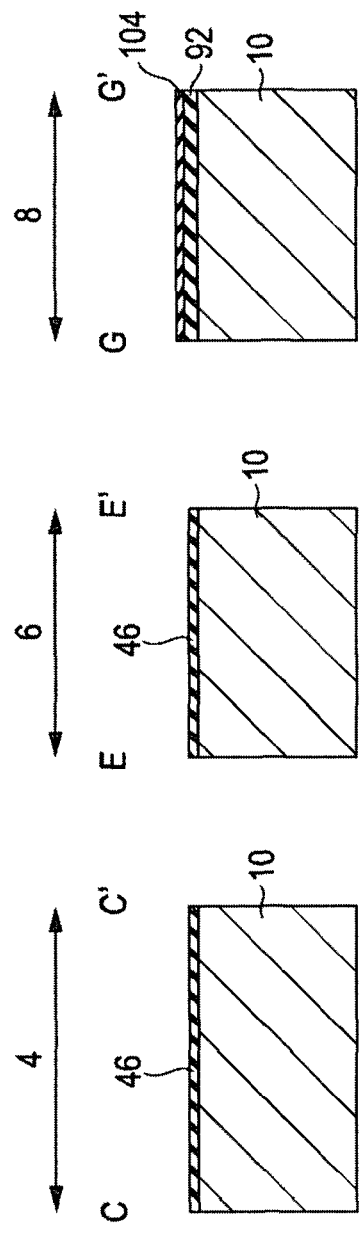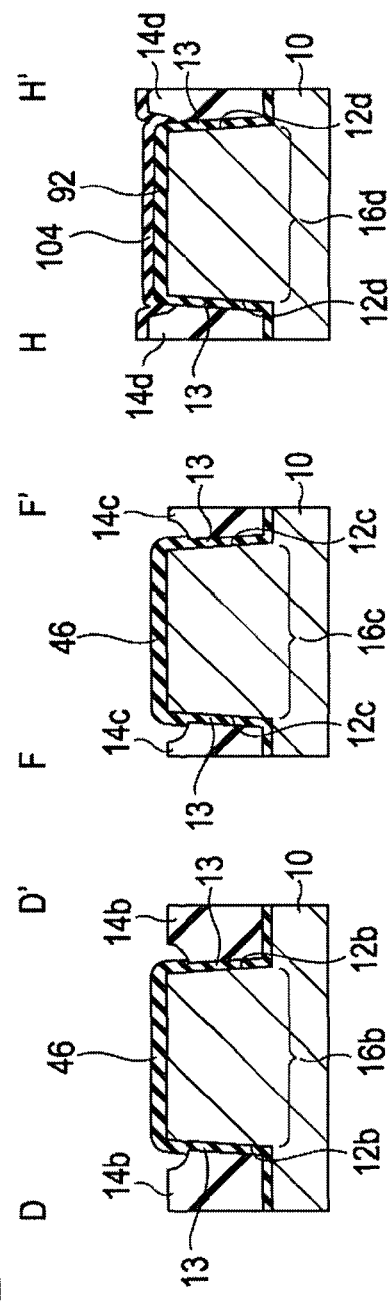

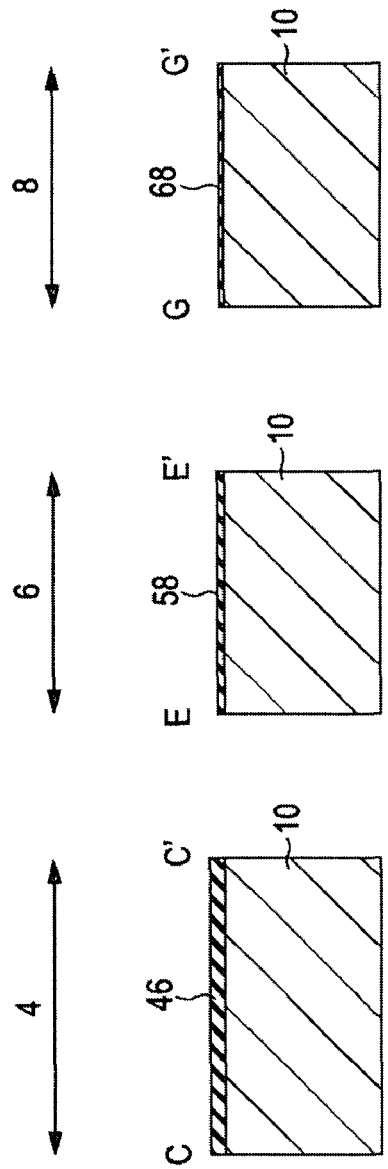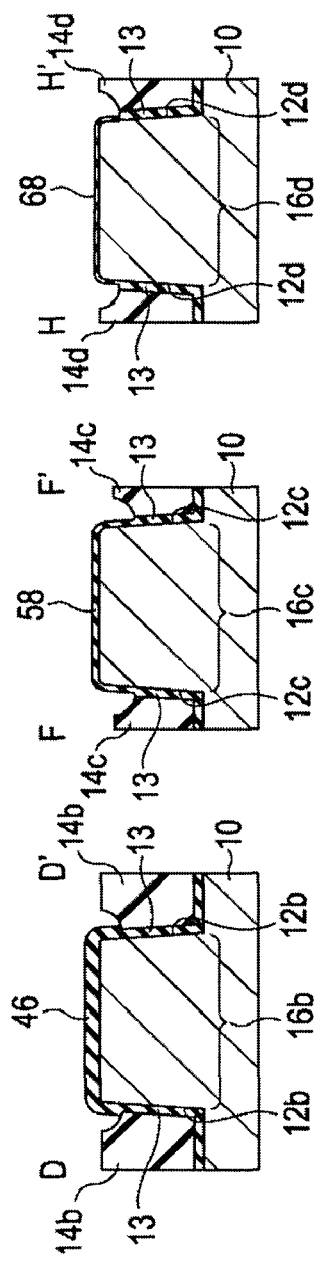
FIG. 49A
FIG. 49B

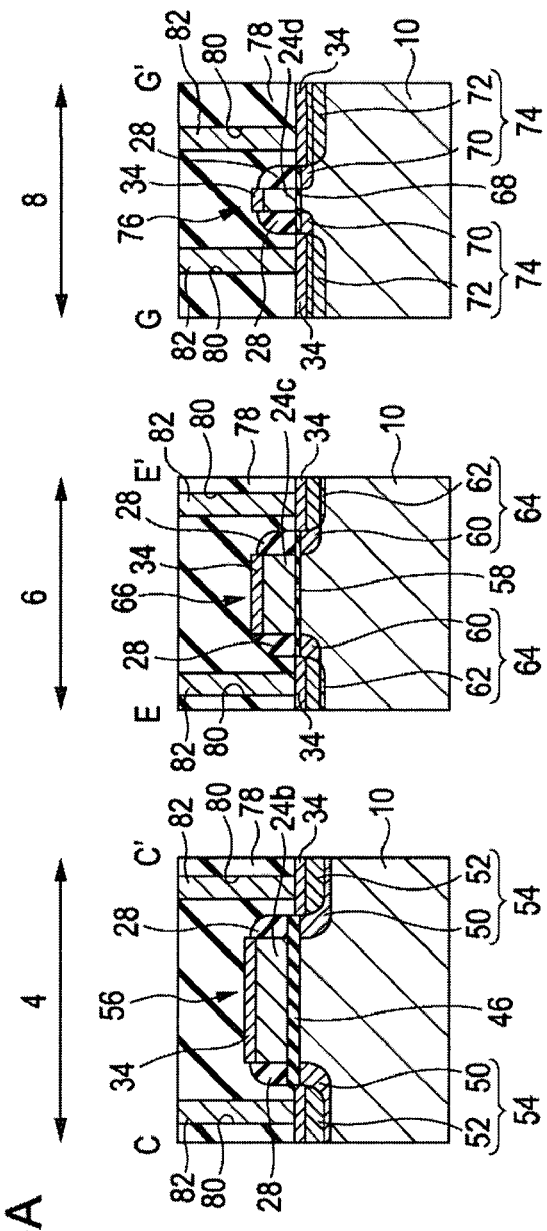
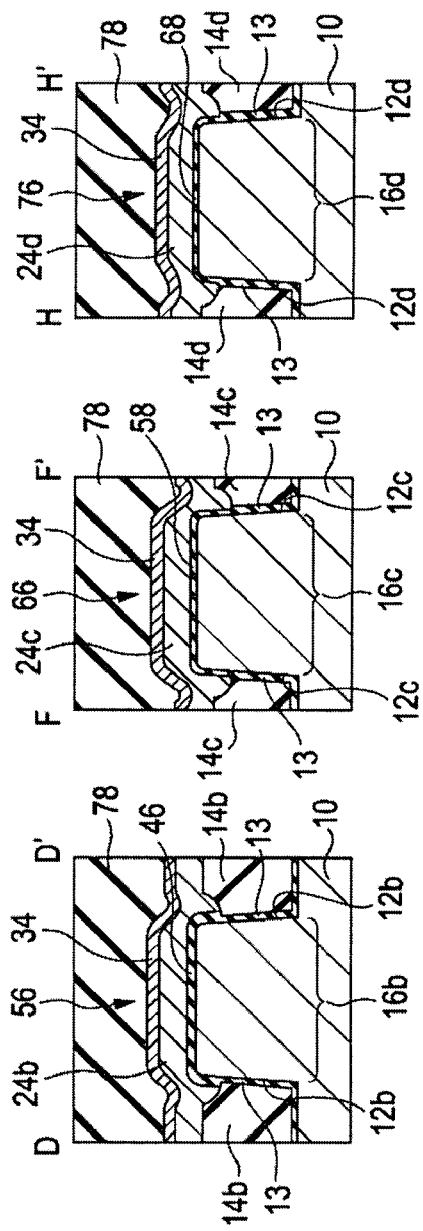
FIG. 55A
FIG. 55B

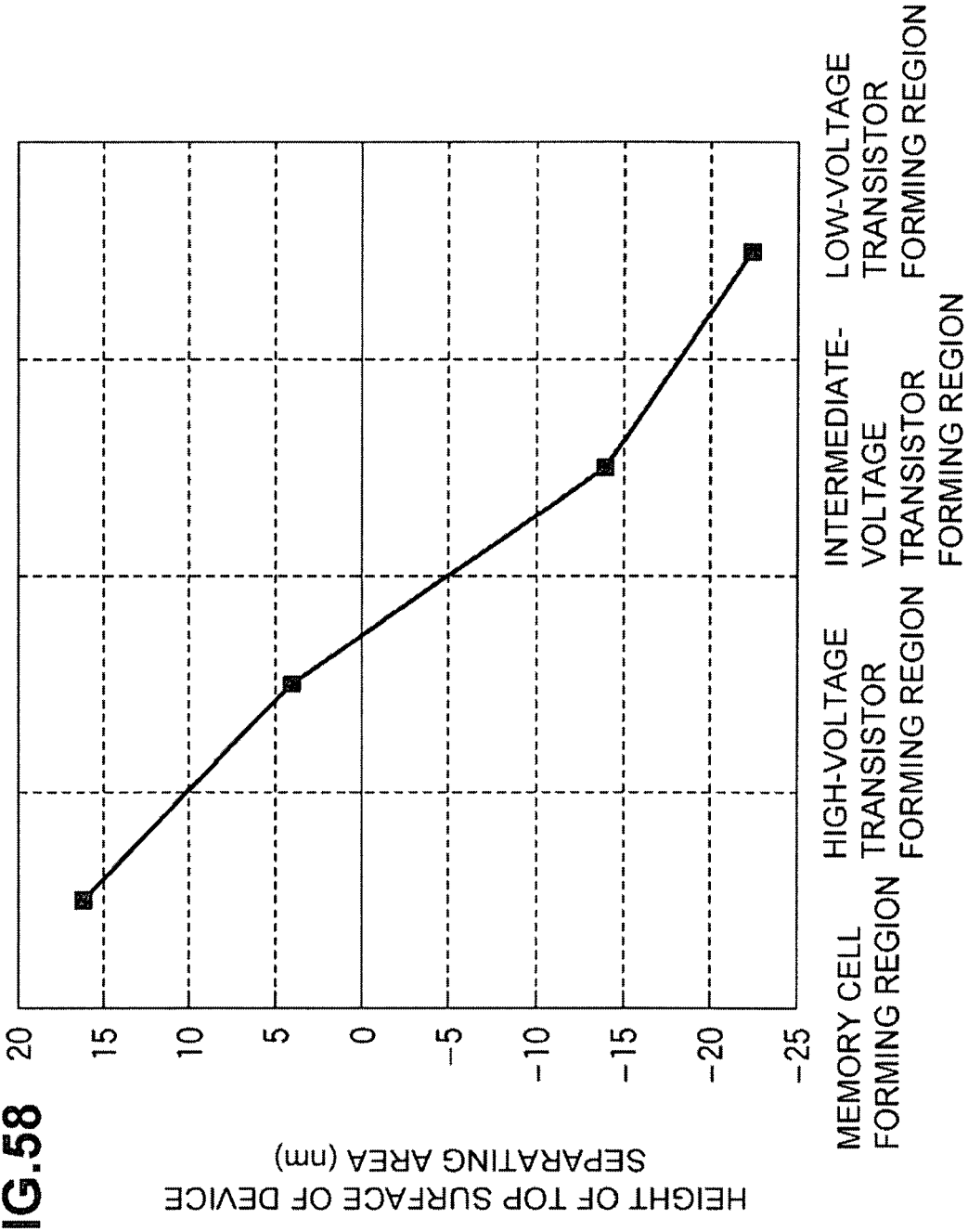

SEMICONDUCTOR DEVICE AND METHOD OF MANUFACTURING THE SAME

BACKGROUND

This technique relates to a semiconductor device and a method of manufacturing the same and, more particularly, to a semiconductor device having a plurality of types of transistors having different thicknesses of a gate insulating film and a method of manufacturing the same.

Recently, a semiconductor device is proposed that a memory cell, a high-voltage transistor, an intermediate-voltage transistor, and a low-voltage transistor are mixedly provided on the same substrate.

In the proposed semiconductor device, the memory cell having a floating gate and a control gate with a stack gate structure is formed within a memory cell forming-region. Within a high-voltage transistor forming-region, the high-voltage transistor with a relatively high thickness of a gate insulating film is formed. Within an intermediate-voltage transistor forming-region, the intermediate-voltage transistor having a gate insulating film with a thickness lower than that of the gate insulating film of the high-voltage transistor is formed. Within a low-voltage transistor forming-region, the low-voltage transistor having a gate insulating film lower than that of the gate insulating film of the intermediate-voltage transistor is formed.

However, in the case of simply forming the memory cell, the high-voltage transistor, the intermediate-voltage transistor, and the low-voltage transistor, the height of a top surface of a device separating area in the high-voltage transistor forming region is lower than the height of a top surface of a device separating area in the memory cell forming region, the height of a top surface of a device separating area in the intermediate-voltage transistor forming region is lower than the height of the top surface of the device separating area in the high-voltage transistor forming region, and the height of a top surface of the device separating area in the low-voltage transistor forming region is lower than the height of the top surface of the device separating area of the intermediate-voltage transistor forming region. Therefore, the height of the top surface of the device separating area in the low-voltage transistor forming region is extremely lower than the height of the top surface of the device area in the low-voltage transistor forming region. When the height of the top surface of the device separating area in the low-voltage transistor forming region is extremely lower than the height of the top surface of the device area in the low-voltage transistor forming region, a low-voltage transistor having a gate electrode with a desired gate length cannot be formed, and a semiconductor device having preferable electrical characteristics cannot be provided.

SUMMARY

According to an aspect of an embodiment, a semiconductor device has a substrate a first insulator formed in a first area of the substrate, and a second insulator formed in the second area of the substrate, a first transistor formed over a first device region surrounded by the first area, the first transistor comprising a first gate insulating film having a first thickness, the first gate insulating film being formed over the first device region, a first gate electrode formed over the first gate insulating film, and first source and drain regions formed in the first device region at both sides of the first gate electrode and a second transistor formed over a second device region surrounded by the second area, the second transistor comprising a second gate insulating film formed over the second device region, a second gate insulating film having a second thickness less than the first thickness of the first gate insulating film, a second gate electrode, the second gate electrode formed over the second gate insulating film, and second source and drain regions formed in the second device region at both sides of the second gate electrode, wherein a first height of a top surface of the first insulator is less than a second height of a top surface of the second insulator.

BRIEF DESCRIPTION OF THE DRAWINGS

FIG. 4 is a graph showing a relationship between the height of a top surface of a device separating area and the heights of top surfaces of active regions in the semiconductor device according to the first embodiment of the present technique;

FIGS. 22A and 22B are cross-sectional views showing the step of manufacturing the semiconductor device according to the first embodiment of the present technique;

FIGS. 23A and 23B are cross-sectional views showing the step of manufacturing the semiconductor device according to the first embodiment of the present technique;

FIGS. 26A and 26B are cross-sectional views showing the step of manufacturing the semiconductor device according to the first embodiment of the present technique;

FIGS. 27A and 27B are cross-sectional views showing the step of manufacturing the semiconductor device according to the first embodiment of the present technique;

FIGS. 29A and 29B are cross-sectional views showing the step of manufacturing the semiconductor device according to the first embodiment of the present technique;

FIGS. 30A and 30B are cross-sectional views showing the step of manufacturing the semiconductor device according to the first embodiment of the present technique;

FIGS. 44A and 44B are cross-sectional views showing the step of manufacturing the semiconductor device according to the second embodiment of the present technique;

FIGS. 49A and 49B are cross-sectional views showing the step of manufacturing the semiconductor device according to the second embodiment of the present technique;

FIGS. 55A and 55B are cross-sectional views showing the step of manufacturing the semiconductor device according to the second embodiment of the present technique;

FIG. 58 is a graph showing the height of a top surface of a device separating area upon forming a memory cell, a high-voltage transistor, an intermediate-voltage transistor, and a low-voltage transistor with a general method.

DESCRIPTION OF THE PREFERRED EMBODIMENTS

Figure 57:
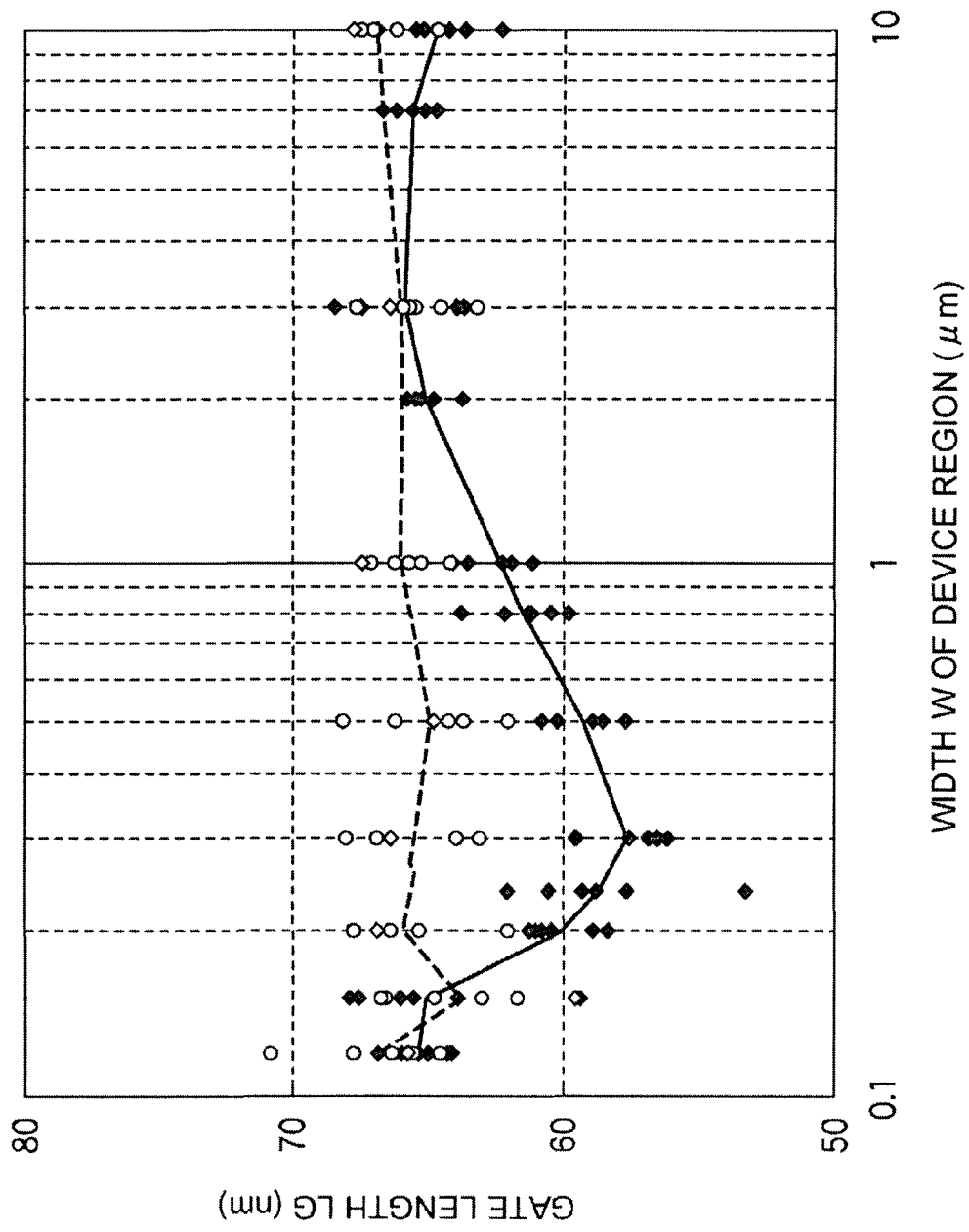
FIG. 57 is a graph showing a measurement result of a gate length of the low-voltage transistor upon forming the low-voltage transistor with a gate length of 65 nm.

FIG. 57 is a graph showing a measurement result of a gate length of a low-voltage transistor upon forming a low-voltage transistor having a gate length of 65 nm. Referring to FIG. 57, the abscissa denotes a width W of an active region, and the ordinate denotes a gate length Lg.

Further, referring to FIG. 57, a plot shown by an O mark denotes a measurement result of the gate length of the low-voltage transistor, when the height of a top surface of a device separating area is equal to the height of a top surface of the active region or when the height of the top surface of the device separating area is slightly higher than the height of the top surface of the active region. A dotted line in FIG. 57 denotes an average of the plots shown by the O mark.

Furthermore, referring to FIG. 57, a plot shown by a ♦ mark denotes a measurement result of the gate length of the low-voltage transistor when the height of the top surface of the device separating area is lower than the height of the top surface of the active region by 10 nm. A solid line in FIG. 57 denotes an average of the plots shown by the ♦ mark.

As will be obvious with reference to FIG. 57, when the height of the top surface of the device separating area is lower than the height of the top surface of the active region by 10 nm, the gate length is reduced by 7 nm as the maximum length.

The gate length is reduced when the height of the top surface of the device separating area is lower than the height of the top surface of the active region because it is considered that a pattern having a photoresist film for patterning the gate electrode is extended in the longitudinal direction and the pattern having the photoresist film becomes thin.

Since the low-voltage transistor has a relatively short gate-length, the change in gate length greatly influences on electrical characteristics of the low-voltage transistor. When the gate length of the low-voltage transistor actually-formed is smaller, by 7 nm, than a gate length of 65 nm as a design value of the low-voltage transistor, it is not possible to obtain the low-voltage transistor having desired electrical characteristics. Therefore, significantly, the change in gate length with respect to the design value is suppressed in the low-voltage transistor.

Incidentally, in a memory cell, a high-voltage transistor, and an intermediate-voltage transistor with a stack gate structure, the gate length is relatively long. Accordingly, even if the gate length changes to some degree, this influences on the electrical characteristics with a relatively low level thereof and there are no problems.

FIG. 58 is a graph showing the height of the top surface of the device separating area upon forming the memory cell, the high-voltage transistor, the intermediate-voltage transistor, and the low-voltage transistor with a general method.

Referring to FIG. 58, upon forming the memory cell, the high-voltage transistor, the intermediate-voltage transistor, and the low-voltage transistor with the general method, the height of the top surface of the device separating area in the high-voltage transistor forming region is lower than the height of the top surface of the device separating area in the memory cell forming region, the height of the top surface of the device separating area in the intermediate-voltage transistor forming region is lower than the height of the top surface of the device separating area in the high-voltage transistor forming region, and the height of the top surface of the device separating area in the low-voltage transistor forming region is lower than the height of the top surface of the device separating area in the intermediate-voltage transistor forming region.

Therefore, the height of the top surface of the device separating area in the low-voltage transistor forming region is extremely lower than the height of the top surface of the active region in the low-voltage transistor forming region. Thus, the pattern of the photoresist film for patterning the gate electrode of the low-voltage transistor is strongly extended in the longitudinal direction and the pattern of the photoresist film for patterning the gate electrode of the low-voltage transistor becomes extremely thin. Accordingly, upon forming the memory cell, the high-voltage transistor, the intermediate-voltage transistor, and the low-voltage transistor with the general method, the low-voltage transistor having the gate electrode with a desired gate length cannot be formed, and the semiconductor device having preferable electrical characteristics cannot be provided.

Upon patterning the gate electrode, in a step of forming the device separating area so as to prevent the height of the top surface of the device separating area in the low-voltage transistor forming region from being extremely low, the height of the top surface of the device separating area can be set to be exceedingly high.

Figure 59A:
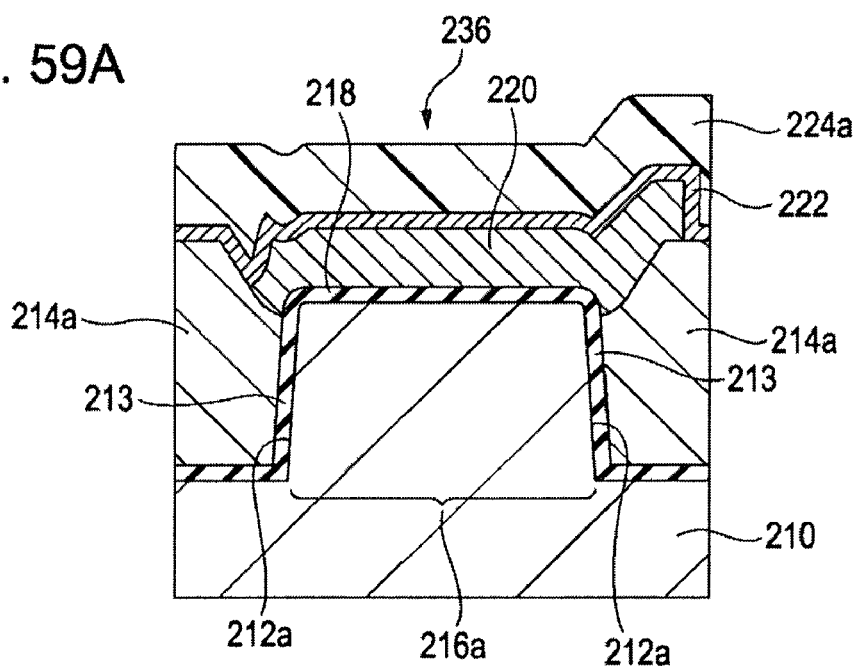
FIGS. 59A to 59C are cross-sectional views showing the case of setting the top surface of the device separating area to be extremely high in a step of forming the device separating area.
Figure 59B:
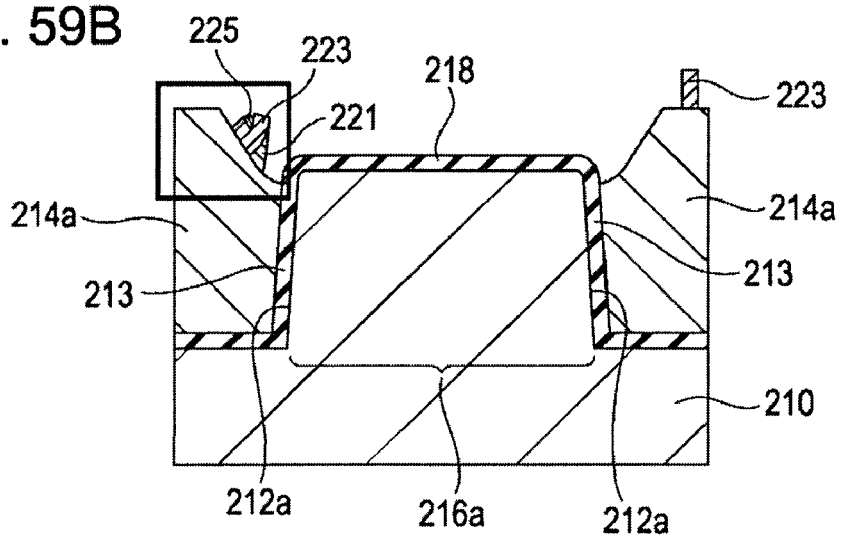
Figure 59C:
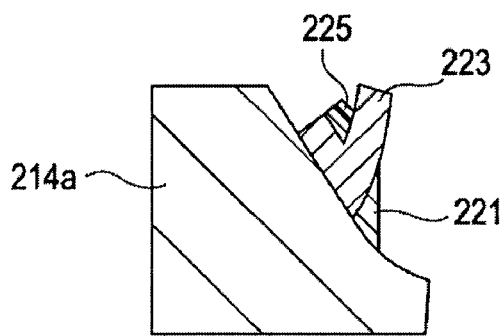

FIGS. 59A to 59C are cross-sectional views showing the case of setting the top surface of the device separating area to be extremely height in the step of forming the device separating area. FIG. 59A is a cross-sectional view showing a region for forming a floating gate 220 and a control gate 224a of the memory cell forming region, and FIG. 59B is a cross-sectional view showing a region for removing the floating gate 220 and the control gate 224a from the memory cell forming region by etching. FIG. 59C is a cross-sectional view showing an enlarged portion surrounded by a thick line in FIG. 59B.

Referring to FIG. 59A, a semiconductor substrate 210 in the memory cell forming region has a trench 212a for forming a device separating area 214a. The bottom surface and the side wall of the trench 212a include a silicon oxidation film 213. The trench 212a to which the silicon oxidation film 213 is formed has the device separating area 214a. The device separating area 214a determines an active region 216a. The height of the top surface of the device separating area 214a is set to be extremely higher than the height of the top surface of the active region 216a. On the active region 216a, a floating gate 220 containing amorphous silicon is formed via a tunnel insulating film 218. On the floating gate 220, a control gate 224a containing polysilicon is formed via an ONO film 222. As mentioned above, a memory cell 236 with a stack gate structure having the floating gate 220 and the control gate 224a is formed to the memory cell forming region.

However, when the height of the top surface of the device separating area 214a is set to be extremely high upon forming the device separating area 214a, a steep inclination is caused on the side of the active region 216a of the device separating area 214a. In this case, when causing a positional deviation in the patterning, in the region for removing the floating gate 220, there is a danger that residue 221 of amorphous silicon can remain below residue 223 containing an ONO film (refer to FIGS. 59B and 59C). Further, there is a danger that residue 225 containing polysilicon can remain above the residue of the ONO film 222. When causing the residue 221 or 225 containing amorphous silicon or polysilicon under or above the residue 223 containing the ONO film 222, the memory cells 236 adjacent to each other are short-circuited, or charges of the floating gate 220 are leaked, and normal operation is not performed. Consequently, in the step of forming the device separating area, it is not preferable to set the height of the top surface of the device separating area in advance to be extremely high.

Hereinbelow, a description will be given of a semiconductor device and a method of manufacturing the semiconductor device according to the first embodiment of the present technique with reference to FIGS. 1A to 31B.

Figure 1A:
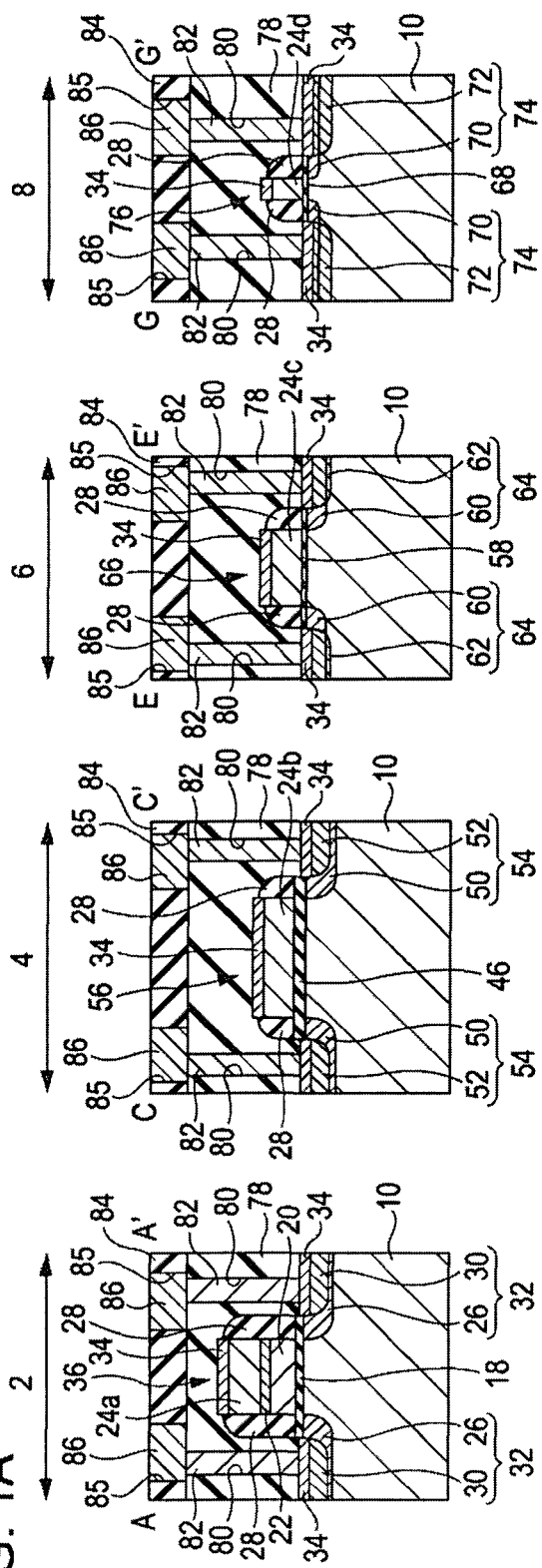
FIGS. 1A and 1B are cross-sectional views showing a semiconductor device according to the first embodiment of the present technique.
Figure 1B:
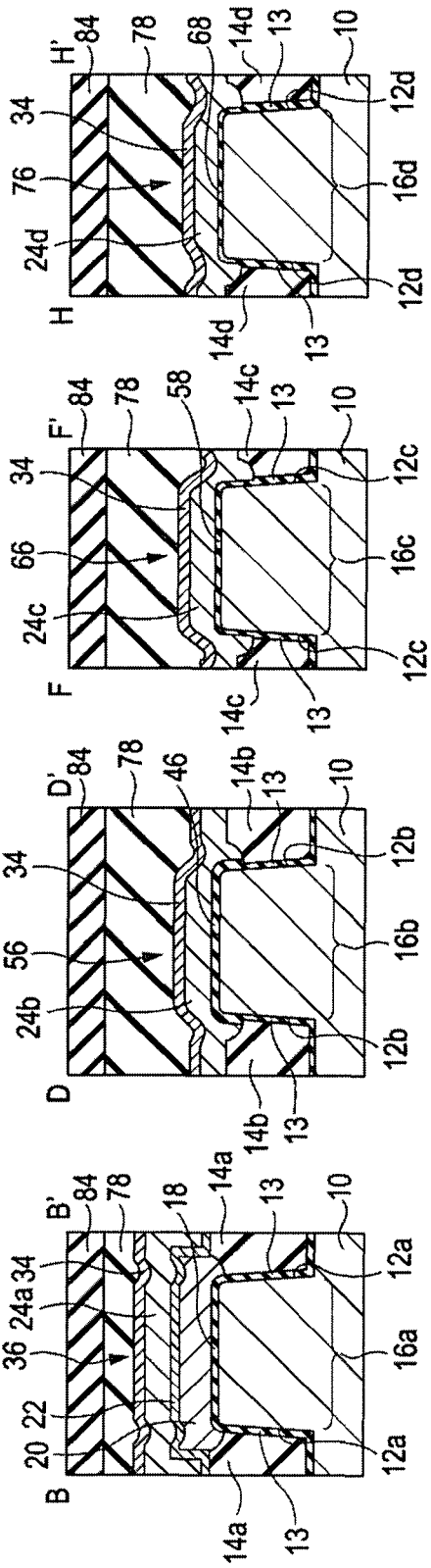
Figure 2:
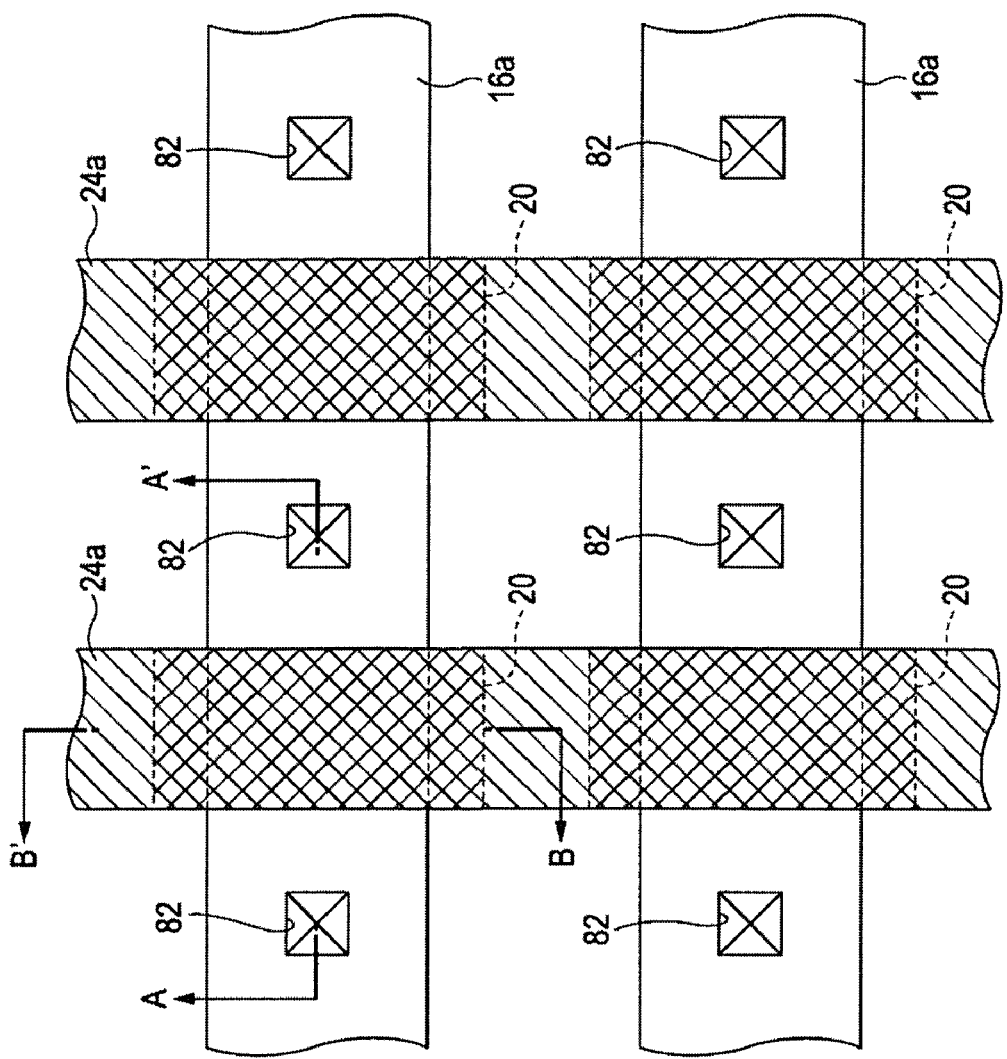
FIG. 2 is a plan view showing a memory cell in the semiconductor device according to the first embodiment of the present technique.
Figure 3A:
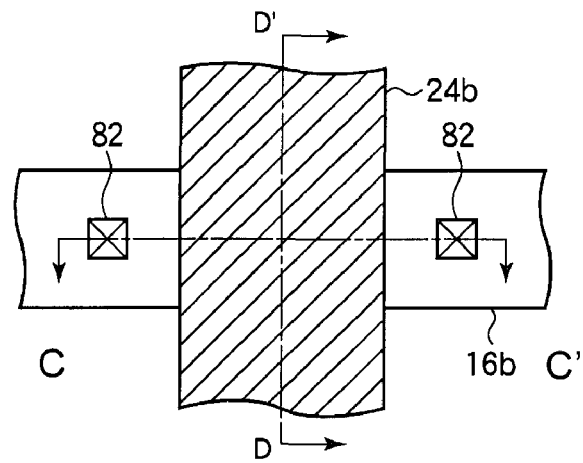
FIGS. 3A to 3C are plan views showing a high-voltage transistor, an intermediate-voltage transistor, and a low-voltage transistor in the semiconductor device according to the first embodiment of the present technique.
Figure 3B:
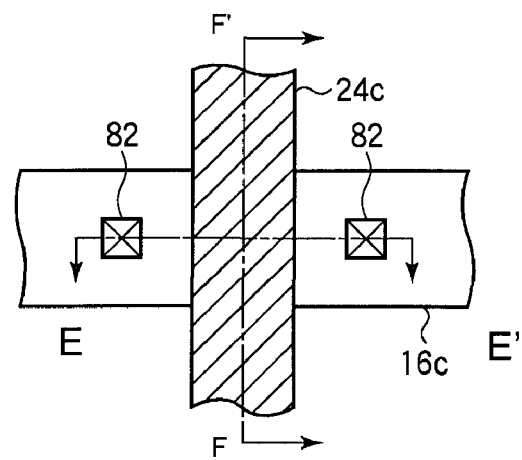
Figure 3C:
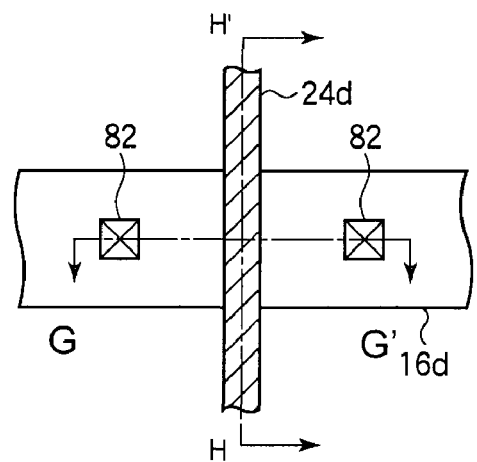
Figure 5A:
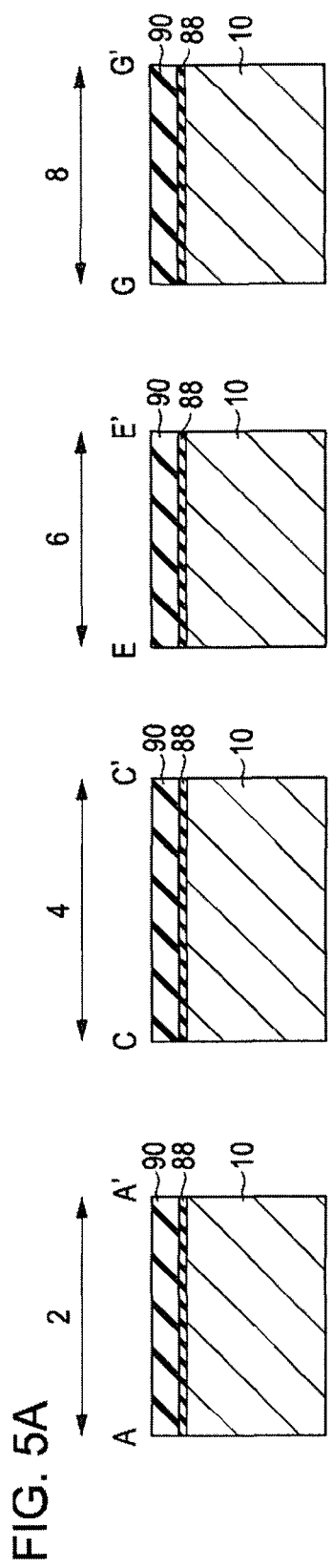
FIGS. 5A and 5B are cross-sectional views showing a step of manufacturing the semiconductor device according to the first embodiment of the present technique.
Figure 5B:
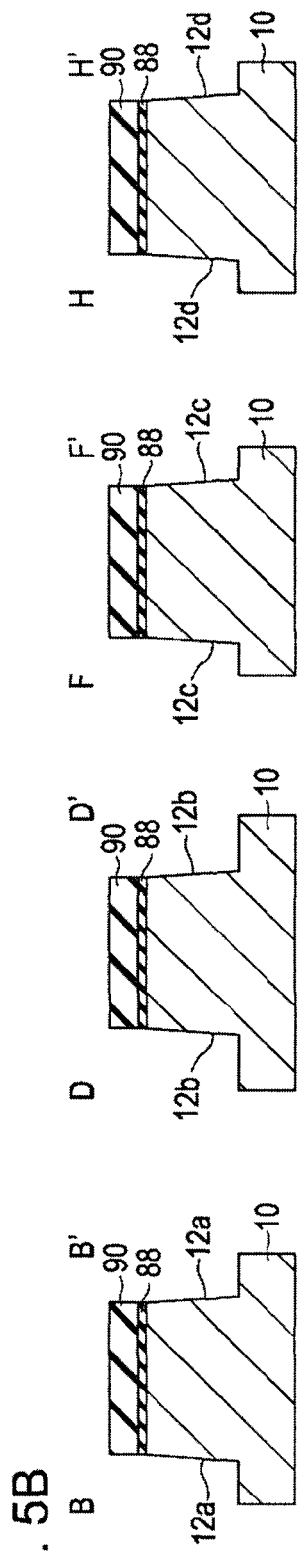

First, a description will be given of a semiconductor device and a method of manufacturing the semiconductor device according to the first embodiment of the present technique with reference to FIGS. 1A to 4. FIGS. 1A and 1B are cross-sectional views showing the semiconductor device according to the first embodiment. FIG. 2 is a plan view showing a memory cell of the semiconductor device according to the first embodiment. FIGS. 3A to 3C are plan views showing a high-voltage transistor, an intermediate-voltage transistor, and a low-voltage transistor in the semiconductor device according to the first embodiment. FIG. 3A shows the high-voltage transistor, FIG. 3B shows the intermediate-voltage transistor, and FIG. 3C shows the low-voltage transistor. FIG. 4 is a graph showing a relationship between the height of a top surface of a device separating area and the height of top surfaces of active regions.

The semiconductor device according to the first embodiment includes: a memory cell forming region 2 having a flash memory cell; a high-voltage transistor forming region 4 having a high-voltage transistor; an intermediate-voltage transistor forming region 6 having an intermediate-voltage transistor having a withstand voltage higher than of the high-voltage transistor; and a low-voltage transistor forming region 8 having a low-voltage transistor having a withstand voltage lower than that of the intermediate-voltage transistor.

On the semiconductor substrate 10 in the memory cell forming region 2, a trench 12a for forming a device separating area 14a is formed. On the side wall and the bottom surface of the trench 12a, a silicon oxidation film 13 is formed. In the trench 12a to which the silicon oxidation film 13 is formed, the device separating area 14a for determining an active region 16a is embedded. The device separating area 14a is formed with a Shallow Trench Isolation (STI) method. The cross section of the memory cell forming region 2 shown in FIG. 1A corresponds to a cross section of an A-A' line in FIG. 2, the cross section of the memory cell forming region 2 shown in FIG. 1B corresponds to a cross section of a B-B' line in FIG. 2.

On the active region 16a in the memory cell forming region 2, a tunnel insulating film (gate insulating film) 18 containing a silicon oxidation film is formed. A floating gate 20 is formed on the tunnel insulating film 18.

On the floating gate 20, a laminated film 22 containing a silicon nitride film is formed. Specifically, on the floating gate 20, the laminated film 22 is formed with a first silicon-oxidation film, a silicon nitride film formed on the first silicon-oxidation film, and a second silicon-oxidation film formed on the silicon nitride film. The above-mentioned laminated film 22 with the silicon oxidation film, silicon nitride film, and silicon oxidation film is also referred to as an ONO film.

On the floating gate 20, a control gate 24a is formed via the ONO film 22.

Within the active region 16a on both sides of the floating gate 20 and the control gate 24a, extension areas 26 and pocket areas (not shown) are formed.

On the side walls of the floating gate 20 and the control gate 24a, side-wall insulating films 28 are formed.

Within the active region 16a on both sides of the floating gate 20 and the control gate 24a to which the side-wall insulating film 28s are formed, high-concentration impurity areas 30 are formed. Source and drain diffusion layer 32 includes the extension area 26, the high-concentration impurity area 30, and the like.

On the control gate 24 and the source and the drain region 32, silicide films 34 are formed. The silicide film 34 on the source and the drain region 32 functions as a source and drain electrode.

As mentioned above, a memory cell 36 is formed with a stack gate structure having the floating gate 20, the control gate 24, and the source and the drain region 32.

To the high-voltage transistor forming region 4, a trench 12b for forming a device separating area 14b is formed. On the side wall and the bottom surface of the trench 12b, the silicon oxidation film 13 is formed. Within the trench 12b to which the silicon oxidation film 13 is formed, the device separating area 14b for forming an active region 16b is embedded. The cross section of the high-voltage transistor forming region 4 shown in FIG. 1A corresponds to a C-C' cross-section in FIG. 3A, and the cross section of the high-voltage transistor forming region 4 shown in FIG. 1B corresponds to a D-D' cross-section shown in FIG. 3A.

On the active region 16b in the high-voltage transistor forming region 4, a gate insulating film 46 with a relatively-high thickness is formed. The thickness of the gate insulating film 46 is, e.g., 15 nm.

A gate electrode 24b having a relatively-long gate length is formed on the gate insulating film 46. The gate length of the gate electrode 24b is, e.g., 700 nm.

Within the active region 16b on both sides of the gate electrode 24b, extension areas 50 and pocket areas (not shown) are formed.

On the side walls of the gate electrode 24b, the side-wall insulating films 28 are formed.

Within the active region 16b on both sides of the gate electrode 24b to which the side-wall insulating films 28 are formed, high-concentration impurity areas 52 are formed. A source and drain region 54 includes the extension area 50, the high-concentration impurity area 52, and the like.

On the gate electrode 24b and the source and the drain region 54, the silicide films 34 are formed. The silicide film 34 on the source and the drain region 54 functions as a source and drain electrode.

As mentioned above, a high-voltage transistor 56 having the gate electrode 24b and the source and the drain region 54 is formed.

To the intermediate-voltage transistor forming region 6, a trench 12c for forming a device separating area 14c is formed. On the side wall and the bottom surface of the trench 12c, the silicon oxidation films 13 are formed. Within the trench 12c to which the silicon oxidation film 13 is formed, the device separating area 14c for determining a active region 16c is embedded. A cross section of the intermediate-voltage transistor forming region 6 shown in FIG. 1A corresponds to an E-E' cross-section shown in FIG. 3B, and a cross section of the intermediate-voltage transistor forming region 6 shown in FIG. 1B corresponds to an F-F' cross-section shown in FIG. 3B.

On the active region 16c in the intermediate-voltage transistor forming region 6, a gate insulating film 58 is formed with a thickness smaller than that of the gate insulating film 46 of the high-voltage transistor 56. The thickness of the gate insulating film 58 is, e.g., 7 nm.

On the gate insulating film 58, a gate electrode 24c is formed with a gate length shorter than that of the gate electrode 24b of the high-voltage transistor 56. The gate length of the gate electrode 24c is 350 nm.

Within the active region 16c on both sides of the gate electrode 24c, extension areas 60 and pocket areas (not shown) are formed.

On the side wall of the gate electrode 24c, the side-wall insulating film 28 is formed.

Within the active region 16c on both sides of the gate electrode 24c to which the side-wall insulating film 28 is formed, a high-concentration impurity area 62 is formed. A source and drain region 64 includes the extension area 60, the high-concentration impurity area 62, and the like.

On the gate electrode 24c and the source and the drain region 64, the silicide films 34 are individually formed. The silicide film 34 on the source and the drain region 64 functions as a source and drain electrode.

As mentioned above, an intermediate-voltage transistor 66 is structured with the gate electrode 24c and the source and the drain region 64.

To the low-voltage transistor forming region 8, a trench 12d for forming a device separating area 14d is formed. On the side wall and the bottom surface of the trench 12d, the silicon oxidation film 13 is formed. Within the trench 12d to which the silicon oxidation film 13 is formed, the device separating area 14d for determining a active region 16d is embedded. A cross section of the low-voltage transistor forming region 8 shown in FIG. 1A corresponds to a G-G' cross-section shown in FIG. 3C, and a cross section of the low-voltage transistor forming region 8 shown in FIG. 1B corresponds to an H-H' cross-section shown in FIG. 3C.

On the active region 16d in the low-voltage transistor forming region 8, a gate insulating film 68 is formed with a thickness smaller than that of the gate insulating film 58 of the intermediate-voltage transistor 66. The thickness of the gate insulating film 68 is, e.g., 1.5 nm.

On the gate insulating film 68, a gate electrode 24d is formed with a gate length shorter than that of the gate electrode 24c of the intermediate-voltage transistor 66. The gate length of the gate electrode 24d is 60 nm.

Within the active region 16d on both sides of the gate electrode 24d, extension areas 70 and pocket areas (not shown) are formed.

On the side wall of the gate electrode 24d, the side-wall insulating film 28 is formed.

Within the active region 16d on both sides of the gate electrode 24d to which the side-wall insulating film 28 is formed, a high-concentration impurity area 72 is formed. A source and drain region 74 includes the extension area 70, the high-concentration impurity area 72, and the like.

On the gate electrode 24d and the source and the drain region 74, the silicide films 34 are individually formed. The silicide film 34 on the source and the drain region 74 functions as a source and drain electrode.

As mentioned above, a low-voltage transistor 76 includes the gate electrode 24d and the source and the drain region 74.

FIG. 4 is a graph showing the height of the top surface of the device separating area with respect to the top surface of the active region.

Plots shown by ● marks show a case of the semiconductor device according to the first embodiment. Plots shown by ■ marks show a comparison, i.e., a case of forming the memory cell, the high-voltage transistor, the intermediate-voltage transistor, and the low-voltage transistor with a general method.

Referring to FIG. 4, according to the first embodiment, the height of the top surface of the device separating area 14a in the memory cell forming region 2 is higher, by 8 nm, than the height of the top surface of the active region 16a in the memory cell forming region 2.

Further, according to the first embodiment, the height of the top surface of the device separating area 14b in the high-voltage transistor forming region 4 is lower, by 3 nm, than the height of the top surface of the active region 16b in the high-voltage transistor forming region 4.

Furthermore, according to the first embodiment, the height of the top surface of the device separating area 14c in the intermediate-voltage transistor forming region 6 is lower than, by 21 nm, than the height of the top surface of the active region 16c in the intermediate-voltage transistor forming region 6.

In addition, according to the first embodiment, the height of the top surface of the device separating area 14d in the low-voltage transistor forming region 8 is approximately equal to the height of the top surface of the active region 16d in the low-voltage transistor forming region 8. That is, according to the first embodiment, the height of the top surface of the device separating area 14d in the low-voltage transistor forming region 8 is higher than the height of the top surface of the device separating area 14c in the intermediate-voltage transistor forming region 6.

Upon forming, with the general method, the memory cell, the high-voltage transistor, the intermediate-voltage transistor, and the low-voltage transistor, as shown in the comparison in FIG. 4, the height of the top surface of the device separating area in the high-voltage transistor forming region is lower than the height of the top surface of the device separating area in the memory cell forming region, the height of the top surface of the device separating area in the intermediate-voltage transistor forming region is lower than the height of the top surface of the device separating area in the high-voltage transistor forming region, and the height of the top surface of the device separating area in the low-voltage transistor forming region is lower than the height of the top surface of the device separating area in the intermediate-voltage transistor forming region. Therefore, the height of the top surface of the device separating area in the low-voltage transistor forming region is extremely lower than the height of the top surface of the active region. Hence, upon forming, with the general method, the memory cell, the high-voltage transistor, the intermediate-voltage transistor, and the low-voltage transistor, the pattern of the photoresist film for patterning the gate electrode of the low-voltage transistor is strongly pulled in the longitudinal direction and the pattern of the photoresist film for patterning the gate electrode of the low-voltage transistor is extremely thin. Accordingly, upon forming, with the general method, the memory cell, the high-voltage transistor, the intermediate-voltage transistor, and the low-voltage transistor, a low-voltage transistor having a gate electrode with a desired gate length cannot be formed and the semiconductor device having preferable electrical characteristics cannot be also provided.

On the other hand, according to the first embodiment, the height of the top surface of the device separating area 14d in the low-voltage transistor forming region 8 is not extremely lower than the height of the top surface of the active region 16d in the low-voltage transistor forming region 8. Thus, a pattern 102c (refer to FIGS. 26A and 26B) of a photoresist film for patterning the gate electrode 24d of the low-voltage transistor 76 is not strongly pulled in the longitudinal direction, and it is possible to prevent, from being extremely thin, the pattern 102c of the photoresist film for patterning the gate electrode 24d of the low-voltage transistor 76. Therefore, according to the first embodiment, the low-voltage transistor 76 having the gate electrode 24d with a desired gate length can be formed and the semiconductor device having preferable electrical characteristics can be also provided.

On the semiconductor substrate 10 having the memory cell 36, the high-voltage transistor 56, the intermediate-voltage transistor 66, and the low-voltage transistor 76, an inter-layer insulating film 78 is formed.

A contact hole 80 that reaches the silicide film 34 is formed to the inter-layer insulating film 78. In the contact hole 80, a contact plug 82 is embedded.

On the inter-layer insulating film 78 in which the contact plug 82 is embedded, an inter-layer insulating film 84 is formed.

A trench 85 for embedding a wiring 86 is formed to the inter-layer insulating film 84.

In the trench 85 that is formed to the inter-layer insulating film 84, the wiring 86 is embedded. The wirings 86 are electrically connected to the source and the drain electrode 34 via the contact plug 82.

As mentioned above, according to the first embodiment, the height of the top surface of the device separating area 14d in the low-voltage transistor forming region 8 is substantially equal to the height of the top surface of the active region 16d in the low-voltage transistor forming region 8. That is, according to the first embodiment, since the height of the top surface of the device separating area 14d in the low-voltage transistor forming region 8 is not extremely lower than the height of the top surface of the active region 16d in the low-voltage transistor forming region 8, it is possible to prevent, from being strongly pulled in the longitudinal direction, the pattern 102c (refer to FIGS. 26A and 26B) of the photoresist film for patterning the gate electrode 24d of the low-voltage transistor 76. Further, it is possible to prevent, from being excessively thin, a photoresist film for patterning the gate electrode 24d of the low-voltage transistor 76. Therefore, according to the first embodiment, the low-voltage transistor 76 having the gate electrode 24d with a desired gate length can be formed and the semiconductor device having preferable electrical characteristics can be also provided.

As mentioned above, the semiconductor device according to the first embodiment can be structured.

Next, a description will be given of a method of manufacturing the semiconductor device according to the first embodiment with reference to FIGS. 5A to 31B. FIGS. 5A to 31B are cross-sectional views of steps of manufacturing the semiconductor device according to the first embodiment.

First, with a thermal oxidation method, a silicon oxidation film 88 with a thickness of 10 nm is formed on the semiconductor substrate 10. As the semiconductor substrate 10, e.g., a silicon substrate is used.

Subsequently, with a CVD method to the whole substrate, a silicon nitride film 90 with a thickness of 80 nm is formed.

Subsequently, with a spin coat method to the whole substrate, a photoresist film (not shown) is coated. When the minimal width of the active regions 16a to 16d is 100 nm, the thickness of photoresist film is 200 nm.

Subsequently, with a photolithography technology, the photoresist film is patterned.

Subsequently, by using the photoresist film as a mask, the silicon nitride film 90 is subjected to anisotropic etching. In this case, the photoresist film on the silicon nitride film 90 is also almost removed with etching. Thereafter, the photoresist film remaining on the silicon nitride film 90 is removed.

Subsequently, by using the silicon nitride film 90 as the mask, the semiconductor substrate 10 is etched. Thus, the trenches 12a to 12d with a depth of 300 nm are individually formed in the memory cell forming region 2, the high-voltage transistor forming region 4, the intermediate-voltage transistor forming region 6, and the low-voltage transistor forming region 8 (refer to FIGS. 5A and 5B). Upon etching the semiconductor substrate 10 by using the silicon nitride film 90 as the mask, the top of the silicon nitride film 90 is slightly etched and the thickness of the silicon nitride film 90 is 60 nm.

Subsequently, with a thermal oxidation method, side walls and side surfaces of the trenches 12a to 12d are oxidized. Accordingly, the silicon oxidation film 13 with a thickness of 5 nm is formed to bottom surfaces and side walls of the trenches 12a to 12d.

Figure 6A:
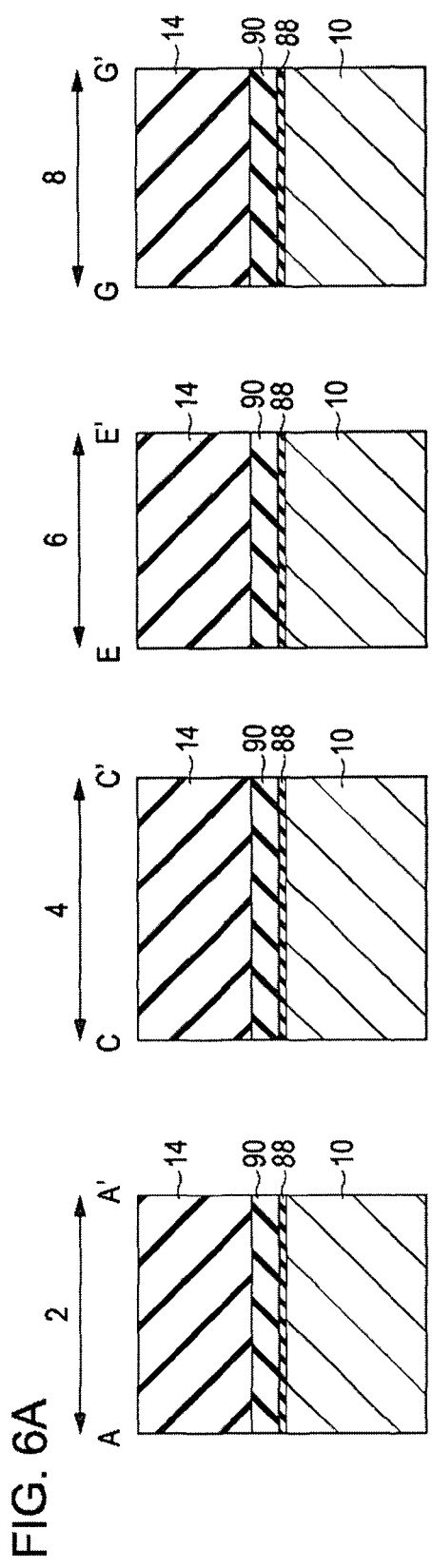
FIGS. 6A and 6B are cross-sectional views showing the step of manufacturing the semiconductor device according to the first embodiment of the present technique.
Figure 6B:
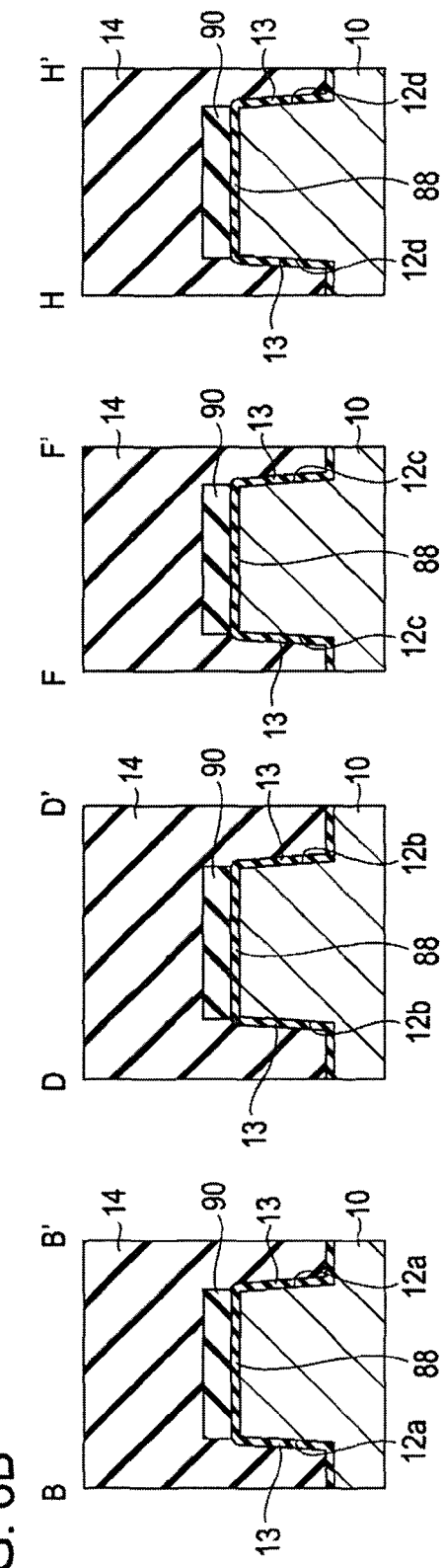

Subsequently, with a dense-plasma CVD method to the whole substrate, a silicon oxidation film 14 with a thickness of 400 nm is formed (refer to FIGS. 6A and 6B).

Figure 7A:
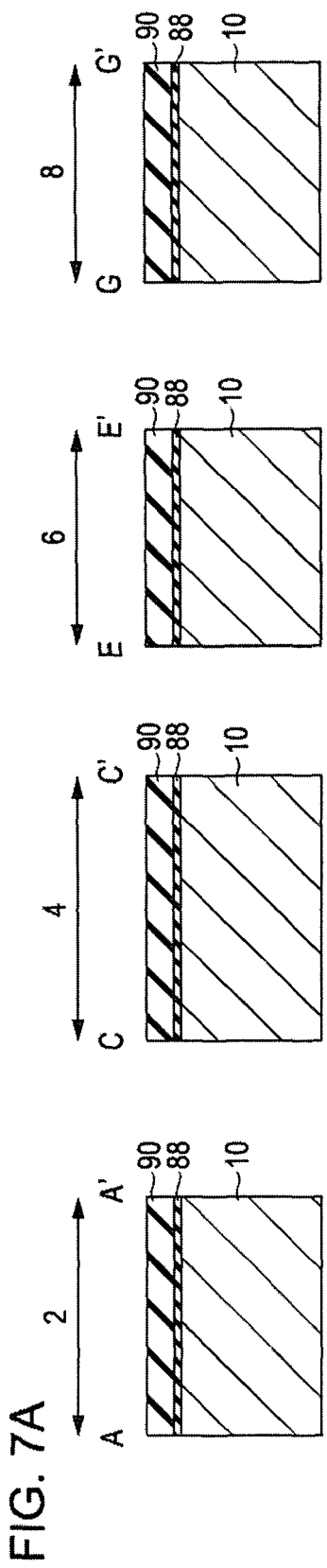
FIGS. 7A and 7B are cross-sectional views showing the step of manufacturing the semiconductor device according to the first embodiment of the present technique.
Figure 7B:
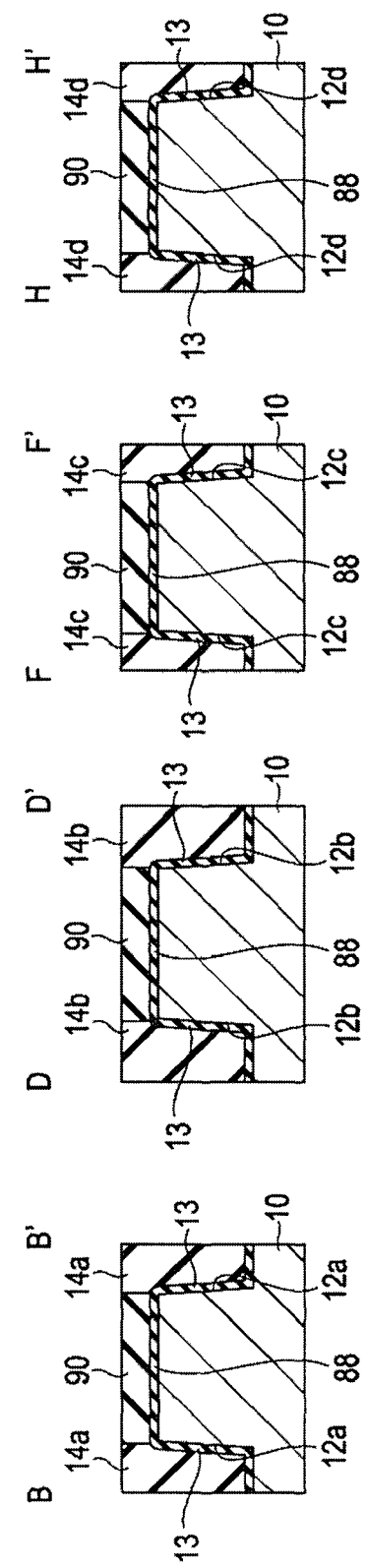

Subsequently, referring to FIGS. 7A and 7B, with a Chemical Mechanical Polishing (CMP) method, the silicon oxidation film 14 is polished until exposing the surface of the silicon nitride film 90. In this case, even the surface of the silicon nitride film 90 is slightly polished, and the thickness of the silicon nitride film 90 is therefore 30 nm. Since the silicon nitride film 90 is formed on the silicon oxidation film 88 with a thickness of 10 nm, formed on the semiconductor substrate 10, the height of the top surface of the silicon nitride film 90 is 40 nm from the surface of the semiconductor substrate 10. The height of the top surface of the device separating areas 14a to 14d having the silicon oxidation film embedded to trenches 14a to 14d is equal to the height of the top surface of the silicon nitride film 90. Top surfaces of the device separating areas 14a to 14d are higher, by 40 nm, than the surface of the semiconductor substrate 10.

Subsequently, with hydrofluoric acid, the device separating areas 14a to 14d are etched with a thickness of 7 nm. After etching the thickness of 7 nm of the device separating areas 14a to 14d, the top surfaces of the device separating areas 14a to 14d are higher, by 33 nm, than the surface of the semiconductor substrate 10. Incidentally, the thickness of 7 nm of the device separating areas 14a to 14d is etched from the device separating areas 14a to 14d so as to finally set the height of the top surface of the device separating area 14d in the low-voltage transistor forming region 8 to be substantially equal to the height of the top surface of the active region 16d.

Figure 8A:
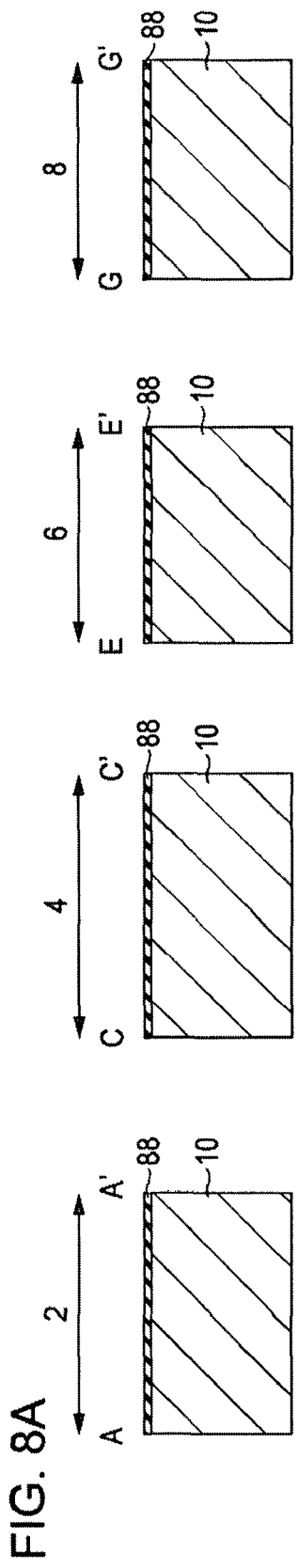
FIGS. 8A and 8B are cross-sectional views showing the step of manufacturing the semiconductor device according to the first embodiment of the present technique.
Figure 8B:
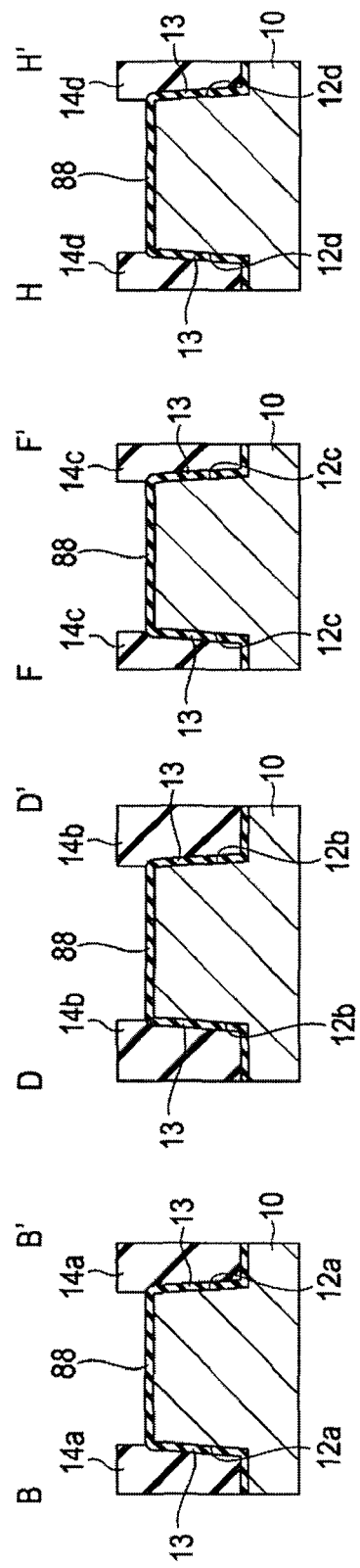

Subsequently, with heated phosphoric acid, the silicon nitride film 90 is removed by etching (refer to FIGS. 8A and 8B). If etching the silicon nitride film 90 with the phosphoric acid, an etching selecting ratio of the silicon nitride film 90 with respect to the silicon oxidation film 88 can be sufficiently ensured. Thus, the silicon oxidation film 88 on the active regions 16a to 16d remains without etching. Therefore, the silicon oxidation film 88 with a thickness of 10 nm remains on the active regions 16a to 16d.

Figure 9A:
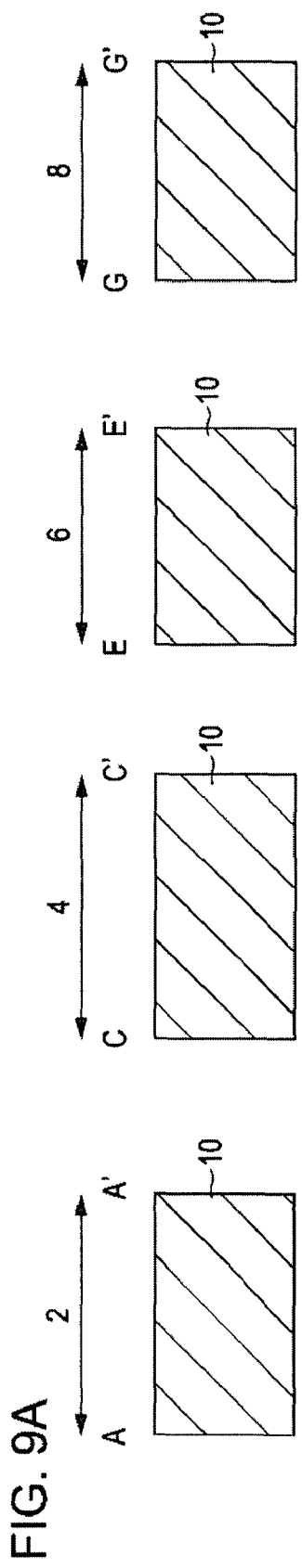
FIGS. 9A and 9B are cross-sectional views showing the step of manufacturing the semiconductor device according to the first embodiment of the present technique.
Figure 9B:
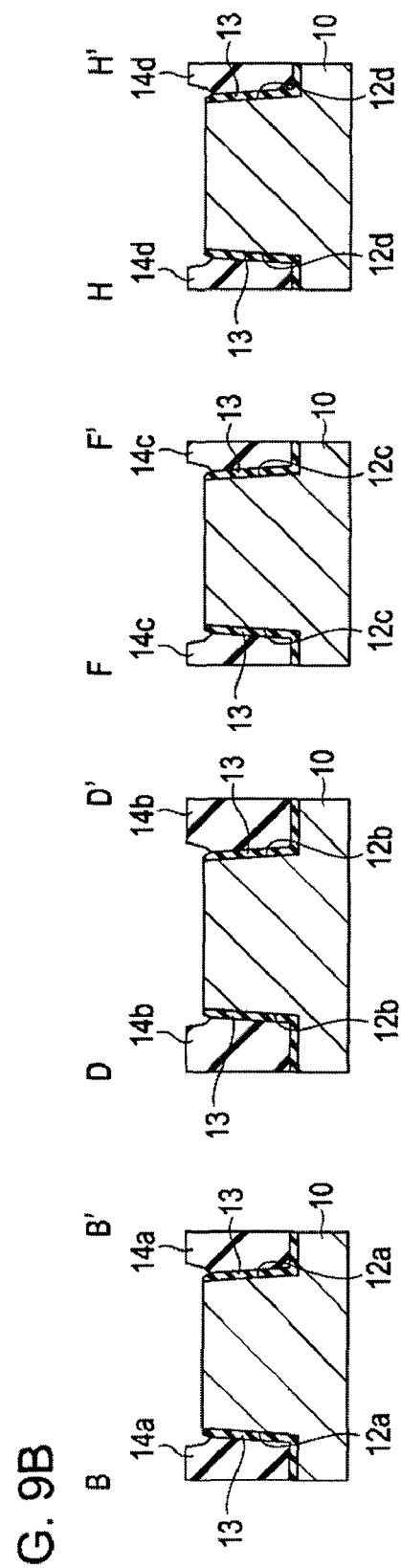

Subsequently, referring to FIGS. 9A and 9B, with hydrofluoric acid, the silicon oxidation film 88 on the active regions 16a to 16d is removed by etching. Upon etching the silicon oxidation film 88 with a thickness of 10 nm, the etching is performed for a time period corresponding to the etching of a silicon oxidation film with a thickness of 12 nm, as that of 1.2 multiples of the silicon oxidation film 88. Therefore, a silicon oxidation film forming the device separating areas 14a to 14d is etched by 12 nm. Therefore, after etching the silicon oxidation film 88, top surfaces of the device separating areas 14a to 14d are higher, by 21 nm, than the top surfaces of the active regions 16a to 16d.

Accordingly, with the STI method, the device separating areas 14a to 14d are formed.

Figure 10A:
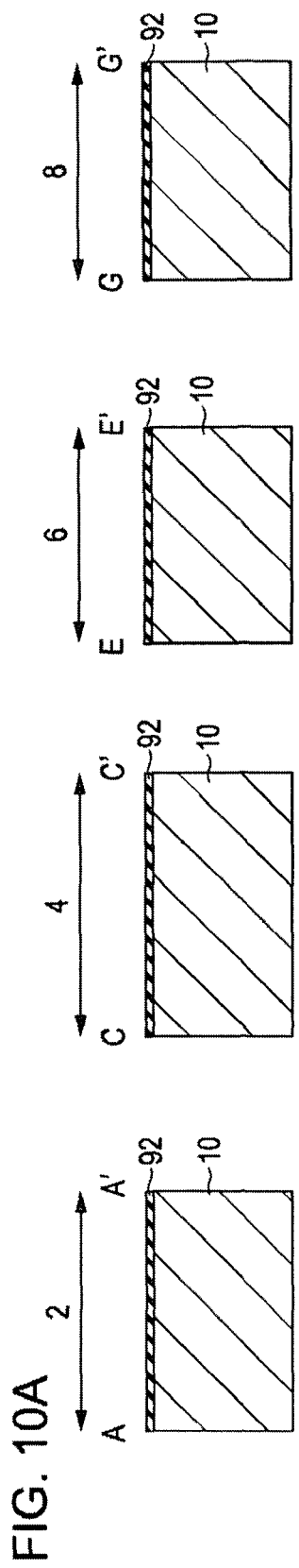
FIGS. 10A and 10B are cross-sectional views showing the step of manufacturing the semiconductor device according to the first embodiment of the present technique.
Figure 10B:
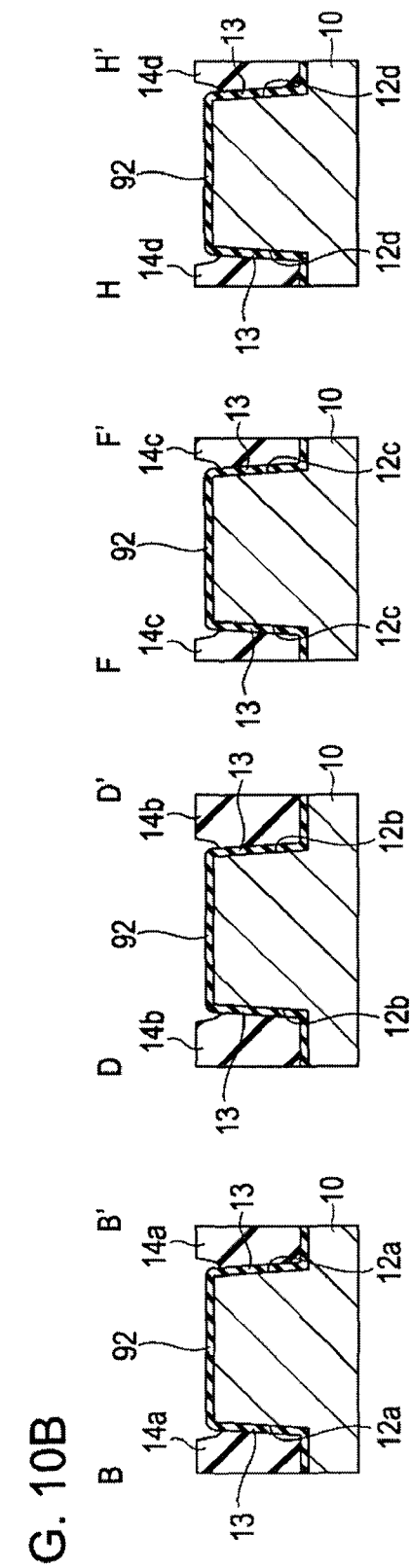

Subsequently, referring to FIGS. 10A and 10B, with a thermal oxidation method to the whole substrate, a sacrificial oxidation film 92 having a silicon oxidation film with a thickness of 8 to 12 nm is formed. Herein, the thickness of the sacrificial oxidation film 92 is, e.g., 10 nm.

Dopant impurities are implanted to the memory cell forming region 2 and the high-voltage transistor forming region 4, thereby properly forming a predetermined conductive well (not shown).

Further, with the ion-implantation method, dopant impurities are implanted to the memory cell forming region 2 and the high-voltage transistor forming region 4, thereby properly forming a threshold-voltage control layer (not shown).

Subsequently, with the spin coat method to the whole substrate, a photoresist film 94 is formed.

Subsequently, with the photolithography technology, the photoresist film 94 is patterned. Thus, the photoresist film 94 covering the low-voltage transistor forming region 8 is formed.

Figure 11A:
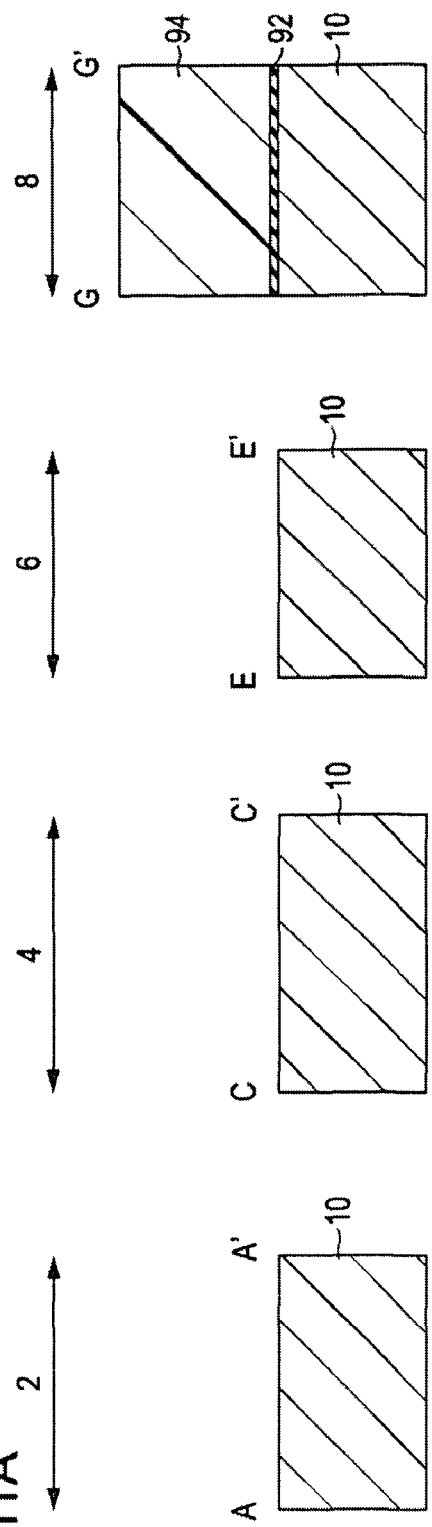
FIGS. 11A and 11B are cross-sectional views showing the step of manufacturing the semiconductor device according to the first embodiment of the present technique.
Figure 11B:
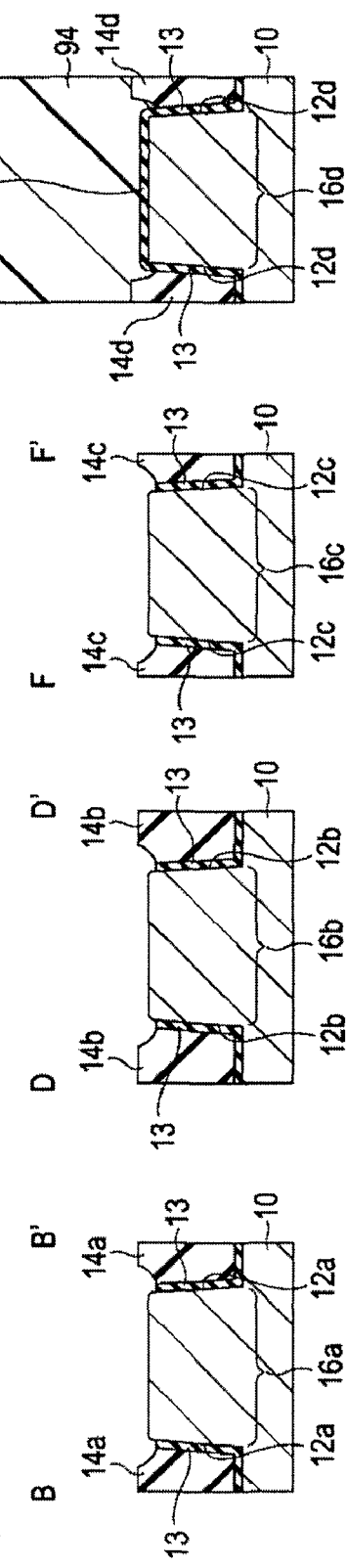

Subsequently, by using the photoresist film 94 as the mask, the sacrificial oxidation films 92 in the memory cell forming region 2, the high-voltage transistor forming region 4, and the intermediate-voltage transistor forming region 6 is removed with etching (refer to FIGS. 11A and 11B). As etching solution, e.g., hydrofluoric acid is used. The sacrificial oxidation film 92 with a thickness of 10 nm is etched for a time period necessary for etching the silicon oxidation film with a thickness of 12 nm as that of 1.2 multiples of the sacrificial oxidation film 92. Therefore, after etching the sacrificial oxidation film 92, the top surface of the device separating area 14a in the memory cell forming region 2, the top surface of the device separating area 14b in the high-voltage transistor forming region 4, the top surface of the device separating area 14c in the intermediate-voltage transistor forming region 6 are higher, by 9 nm, than the top surface of the active regions 16a to 16c. Since the device separating area 16d in the low-voltage transistor forming region 8 is covered with the photoresist film 94, the etching is not performed. The top surface of the device separating area 14d in the low-voltage transistor forming region 8 maintains to be higher, by 21 nm, than the top surface of the active region 16d. Thereafter, the photoresist film 94 is peeled.

Herein, the description is given of the example of removing by etching the sacrificial oxidation film 92 in the intermediate-voltage transistor forming region 6. However, the sacrificial oxidation film 92 in the intermediate-voltage transistor forming region 6 may not be removed by etching. By etching with the photoresist film that covers the intermediate-voltage transistor forming region 6 and the low-voltage transistor forming region 8, the sacrificial oxidation film 92 in the intermediate-voltage transistor forming region 6 can not be etched.

Figure 12A:
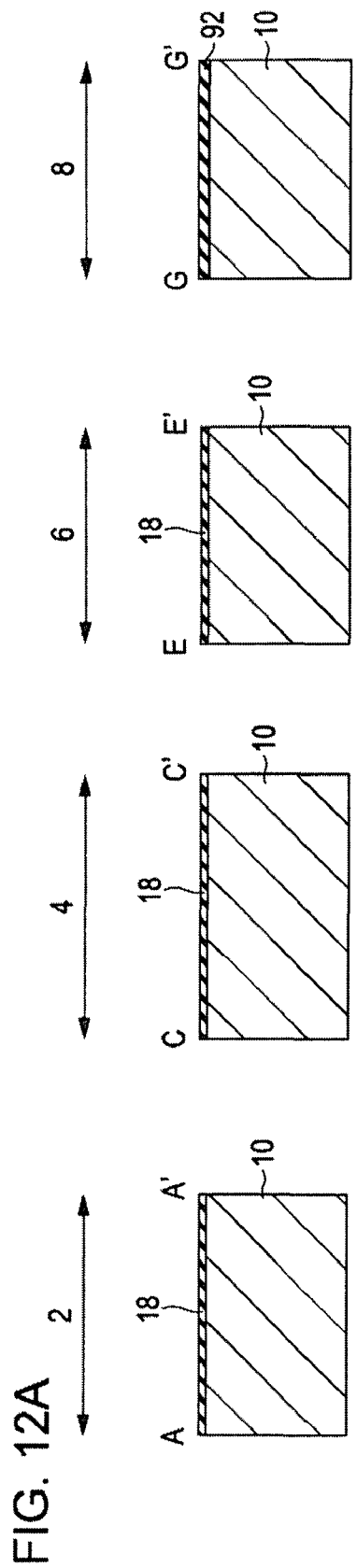
FIGS. 12A and 12B are cross-sectional views showing the step of manufacturing the semiconductor device according to the first embodiment of the present technique.
Figure 12B:
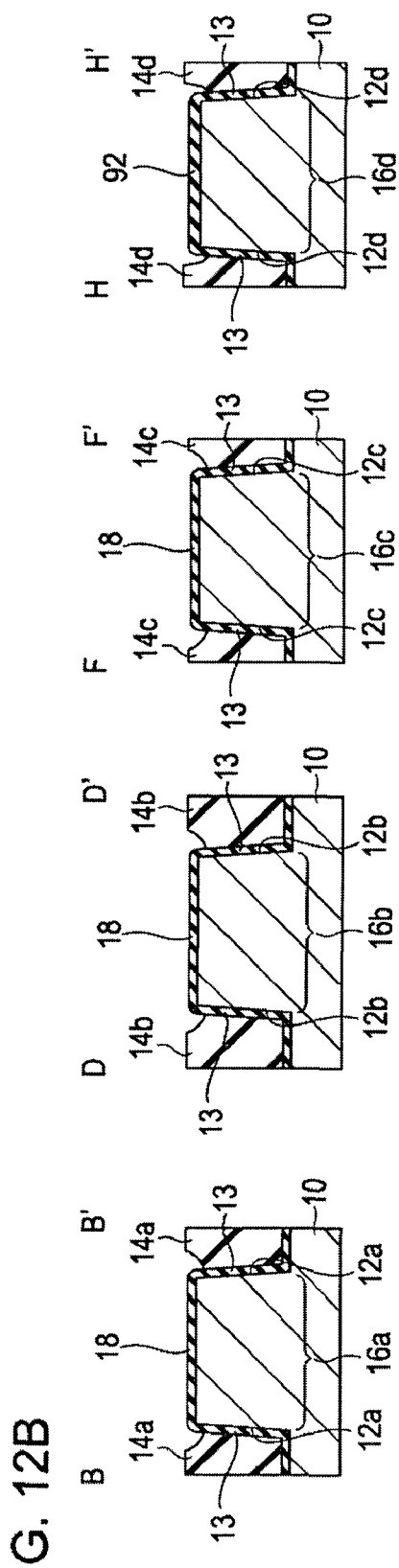

Subsequently, referring to FIGS. 12A and 12B, with the thermal oxidation method, the tunnel insulating film 18 containing a silicon oxidation film with a thickness of 10 nm is formed. Thus, on the active region 16a in the memory cell forming region 2, the active region 16b on the high-voltage transistor forming region 4, and the active region 16c on the intermediate-voltage transistor forming region 6, the tunnel insulating film 18 is formed with a thickness of 10 nm. In the low-voltage transistor forming region 8, since there is the sacrificial oxidation film 92 on the active region 16d, a silicon oxidation film is grown with a thickness of 7 nm in the low-voltage transistor forming region 8 upon forming the tunnel insulating film 18. Therefore, the silicon oxidation film 92 on the active region 16d in the low-voltage transistor forming region 8 has the total thickness of 17 nm.

Figure 13A:
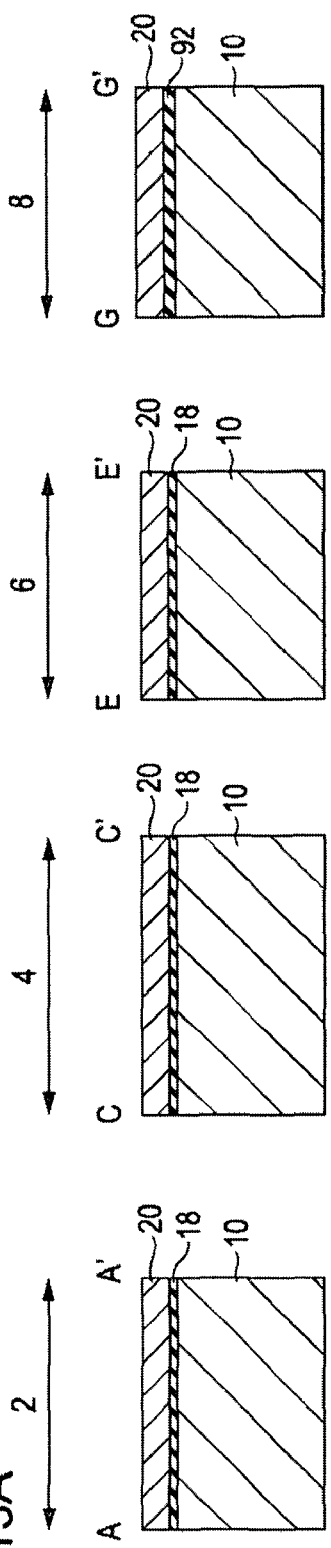
FIGS. 13A and 13B are cross-sectional views showing the step of manufacturing the semiconductor device according to the first embodiment of the present technique.
Figure 13B:
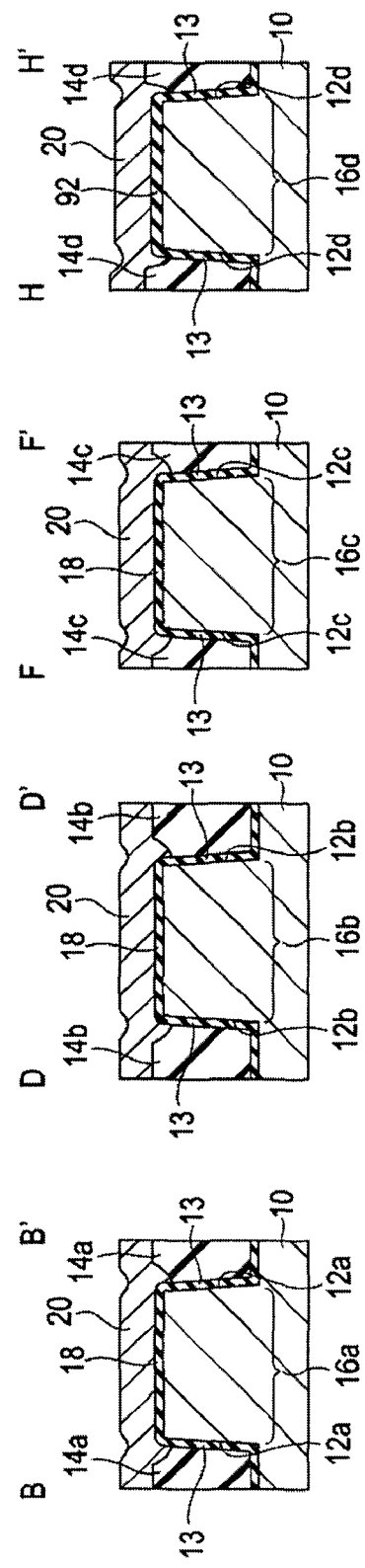

Subsequently, referring to FIGS. 13A and 13B, with the CVD method, an amorphous silicon film 20 to which dopant impurities are guided is formed. As the dopant impurities, e.g., phosphorus (P) is used. The thickness of the amorphous silicon film 20 is, e.g., 70 nm. The amorphous silicon film 20 becomes a floating gate.

Figure 14A:
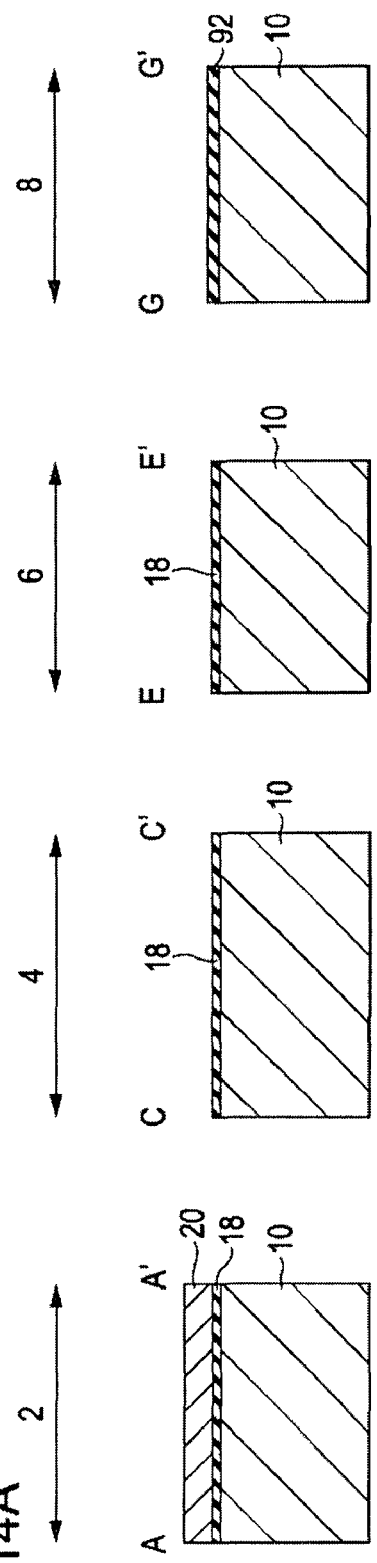
FIGS. 14A and 14B are cross-sectional views showing the step of manufacturing the semiconductor device according to the first embodiment of the present technique.
Figure 14B:
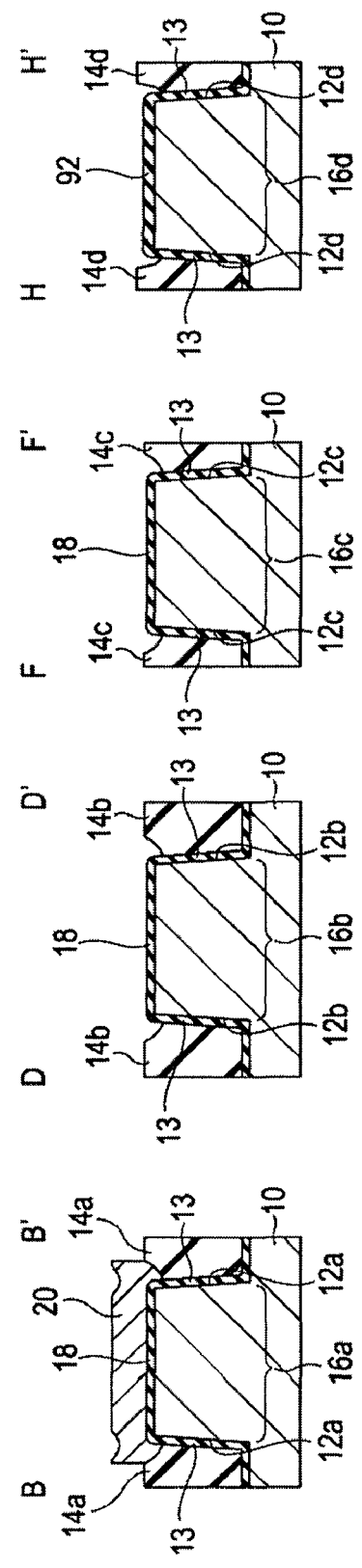

Subsequently, referring to FIGS. 14A and 14B, with the photolithography technology, the amorphous silicon film 20 is patterned. Thus, the amorphous silicon film 20 in the memory cell forming region 2 is patterned with a predetermined shape. Further, the amorphous silicon film 20 in a region except for the memory cell forming region 2 is removed by etching.

Figure 15A:
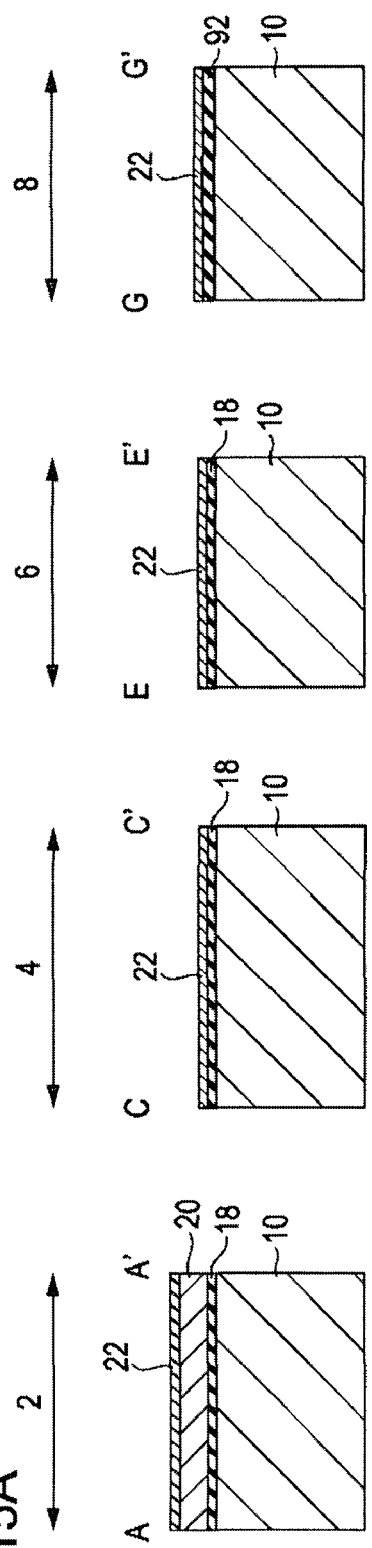
FIGS. 15A and 15B are cross-sectional views showing the step of manufacturing the semiconductor device according to the first embodiment of the present technique.
Figure 15B:
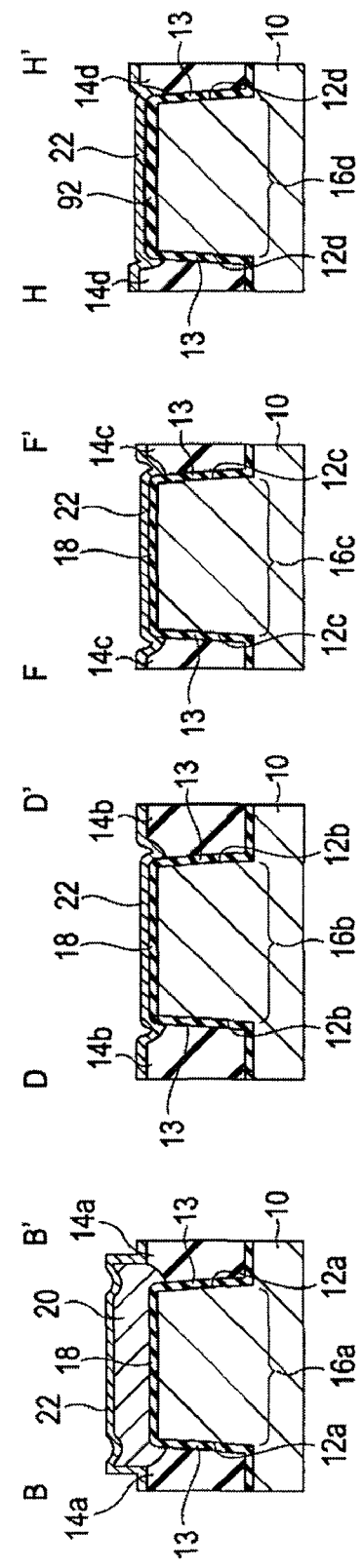

Subsequently, referring to FIGS. 15A and 15B, with the CVD method to the whole substrate, an ONO film (laminated film) 22 is formed by sequentially laminating a silicon oxidation film with a thickness of 6 to 10 nm, a silicon nitride film with a thickness of 4 to 8 nm, and a silicon oxidation film with a thickness of 3 to 7 nm.

Subsequently, with the ion-implantation method, dopant impurities are guided to the intermediate-voltage transistor forming region 6 and the low-voltage transistor forming region 8, thereby properly forming a predetermined conductive well (not shown).

Further, with the ion-implantation method, dopant impurities are guided to the intermediate-voltage transistor forming region 6 and the low-voltage transistor forming region 8, thereby properly forming a threshold-voltage control layer (not shown).

Subsequently, with the spin coat method to the whole substrate, a photoresist film 96 is formed.

Subsequently, with the photolithography technology, the photoresist film 96 is patterned. Thus, the photoresist film 96 for exposing the high-voltage transistor forming region 4 and the intermediate-voltage transistor forming region 6 is formed.

Figure 16A:
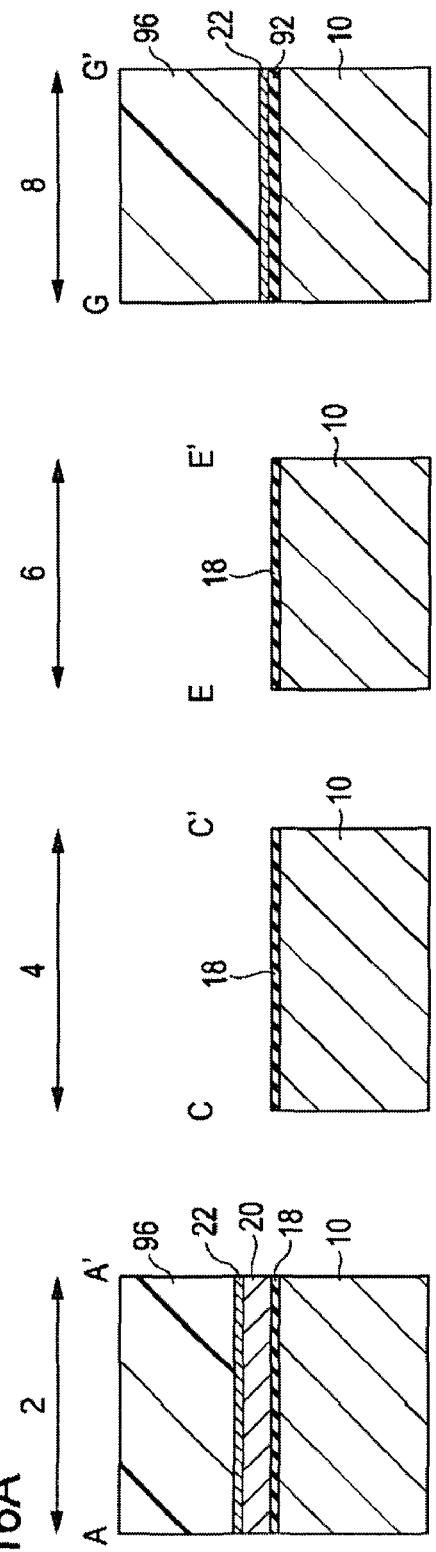
FIGS. 16A and 16B are cross-sectional views showing the step of manufacturing the semiconductor device according to the first embodiment of the present technique.
Figure 16B:
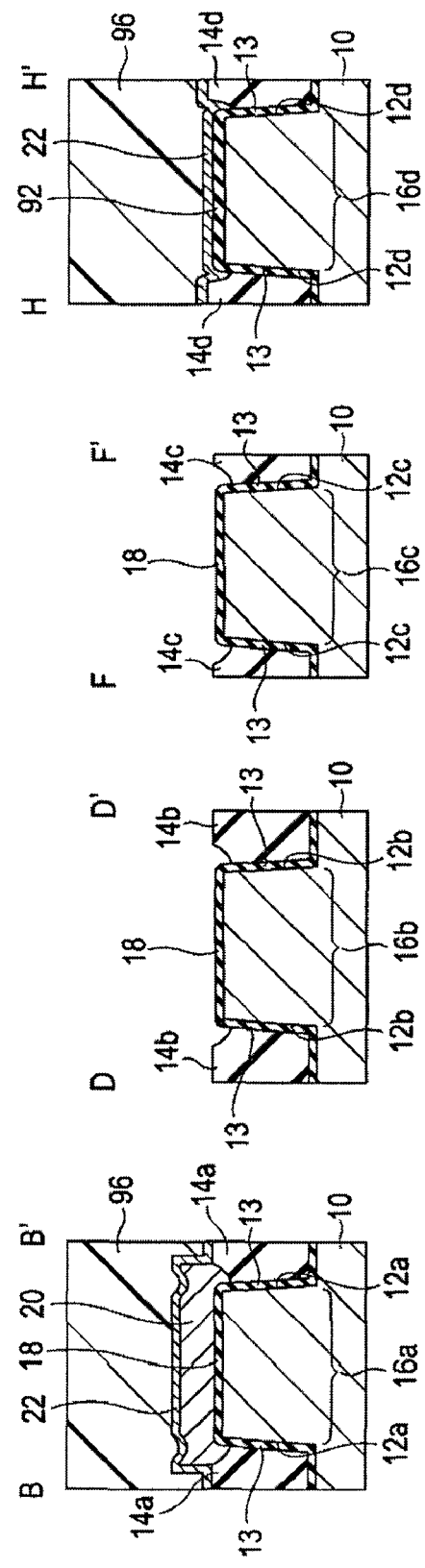

Subsequently, by using the photoresist film 96 as the mask, the ONO film 22 in the high-voltage transistor forming region 4 and the intermediate-voltage transistor forming region 6 is removed by etching (refer to FIGS. 16A and 16B). Upon etching a silicon oxidation film partly forming the ONO film 22, e.g., wet etching is used. Upon etching a silicon nitride film partly forming the ONO film 22, e.g., dry etching is used. That is, the wet etching and the dry etching are used together, thereby etching the ONO film 22.

Herein, the description is given of the example of removing by etching the ONO film 22 in the high-voltage transistor forming region 4 and the intermediate-voltage transistor forming region 6. However, the ONO film 22 in the intermediate-voltage transistor forming region 6 may not be etched. By the etching using, as the mask, the photoresist film that covers the memory cell forming region 2, the intermediate-voltage transistor forming region 6, and the low-voltage transistor forming region 8, the ONO film 22 in the intermediate-voltage transistor forming region 6 cannot be removed by etching.

However, in order to reduce the number of steps of manufacturing the semiconductor device, at this stage, preferably, the ONO film 22 in the intermediate-voltage transistor forming region 6 may be removed by etching.

Figure 17A:
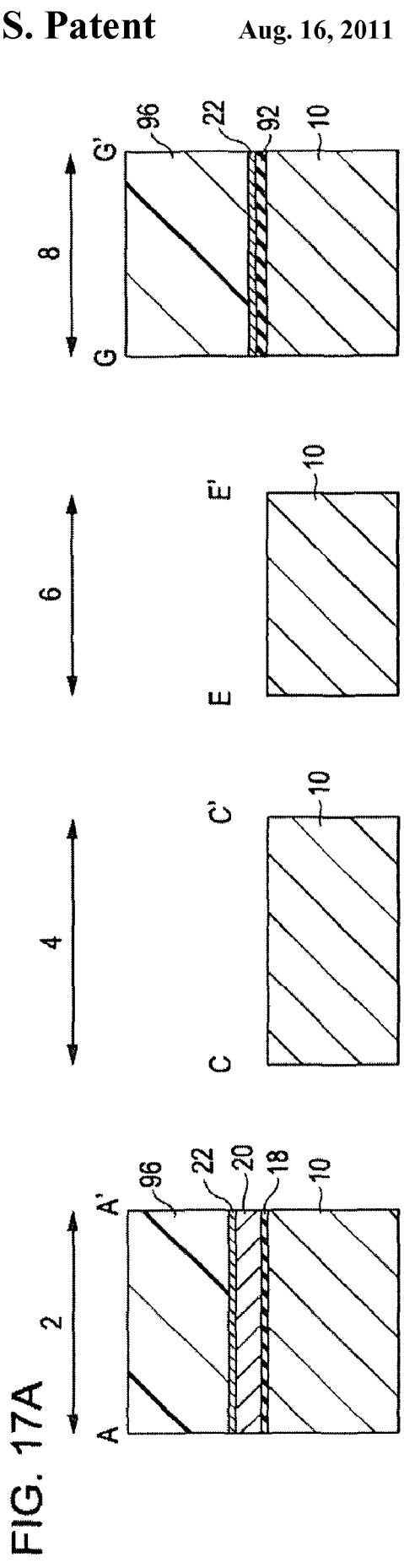
FIGS. 17A and 17B are cross-sectional views showing the step of manufacturing the semiconductor device according to the first embodiment of the present technique.
Figure 17B:
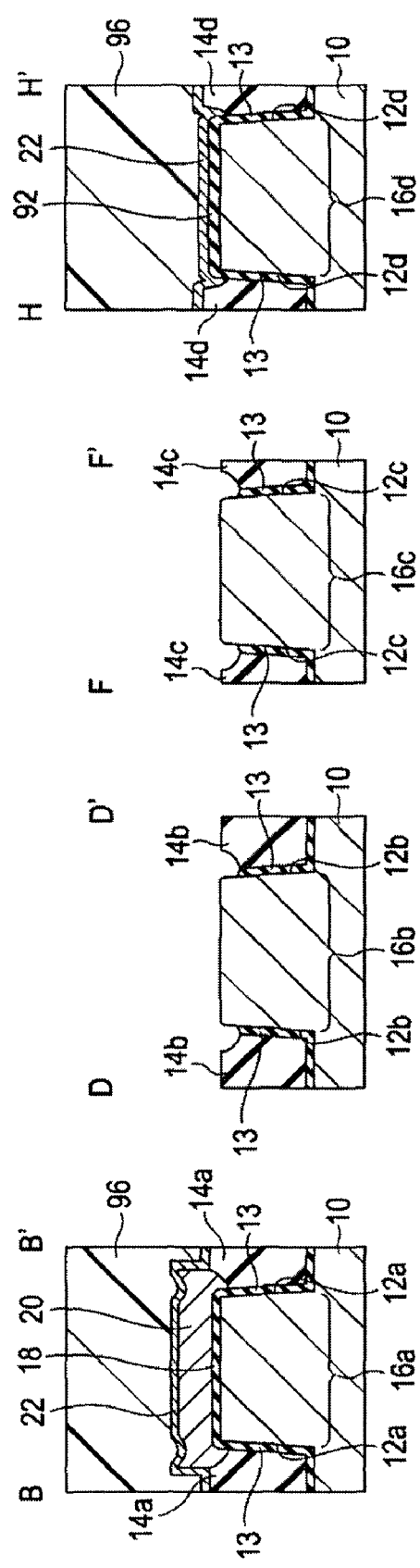

Subsequently, referring to FIGS. 17A and 17B, by using the photoresist film 96 as the mask, the tunnel insulating film 18 is removed by etching. Thus, the active region 16b of the high-voltage transistor forming region 4 is exposed. Incidentally, the active region 16c of the intermediate-voltage transistor forming region 6 is also exposed. As etching solution, e.g., hydrofluoric acid is used. The tunnel insulating film 18 containing a silicon oxidation film with a thickness of 10 nm is etched for a time period necessary for etching a silicon oxidation film with a thickness of 12 nm as that of 1.2 multiples of the tunnel insulating film 18. Therefore, the device separating area 14b of the high-voltage transistor forming region 4 and the device separating area 14c of the intermediate-voltage transistor forming region 6 are etched with a thickness of 12 nm. Therefore, after etching the tunnel insulating film 18, the top surface of the device separating area 14b of the high-voltage transistor forming region 4 and the top surface of the device separating area 14c of the intermediate-voltage transistor forming region 6 are lower, by a thickness of 3 nm, than the top surfaces of the active regions 16b and 16d. On the other hand, the top surface of the device separating area 14a of the memory cell forming region 2 maintains to be higher, by a thickness of 9 nm, than the top surface of the active region 16a. Further, the top surface of the device separating area 14d of the low-voltage transistor forming region 8 maintains to be higher, by 21 nm, than the top surface of the active region 16d.

Figure 18A:
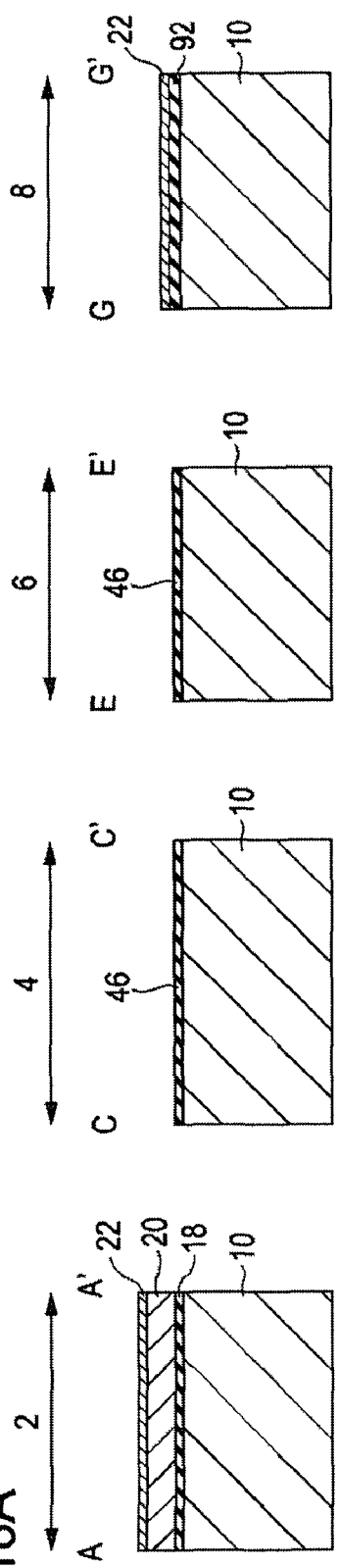
FIGS. 18A and 18B are cross-sectional views showing the step of manufacturing the semiconductor device according to the first embodiment of the present technique.
Figure 18B:
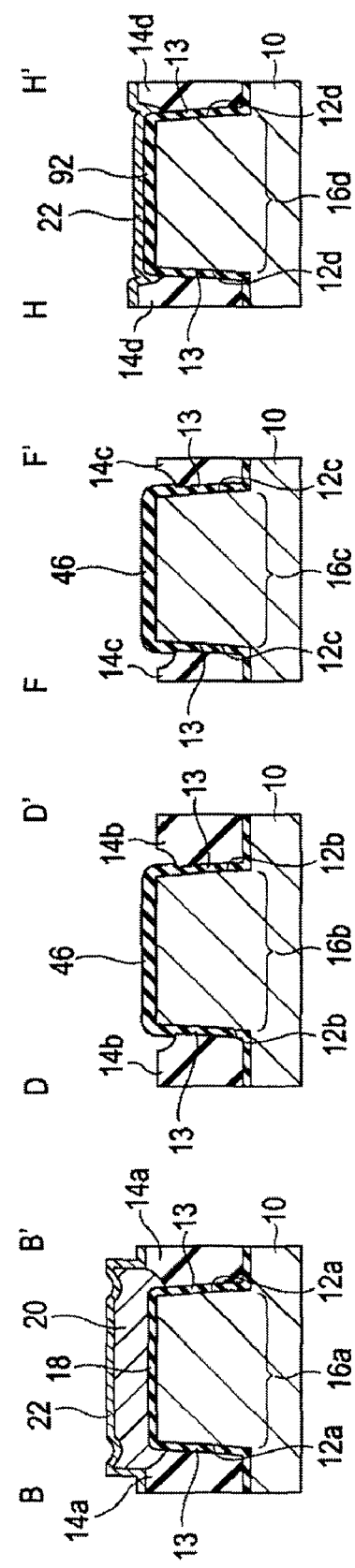

Subsequently, referring to FIGS. 18A and 18B, on the active region 16b of the high-voltage transistor forming region 4, the gate insulating film 46 is formed with a thickness of 15 nm. In this case, on the active region 16c of the intermediate-voltage transistor forming region 6, the gate insulating film 46 is also formed with a thickness of 15 nm. A silicon nitride film partly forming the ONO film 22 has the oxidation resistance. Therefore, in a region covered with the ONO film 22, i.e., the memory cell forming region 22 and the low-voltage transistor forming region 8, the silicon oxidation film cannot be grown.

Subsequently, with the spin coat method to the entire substrate, a photoresist film 98 is formed.

Subsequently, with the photolithography technology, the photoresist film 98 is patterned. Thus, the photoresist film 98 for exposing the intermediate-voltage transistor forming region 6 is formed.

Figure 19A:
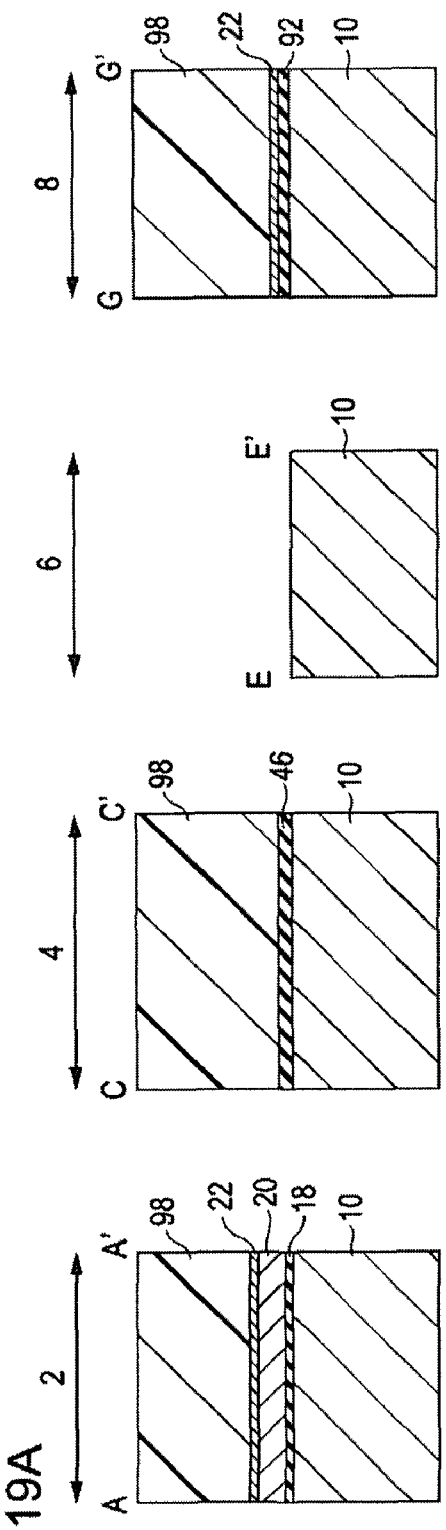
FIGS. 19A and 19B are cross-sectional views showing the step of manufacturing the semiconductor device according to the first embodiment of the present technique.
Figure 19B:
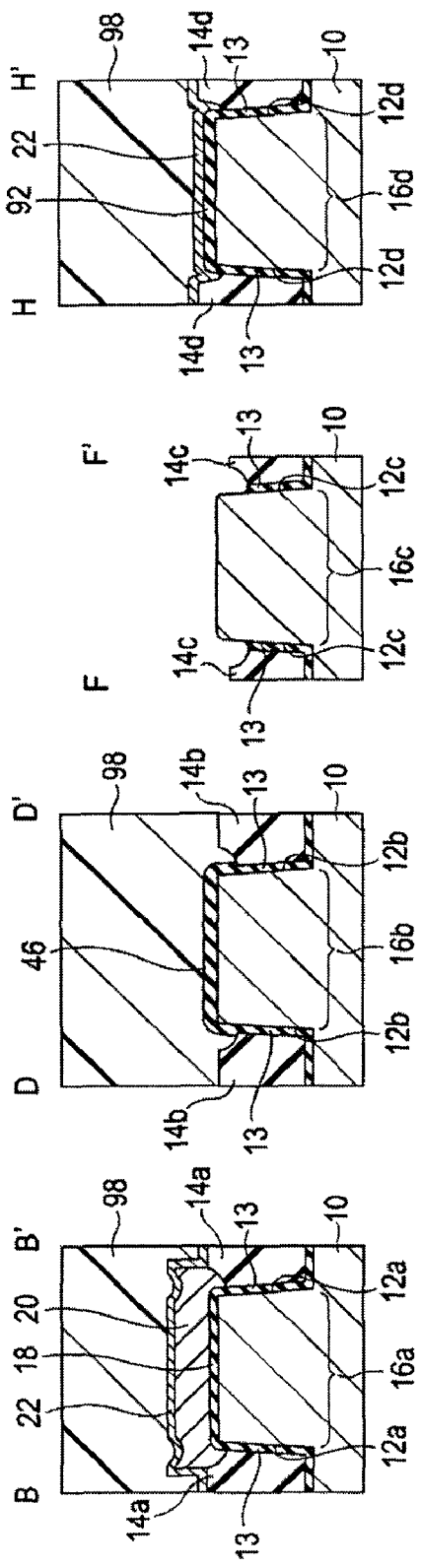

Subsequently, by using the photoresist film 98 as the mask, the gate insulating film 46 on the active region 16c of the intermediate-voltage transistor forming region 6 is removed by etching (refer to FIGS. 19A and 19B). As etching solution, e.g., hydrofluoric acid is used. The gate insulating film 46 with a thickness of 15 nm is etched for a time period necessary for etching a silicon oxidation film with a thickness of 18 nm as that of 1.2 multiples of the gate insulating film 46. Therefore, after etching the gate insulating film 46, the top surface of the device separating area 14c of the intermediate-voltage transistor forming region 6 is lower, with thickness of 21 nm, than the active region 16c. On the other hand, the top surface of the device separating area 14a of the memory cell forming region 2 maintains to be higher, with a thickness of 9 nm, than the top surface of the active region 16a. Further, the top surface of the device separating area 14b of the high-voltage transistor forming region 4 maintains to be lower, with a thickness of 3 nm, than the top surface of the active region 16b. Furthermore, the top surface of the device separating area 14d of the low-voltage transistor forming region 8 maintains to be higher, with a thickness of 21 nm, than the top surface of the active region 16d. Thereafter, the photoresist film 98 is peeled.

Figure 20A:
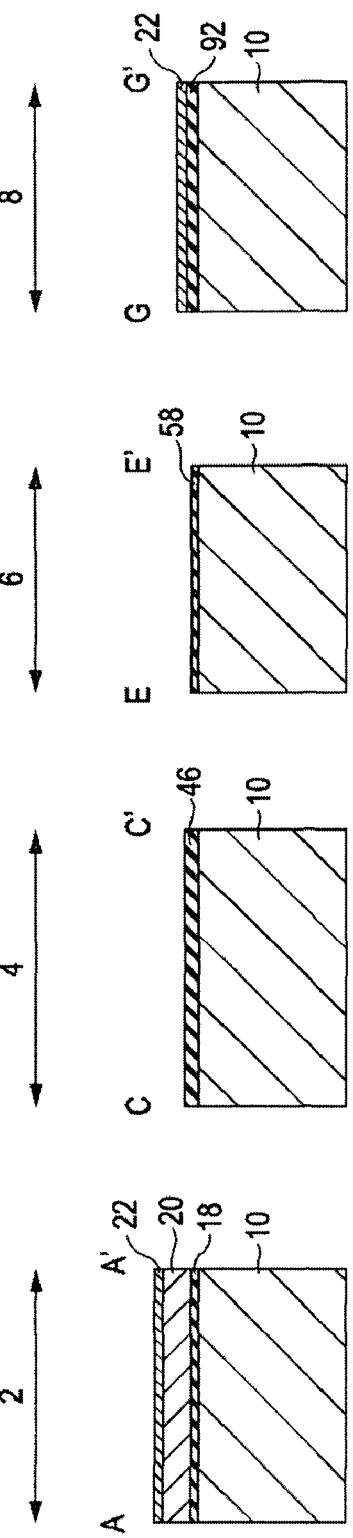
FIGS. 20A and 20B are cross-sectional views showing the step of manufacturing the semiconductor device according to the first embodiment of the present technique.
Figure 20B:
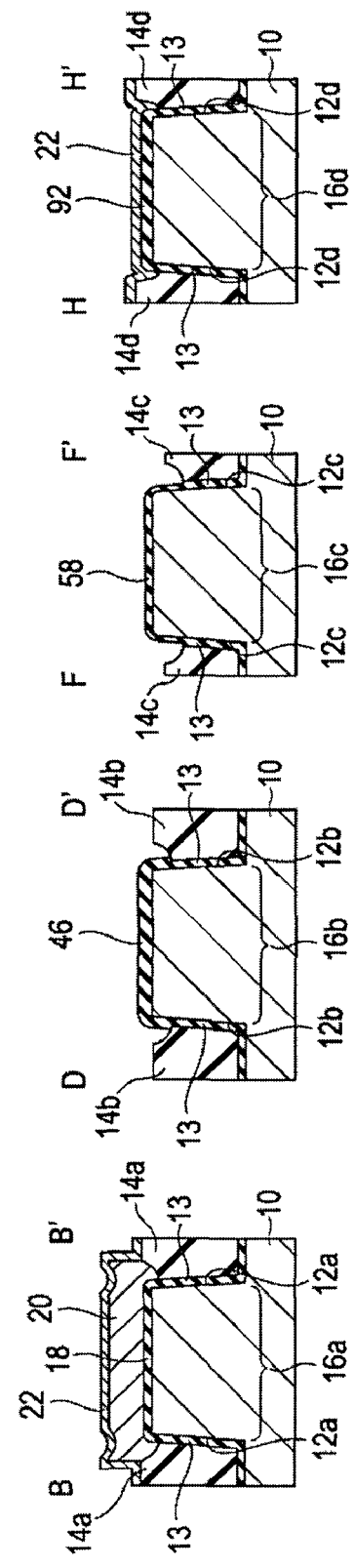
Figure 21A:
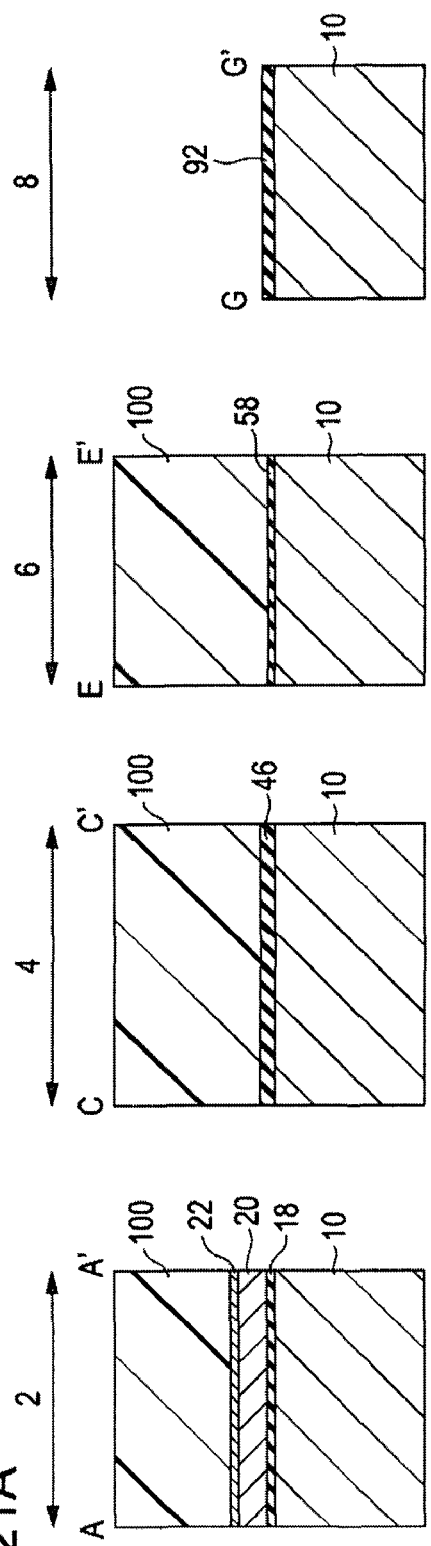
FIGS. 21A and 21B are cross-sectional views showing the step of manufacturing the semiconductor device according to the first embodiment of the present technique.
Figure 21B:
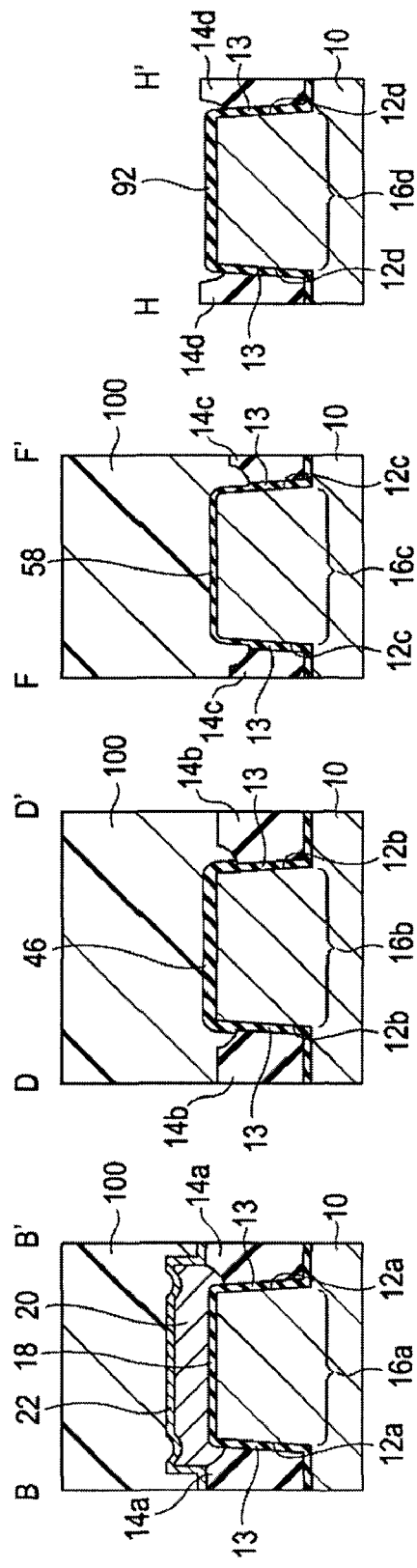

Subsequently, referring to FIGS. 20A and 20B, with the thermal oxidation method, on the active region 16c of the intermediate-voltage transistor forming region 6, the gate insulating film 58 with a thickness of 7 nm is formed. As mentioned above, a silicon nitride film partly forming the ONO film 22 has the oxidation resistance. Therefore, in a region covered with the ONO film 22, i.e., in the memory cell forming region 2 and the low-voltage transistor forming region 8, the silicon oxidation film cannot be grown.

Subsequently, with the spin coat method to the whole substrate, a photoresist film 100 is formed.

Subsequently, with the photolithography technology, the photoresist film 100 is patterned. Thus, the photoresist film 100 for exposing the low-voltage transistor forming region 8 is formed (refer to FIGS. 21A and 21B).

Subsequently, referring to FIGS. 22A and 22B, by using the photoresist film 100 as the mask, the silicon oxidation film 92 on the active region 16d of the low-voltage transistor forming region 8 is removed by etching. As etching solution, e.g., hydrofluoric acid is used. The silicon oxidation film 92 with a thickness of 17 nm is etched for a time period necessary for etching a silicon oxidation film with a thickness of 21 nm as that of 1.2 multiples of the silicon oxidation film 92. Therefore, after etching the gate insulating film 92, the height of the top surface of the device separating area 14d of the low-voltage transistor forming region 8 is substantially equal to the height of the top surface of the active region 16d. On the other hand, the top surface of the device separating area 14a of the memory cell forming region 2 maintains to be higher, by 9 nm, than the top surface of the active region 16a. Further, the top surface of the device separating area 14b of the high-voltage transistor forming region 4 maintains to be lower, with a thickness of 3 nm, than the top surface of the active region 16b. Furthermore, the top surface of the device separating area 14c of the intermediate-voltage transistor forming region 6 maintains to be lower, with a thickness of 21 nm, than the top surface of the active region 16c. Thereafter, the photoresist film 100 is peeled.

Subsequently, referring to FIGS. 23A and 23B, with the thermal oxidation method, the gate insulating film 68 with a thickness of 1.5 nm is formed on the active region 16d of the low-voltage transistor forming region 8.

Figure 24A:
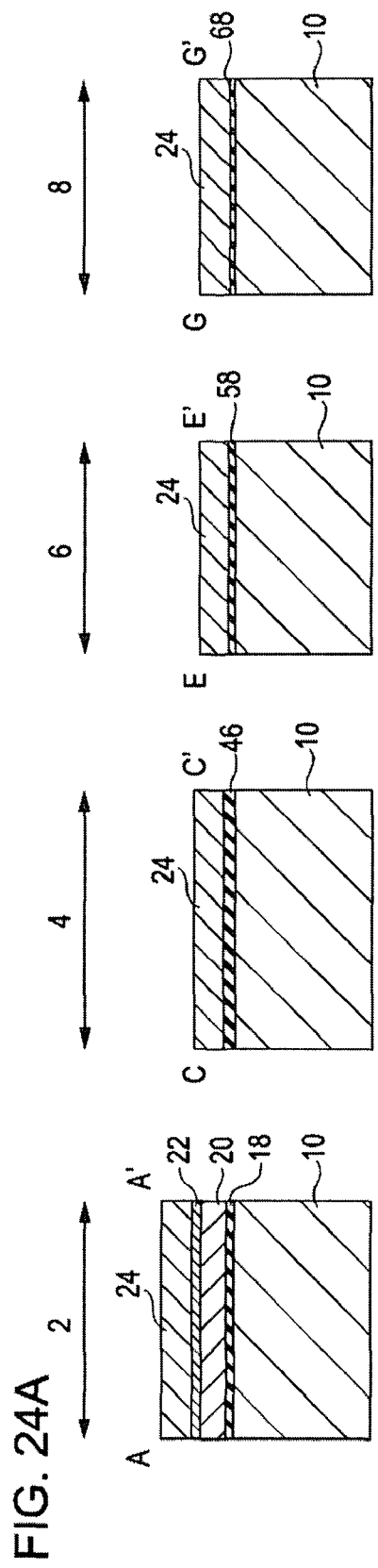
FIGS. 24A and 24B are cross-sectional views showing the step of manufacturing the semiconductor device according to the first embodiment of the present technique.
Figure 24B:
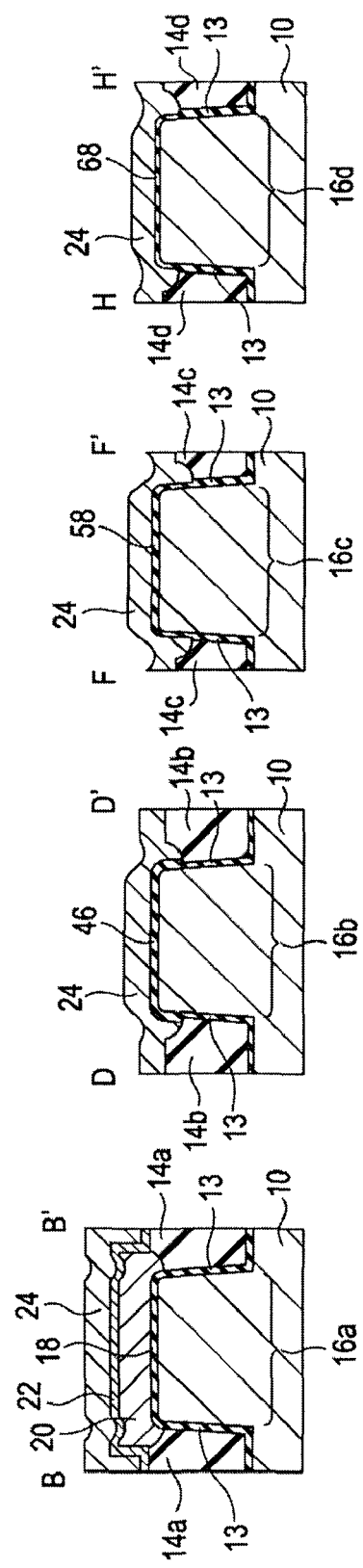
Figure 25A:
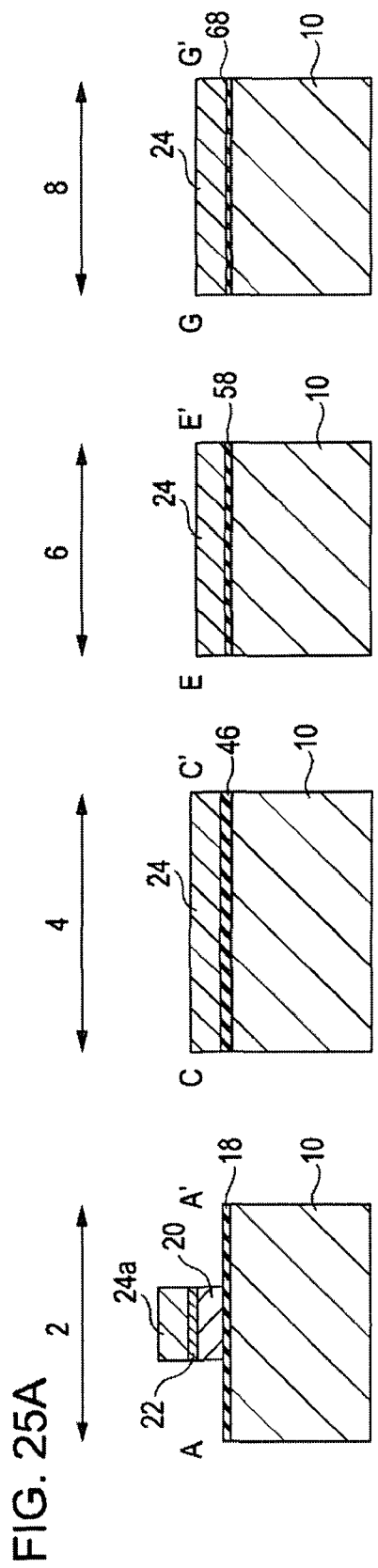
FIGS. 25A and 25B are cross-sectional views showing the step of manufacturing the semiconductor device according to the first embodiment of the present technique.
Figure 25B:
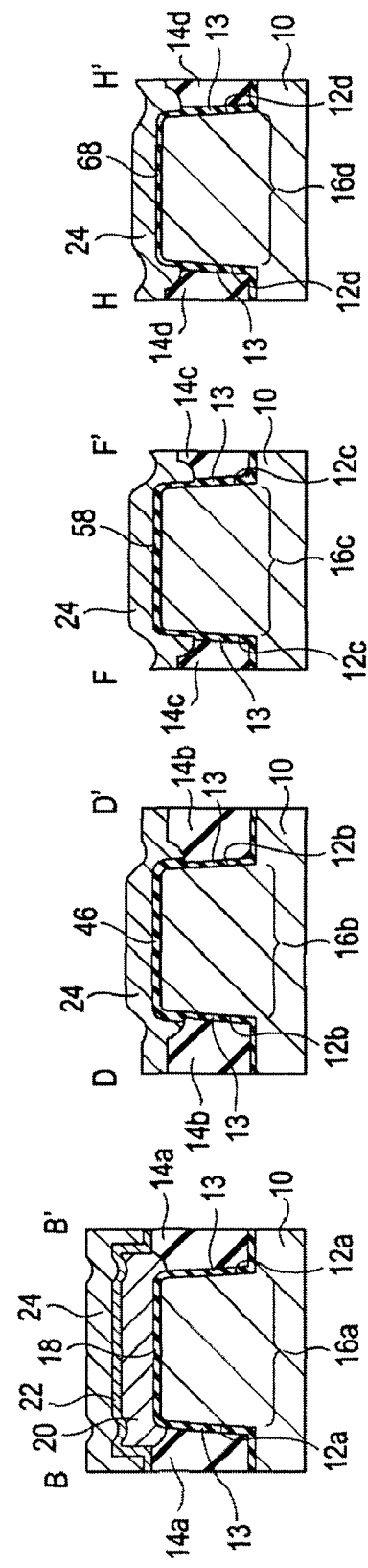

Subsequently, referring to FIGS. 24A and 24B, with the CVD method, a polysilicon film 24 with a thickness of 100 nm is formed.

Subsequently, with the photolithography technology, the polysilicon film 24 in the memory cell forming region 2 is patterned. Thus, the control gate 24a is formed on the floating gate 20 (refer to FIG. 25A).

Subsequently, with the spin coat method to the whole substrate, a photoresist film 102 is formed.

Subsequently, with the photolithography technology, the photoresist film 102 is patterned. Thus, a pattern 102a of the photoresist film for patterning the gate electrode 24b of the high-voltage transistor 56, a pattern 102b of the photoresist film for patterning the gate electrode 24c of the intermediate-voltage transistor 66, and the pattern 102c of the photoresist film for patterning the gate electrode 24d of the low-voltage transistor 76 are formed (refer to FIGS. 26A and 26B).

Referring to FIG. 4, in the memory cell forming region 2, the top surface of the device separating area 14a is higher than the top surface of the active region 16a with a thickness of 9 nm. Further, in the high-voltage transistor forming region 4, the top surface of the device separating area 14b is lower than the top surface of the active region 16b with a thickness of 3 nm. Furthermore, in the intermediate-voltage transistor forming region 6, the top surface of the device separating area 14c is lower than the top surface of the active region 16c with a thickness of 21 nm. In addition, in the low-voltage transistor forming region 8, the height of the top surface of the device separating area 14d is substantially equal to the height of the top surface of the active region 16d.

In the low-voltage transistor forming region 8, the height of the top surface of the device separating area 14d is substantially equal to the height of the top surface of the active region 16d, the pattern 102c of the photoresist film for patterning the gate electrode 24d of the low-voltage transistor 76 is not thus strongly pulled in the longitudinal direction. Therefore, according to the first embodiment, the pattern 102c of the photoresist film for patterning the gate electrode 24d of the low-voltage transistor 76 can be prevented from being excessively thin. As a consequence, according to the first embodiment, the low-voltage transistor 76 having the gate electrode 24d with a desired gate length can be formed and the semiconductor device having preferable electrical characteristics can be also provided.

Incidentally, in the intermediate-voltage transistor forming region 6, the top surface of the device separating area 14c is lower than the top surface of the active region 16c to some degree, the pattern 102b of the photoresist film for patterning the gate electrode 24c of the intermediate-voltage transistor 66 is pulled in the longitudinal direction. However, the gate length of the gate electrode 24c of the intermediate-voltage transistor 66 is relatively long, i.e., 350 nm and, even if the pattern 102b of the photoresist film for patterning the gate electrode 24c is thin by several nanometers, this cannot influence on electrical characteristics of the intermediate-voltage transistor 66.

Further, in the high-voltage transistor forming region 4, the top surface of the device separating area 14b is also lower than the top surface of the active region 16b to some degree, the pattern 102a of the photoresist film for patterning the gate electrode 24b of the high-voltage transistor 56 is pulled in the longitudinal direction. However, the gate length of the gate electrode 24b of the high-voltage transistor 56 is relatively long, i.e., 700 nm and, even if the pattern 102a of the photoresist film for patterning the gate electrode 24b is thin by several nanometers, this cannot influence on electrical characteristics of the high-voltage transistor 56.

Subsequently, by using the photoresist film 102 as the mask, the polysilicon film 24 is etched. Thus, the gate electrode 24b of the high-voltage transistor 56, the gate electrode 24c of the intermediate-voltage transistor 66, and the gate electrode 24d of the low-voltage transistor 76 are formed (refer to FIGS. 27A and 27B).

Dopant impurities are guided to the active region 16a on both sides of the control gate 24a, thereby forming an extension area 26 and a pocket area (not shown).

Further, dopant impurities are guided to the active region 16b on both sides of the gate electrode 24b, thereby forming a extension area (extension area) 50 and a pocket area (not shown).

Furthermore, dopant impurities are guided to the active region 16c on both sides of the gate electrode 24c, thereby forming an extension area 60 and a pocket area (not shown).

Figure 28A:
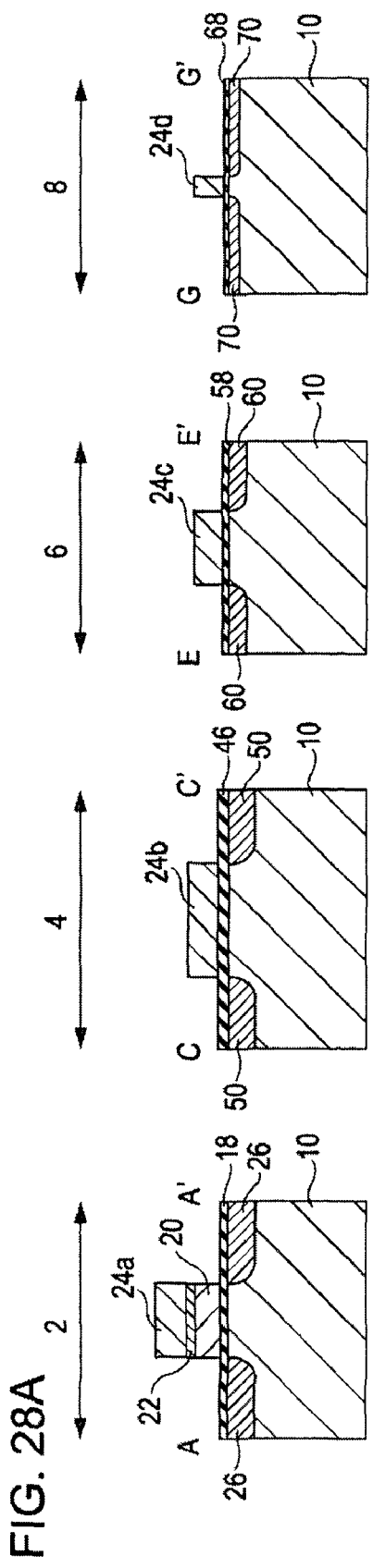
FIGS. 28A and 28B are cross-sectional views showing the step of manufacturing the semiconductor device according to the first embodiment of the present technique.
Figure 28B:
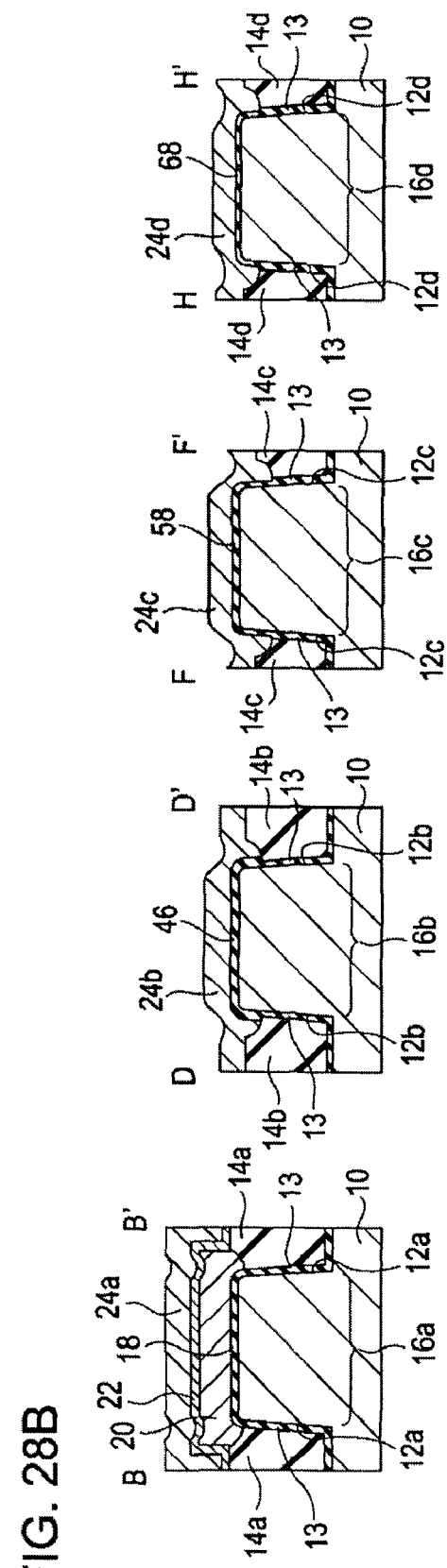

In addition, dopant impurities are guided to the active region 16d on both sides of the gate electrode 24d, thereby forming an extension area 70 and a pocket area (not shown) (refer to FIGS. 28A and 28B).

Subsequently, side-wall insulating films (side-wall spacers) are individually formed to side wall portions of the floating gate and the control gate, a side wall portion of the gate electrode of the high-voltage transistor, a side wall portion of the gate electrode of the intermediate-voltage transistor, and a side wall portion of the gate electrode of the low-voltage transistor.

Subsequently, with the ion-implantation method, within the active region 16a on both sides of the floating gate 20 and the control gate 24a to which the side-wall insulating film 28 is formed, the high-concentration impurity area 30 is formed. Accordingly, the source and the drain region 32 having the extension area 26 and the high-concentration impurity area 30 are formed.

Further, with the ion-implantation method, within the active region 16b on both sides of the gate electrode 24b to which the side-wall insulating film 28 is formed, the high-concentration impurity area 52 is formed. Accordingly, the source and the drain region 54 having the extension area 50 and the high-concentration impurity area 52 are formed.

Furthermore, with the ion-implantation method, within the active region 16c on both sides of the gate electrode 24c to which the side-wall insulating film 28 is formed, the high-concentration impurity area 62 is formed. Accordingly, the source and the drain region 64 having the extension area 60 and the high-concentration impurity area 62 are formed.

In addition, with the ion-implantation method, within the active region 16d on both sides of the gate electrode 24d to which the side-wall insulating film 28 is formed, the high-concentration impurity area 72 is formed. Accordingly, the source and the drain region 74 having the extension area 70 and the high-concentration impurity area 72 are formed.

Subsequently, the silicide films 34 are formed on the control gate 24a, the gate electrodes 24b to 24d, and the source and the drain regions 32, 54, 64, and 74 (refer to FIGS. 29A and 29B). The silicide films 34 on the source and the drain regions 32, 54, 64, and 74 function as source and drain electrodes.

Subsequently, with the CVD method to the whole substrate, the inter-layer insulating film 78 having a silicon oxidation film is formed.

Subsequently, with the photolithography technology, the contact hole 80 reaching the source and the drain electrode 34 is formed.

Subsequently, with the CVD method to the whole substrate, a conductive film is formed.

Subsequently, with the CMP method, the conductive film is polished until exposing the surface of the inter-layer insulating film 78. Thus, the conductive plug 82 containing the conductive film is embedded into the contact hole 80 (Refer to FIGS. 30A and 30B).

Subsequently, with the CVD method to the whole substrate, the inter-layer insulating film 84 containing, e.g., a silicon oxidation film is formed.

Subsequently, the trench 85 for embedding the wiring 86 is formed to the inter-layer insulating film 84.

Subsequently, with the sputtering method to the whole substrate, the conductive film is formed.

Subsequently, with the photolithography technology, the conductive film is patterned. Thus, the wiring 86 having conductive film is embedded into the trench 85.

Figure 31A:
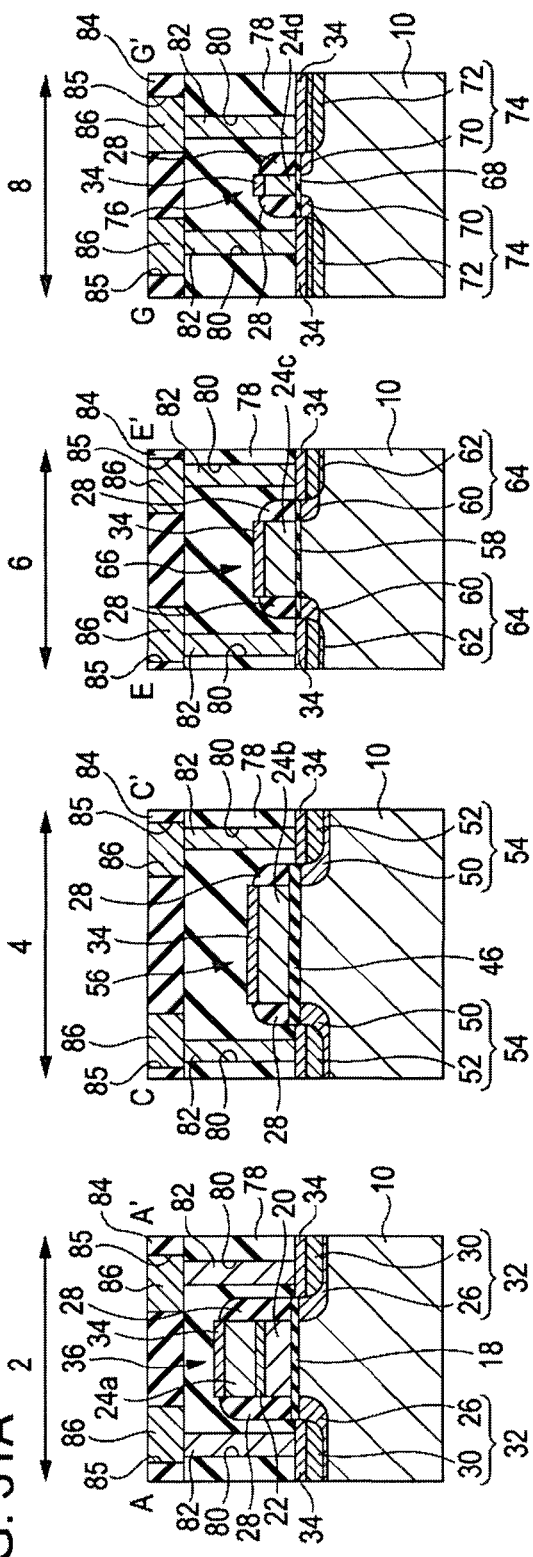
FIGS. 31A and 31B are cross-sectional views showing the step of manufacturing the semiconductor device according to the first embodiment of the present technique.
Figure 31B:
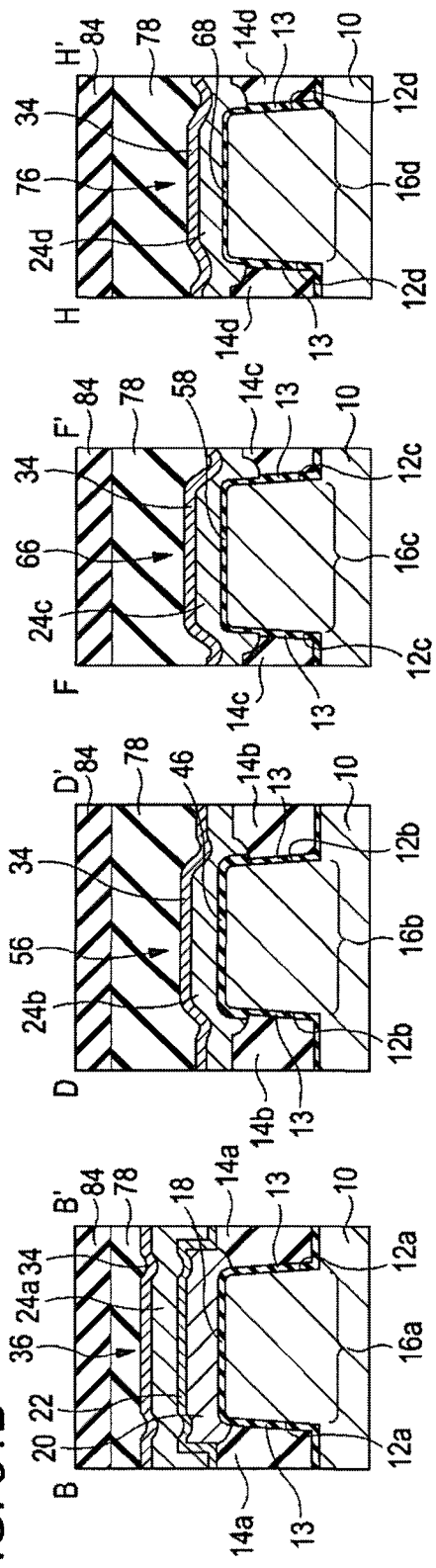

As mentioned above, the semiconductor device according to the first embodiment is manufactured (refer to FIGS. 31A and 31B).

As mentioned above, according to the first embodiment, in a state in which there is the sacrificial oxidation film 92 on the active region 16d of the low-voltage transistor forming region 8 without removing the sacrificial oxidation film 92 on the active region 16d of the low-voltage transistor forming region 8, the tunnel insulating film 18 is formed. Hence, it is possible to prevent the silicon oxidation film from being grown to be thick on the active region 16d of the low-voltage transistor forming region 8. Therefore, upon removing the silicon oxidation film 92 on the active region 16d of the low-voltage transistor forming region 8, it is possible to prevent the excessive etching of the device separating area 14d of the low-voltage transistor forming region 8, and also possible to possible to prevent the height of the top surface of the device separating area 14d of the low-voltage transistor forming region 8 from being extremely lower than the active region 16d.

Further, according to the first embodiment, in a state in which there is the ONO film 22 on the active region 16d of the low-voltage transistor forming region 8 without removing the ONO film 22 on the active region 16d of the low-voltage transistor forming region 8, the gate insulating film 46 of the high-voltage transistor 56 and the gate insulating film 58 of the intermediate-voltage transistor 66 are formed. As a consequence, it is possible to prevent the silicon oxidation film 92 from being grown to be thick on the active region 16d of the low-voltage transistor 76. Therefore, it is possible to prevent the excessive etching of the device separating area 14d of the low-voltage transistor forming region 8 upon removing the silicon oxidation film 92 on the active region 16d of the low-voltage transistor forming region 8, and is also possible to prevent the height of the top surface of the device separating area 14d of the low-voltage transistor forming region 8 from being excessively lower than the active region 16d.

Consequently, according to the first embodiment, it is possible to prevent the pattern 102c of the photoresist film for patterning the gate electrode 24d of the low-voltage transistor 76 from being strongly pulled in the longitudinal direction, and is also possible to prevent an excessive thin state of a pattern 102d of the photoresist film for patterning the gate electrode 24d of the low-voltage transistor 76. Therefore, according to the first embodiment, the low-voltage transistor 76 having the gate electrode 24d with a desired gate length can be formed, and the semiconductor device having preferable electrical characteristics can be also provided.

Hereinbelow, a description will be given of a semiconductor device and a method of manufacturing the same according to the second embodiment of the present technique with reference to FIGS. 32A to 56B. The same reference numerals as those in the semiconductor device and the method of manufacturing the same according to the first embodiment shown in FIGS. 1A to 31B denote the same components, and a description thereof will be omitted or brief.

Figure 32A:
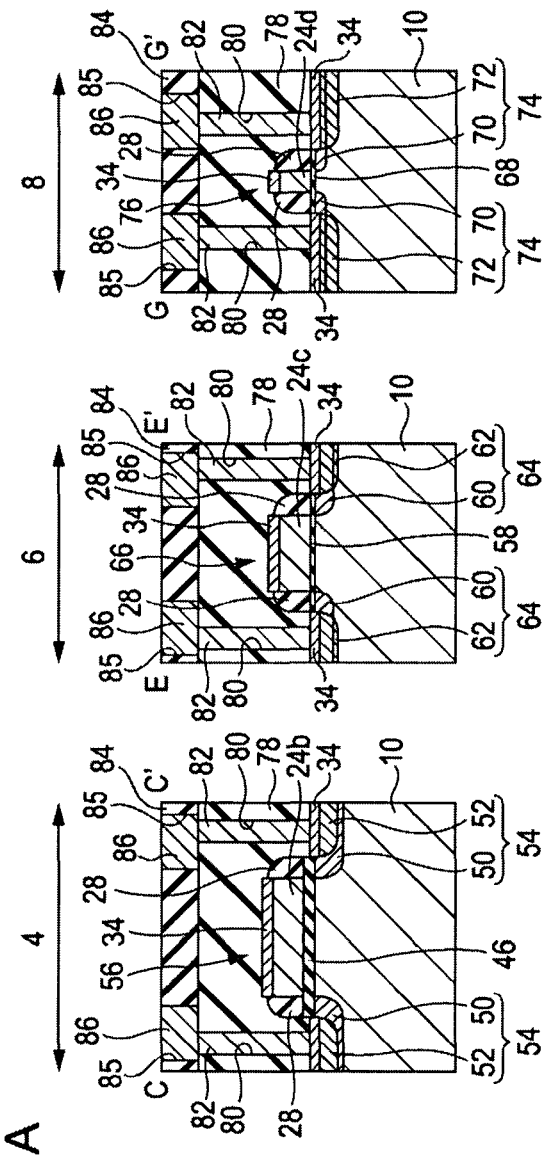
FIGS. 32A and 32B are cross-sectional views showing a semiconductor device according to the second embodiment of the present technique.
Figure 32B:
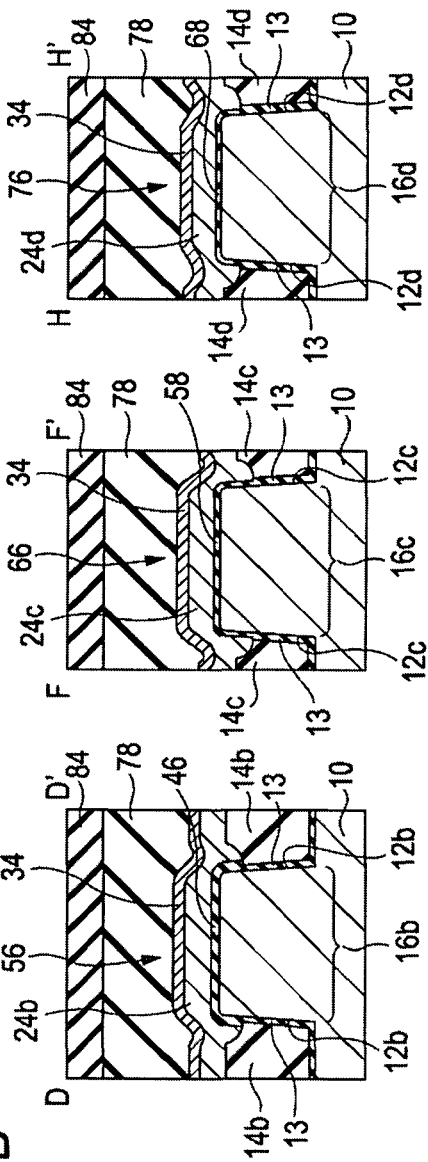
Figure 33A:
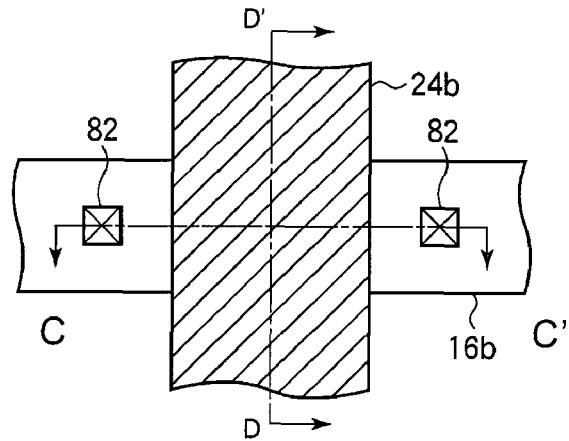
FIGS. 33A to 33C are plan views showing a high-voltage transistor, an intermediate-voltage transistor, and a low-voltage transistor in the semiconductor device according to the second embodiment of the present technique.
Figure 33B:
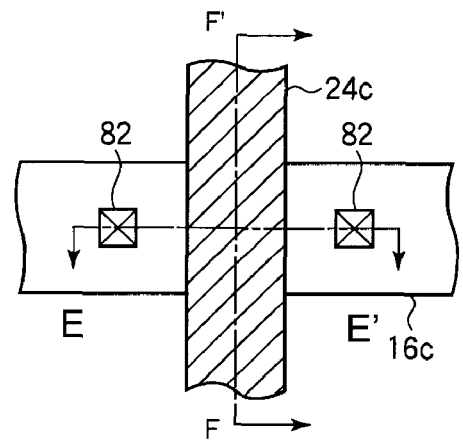
Figure 33C:
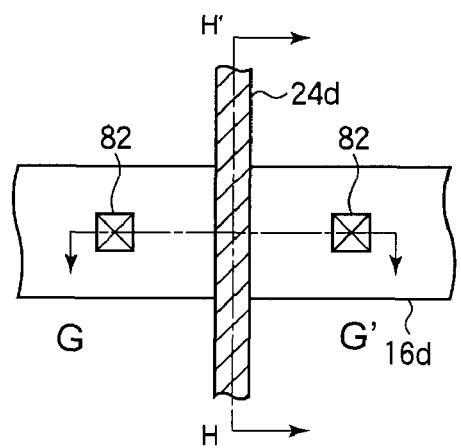
Figure 34:
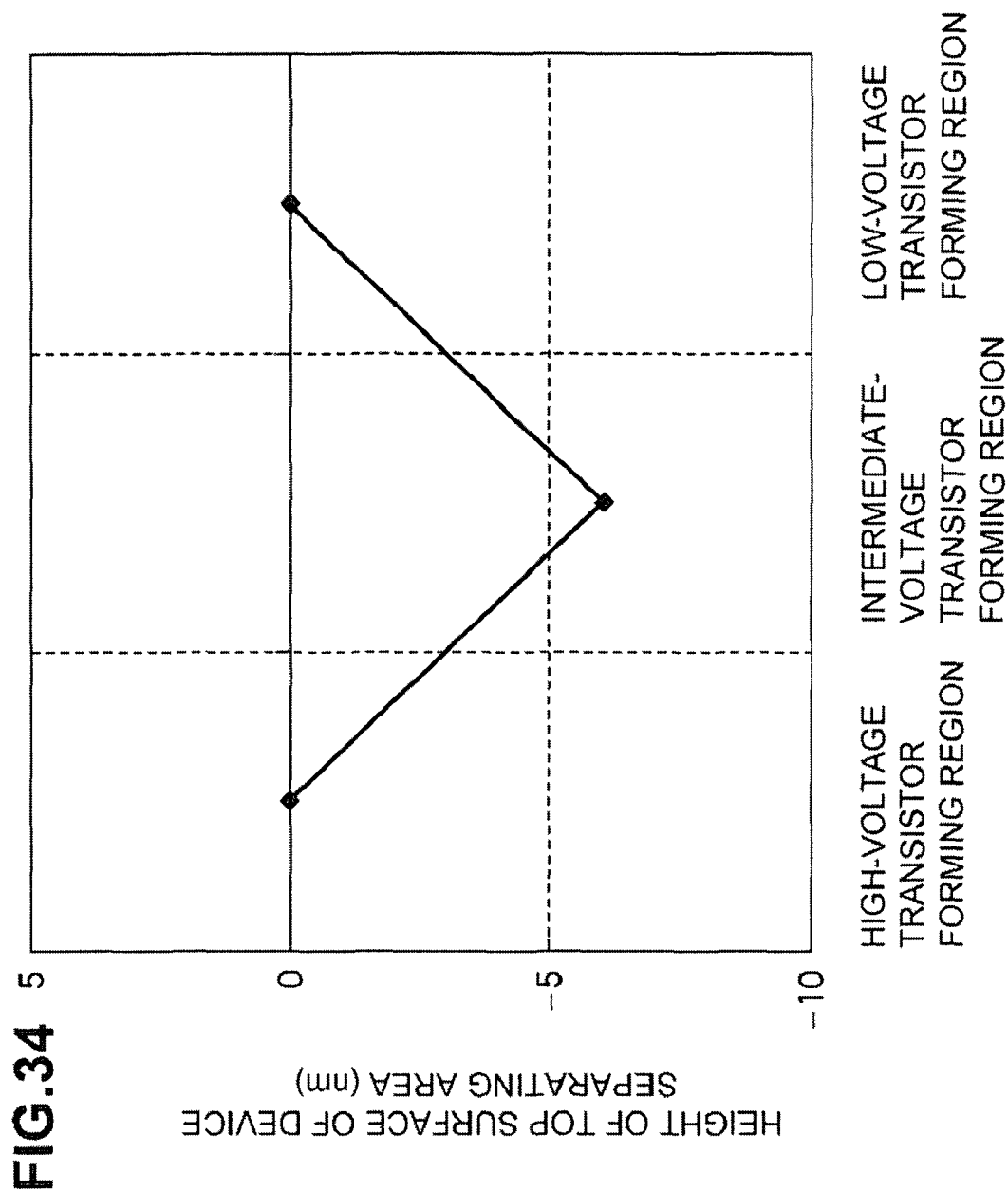
FIG. 34 is a graph showing a relationship between the height of a top surface of a device separating area and the heights of top surfaces of active regions in the semiconductor device according to the second embodiment of the present technique.
Figure 35A:
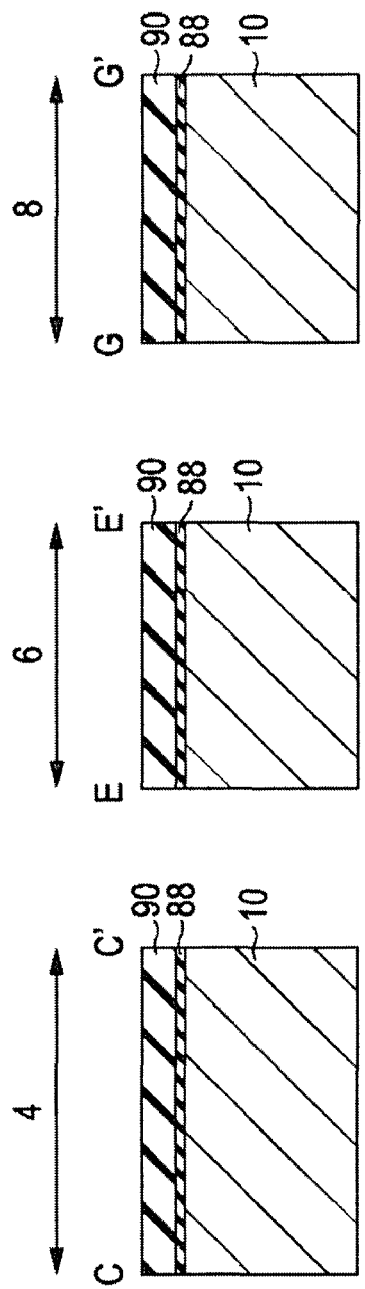
FIGS. 35A and 35B are cross-sectional views showing a step of manufacturing the semiconductor device according to the second embodiment of the present technique.
Figure 35B:
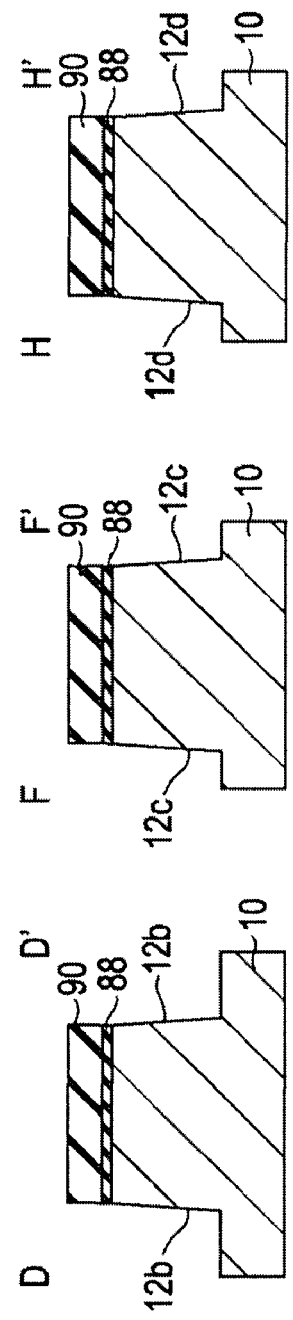

First of all, a description will be given of the semiconductor device and the method of manufacturing the same according to the second embodiment with reference to FIGS. 32A to 34. FIGS. 32A and 32B are cross-sectional views showing the semiconductor device according to the second embodiment. FIGS. 33A to 33C are plan views showing the semiconductor device having a high-voltage transistor, an intermediate-voltage transistor, and a low-voltage transistor. FIG. 33A shows the high-voltage transistor, FIG. 33B shows the intermediate-voltage transistor, and FIG. 33C shows the low-voltage transistor. FIG. 34 is a graph showing the height of a top surface of the device separating area and the height of the top surface of the active region.

The semiconductor device according to the second embodiment includes: a high-voltage transistor 56; and an intermediate-voltage transistor 66 having a withstand voltage lower than that of the high-voltage transistor; and a low-voltage transistor 76 having a withstand voltage lower than that of the intermediate-voltage transistor. However, there is a main feature that the semiconductor device does not have the memory cell 36 with the stack gate structure.

The high-voltage transistor forming region 4 includes the trench 12b for forming the device separating area 14b. On the side wall and the bottom surface of the trench 12b, the silicon oxidation film 13 is formed. In the trench 12b to which the silicon oxidation film 13 is formed, the device separating area 14b for determining the active region 16b is embedded. The cross section of the high-voltage transistor forming region 4 shown in FIG. 32A corresponds to a C-C' cross-section shown in FIG. 33A, and the cross section of the high-voltage transistor forming region 4 shown in FIG. 32B corresponds to a D-D' cross-section shown in FIG. 33A.

On the active region 16b in the high-voltage transistor forming region 4, the gate insulating film 46 with a relatively high thickness is formed. The thickness of the gate insulating film 46 is, e.g., 15 nm.

On the gate insulating film 46, the gate electrode 24b with a relatively long gate length is formed. The gate length of the gate electrode 24b is, e.g., 700 nm.

Within the active region 16b on both sides of the gate electrode 24b, the extension area 50 and a pocket area (not shown) are formed.

On the side wall of the gate electrode 24b, the side-wall insulating film 28 is formed.

Within the active region 16b on both sides of the gate electrode 24b to which the side-wall insulating film 28 is formed, the high-concentration impurity area 52 is formed. The source and the drain region 54 have the extension area 50 and the high-concentration impurity area 52.

On the gate electrode 24b and the source and the drain region 54, the silicide films 34 are formed. The silicide film 34 on the source and the drain region 54 functions as a the source and the drain electrode.

Accordingly, the high-voltage transistor 56 includes the gate electrode 24b and the source and the drain region 54.

The intermediate-voltage transistor forming region 6 includes the trench 12c for forming the device separating area 14c. On the side wall and the bottom surface of the trench 12c, the silicon oxidation film 13 is formed. The device separating area 14c for determining the active region 16c is embedded into the trench 12c to which the silicon oxidation film 13 is formed. The cross section of the intermediate-voltage transistor forming region 6 shown in FIG. 32A corresponds to an E-E' cross-section shown in FIG. 33B, and the cross section of the intermediate-voltage transistor forming region 6 shown in FIG. 32B corresponds to an F-F' cross-section shown in FIG. 33B.

On the active region 16c within the intermediate-voltage transistor forming region 6, the gate insulating film 58 is formed with a thickness lower than that of the gate insulating film 46 of the high-voltage transistor 56. The thickness of the gate insulating film 58 is, e.g., 7 nm.

On the gate insulating film 58, the gate electrode 24c is formed with a gate length shorter than that of the gate electrode 24b of the high-voltage transistor 56. The gate length of the gate electrode 24c is 350 nm.

Within the active region 16c on both sides of the gate electrode 24c, the extension area 60 and a pocket area (not shown) are formed.

On the side wall of the gate electrode 24c, the side-wall insulating film 28 is formed.

Within the active region 16c on both sides of the gate electrode 24c to which the side-wall insulating film 28 is formed, the high-concentration impurity area 62 is formed. The source and the drain region 64 have the extension area 60 and the high-concentration impurity area 62.

On the gate electrode 24c and the source and the drain region 64, the silicide films 34 are formed. The silicide film 34 on the source and the drain region 64 functions a source and a drain electrode.

Accordingly, the intermediate-voltage transistor 66 includes the gate electrode 24c and the source and the drain region 64.

To the low-voltage transistor forming region 8, the trench 12d for forming the device separating area 14d is formed. On the side wall and the bottom surface of the trench 12d, the silicon oxidation film 13 is formed. In the trench 12d to which the silicon oxidation film 13 is formed, the device separating area 14d for determining the active region 16d is embedded. The cross section of the low-voltage transistor forming region 8 shown in FIG. 32A corresponds to a G-G' cross-section shown in FIG. 33C, and the cross section of the low-voltage transistor forming region 8 shown in FIG. 32B corresponds to an H-H' cross-section shown in FIG. 33C.

On the active region 16d in the low-voltage transistor forming region 8, the gate insulating film 68 is formed with a thickness thinner than that of the gate insulating film 58 of the intermediate-voltage transistor 66. The thickness of the gate insulating film 68 is, e.g. 1.5 nm.

On the gate insulating film 68, the gate electrode 24d is formed with a gate length shorter than that of the gate electrode 24c of the intermediate-voltage transistor 66. The gate length of the gate electrode 24d is 60 nm.

Within the active region 16d on both sides of the gate electrode 24d, the extension area 70 and a pocket area (not shown) are formed.

On the side wall of the gate electrode 24d, the side-wall insulating film 28 is formed.

Within the active region 16d on both sides of the gate electrode 24d to which the side-wall insulating film 28 is formed, the high-concentration impurity area 72 is formed. The source and the drain region 74 include the extension area 70 and the high-concentration impurity area 72.

On the gate electrode 24d and the source and the drain region 74, the silicide films 34 are individually formed. The silicide film 34 on the source and the drain region 74 functions as a source and drain electrode.

Accordingly, the low-voltage transistor 76 includes the gate electrode 24d and the source and the drain region 74.

FIG. 34 is a graph showing the height of the top surface of the device separating area relative to the top surface of the active region.

Referring to FIG. 34, according to the second embodiment, the height of the top surface of the device separating area 14b in the high-voltage transistor forming region 4 is substantially equal to the height of the top surface of the active region 16b of the high-voltage transistor forming region 4.

Further, according to the second embodiment, the height of the top surface of the device separating area 14c of the intermediate-voltage transistor forming region 6 is lower, by 6 nm, than the height of the top surface of the active region 16c of the intermediate-voltage transistor forming region 6.

Furthermore, according to the second embodiment, the height of the top surface of the device separating area 14d of the low-voltage transistor forming region 8 is substantially equal to the height of the top surface of the active region 16d of the low-voltage transistor forming region 8. That is, according to the second embodiment, the height of the top surface of the device separating area 14d of the low-voltage transistor forming region 8 is higher than the height of the top surface of the device separating area 14c of the intermediate-voltage transistor forming region 6.

Upon forming the high-voltage transistor, the intermediate-voltage transistor, and the low-voltage transistor with a general method, the height of the top surface of the device separating area in the intermediate-voltage transistor forming region is lower than the height of the top surface of the device separating area in the high-voltage transistor forming region, and the height of the top surface of the device separating area in the low-voltage transistor forming region is lower than the height of the top surface of the device separating area in the intermediate-voltage transistor forming region. Therefore, the height of the top surface of the device separating area in the low-voltage transistor forming region is extremely lower than the height of the top surface of the active region. Thus, upon forming the high-voltage transistor, the intermediate-voltage transistor, and the low-voltage transistor with the general method, the pattern of the photoresist film for patterning the gate electrode of the low-voltage transistor is strongly pulled in the longitudinal direction, and the pattern of the photoresist film for patterning the gate electrode of the low-voltage transistor is extremely thin. Accordingly, upon forming the high-voltage transistor, the intermediate-voltage transistor, and the low-voltage transistor with the general method, it is not possible to form the low-voltage transistor having the gate electrode with a desired gate length, and the semiconductor device having preferable electrical characteristics cannot be provided.

On the other hand, according to the second embodiment, the height of the top surface of the device separating area 14d in the low-voltage transistor forming region 8 is not extremely lower than the height of the top surface of the active region 16d of the low-voltage transistor forming region 8. As a consequence, the pattern 102c (refer to FIGS. 51A and 51B) of the photoresist film for patterning the gate electrode 24d of the low-voltage transistor 76 is not strongly pulled in the longitudinal direction, and it is thus possible to prevent, from becoming extremely thin, the pattern 102c of the photoresist film for patterning the gate electrode 24d of the low-voltage transistor 76. Therefore, according to the second embodiment, the low-voltage transistor 76 having the gate electrode 24d with a desired gate length can be formed and the semiconductor device having preferable electrical characteristics can be provided.

On the semiconductor substrate 10 having the high-voltage transistor 56, the intermediate-voltage transistor 66, and the low-voltage transistor 76, the inter-layer insulating film 78 are formed.

The inter-layer insulating film 78 has the contact hole 80 reaching the source and the drain electrode 34. The contact plug 82 is embedded in the contact hole 80.

On the inter-layer insulating film 78 in which the contact plug 82 is embedded, the inter-layer insulating film 84 is formed.

To the inter-layer insulating film 84, the trench 85 for embedding the wiring 86 is formed.

The wiring 86 is embedded in the trench 85 formed to the inter-layer insulating film 84. The wiring 86 is electrically connected to the source and the drain electrode 34 via the contact plug 82.

As mentioned above, according to the second embodiment, the height of the top surface of the device separating area 14d in the low-voltage transistor forming region 8 is substantially equal to the height of the top surface of the active region 16d of the low-voltage transistor forming region 8. That is, according to the second embodiment, since the height of the top surface of the device separating area 14d in the low-voltage transistor forming region 8 is not extremely lower than the height of the top surface of the active region 16d in the low-voltage transistor forming region 8, it is possible to prevent, from being strongly pulled in the longitudinal direction, the pattern 102c (refer to FIGS. 51A and 51B) of the photoresist film for patterning the gate electrode 24d of the low-voltage transistor 76. Further, it is possible to prevent, from being excessively thin, the photoresist film for patterning the gate electrode 24d of the low-voltage transistor 76. Therefore, according to the second embodiment, the low-voltage transistor 76 having the gate electrode 24d with a desired gate length can be formed and the semiconductor device having preferable electrical characteristics can be also provided.

As mentioned above, the semiconductor device according to the second embodiment can be structured.

Next, a description will be given of a method of manufacturing the semiconductor device according to the second embodiment with reference to FIGS. 35A to 56B. FIGS. 35A to 56B are cross-sectional views of the step of manufacturing the semiconductor device according to the second embodiment.

First of all, with the thermal oxidation method, the silicon oxidation film 88 with a thickness of 10 nm is formed on the semiconductor substrate 10. As the semiconductor substrate 10, e.g., a silicon substrate is used.

Subsequently, with the CVD method to the whole substrate, the silicon nitride film 90 with a thickness of 50 nm is formed.

Subsequently, with the spin coat method to the whole substrate, a photoresist film (not shown) is coated. When the minimal width of the active regions 16a to 16d is 50 nm, the thickness of photoresist film is 100 nm.

Subsequently, with the photolithography technology, the photoresist film is patterned.

Subsequently, by using the photoresist film as the mask, the silicon nitride film 90 is subjected to anisotropic etching. In this case, the photoresist film on the silicon nitride film 90 is substantially removed by etching. Thereafter, the photoresist film remaining on the silicon nitride film 90 is removed.

Subsequently, by using the silicon nitride film 90 as the mask, the semiconductor substrate 10 is etched. Thus, the trenches 12b to 12d with a depth of 150 nm are respectively formed in the memory cell forming region 2, the high-voltage transistor forming region 4, the intermediate-voltage transistor forming region 6, and the low-voltage transistor forming region 8 (refer to FIGS. 35A and 35B). Upon etching the semiconductor substrate 10 by using the silicon nitride film 90 as the mask, the top of the silicon nitride film 90 is slightly etched and the thickness of the silicon nitride film 90 is thus 40 nm.

Subsequently, with the thermal oxidation method, the side wall and the bottom surface of the trenches 12a to 12d are oxidized. Thus, the silicon oxidation film 13 with a thickness of 2 nm is formed to the bottom surfaces and the side walls of the trenches 12b to 12d.

Figure 36A:
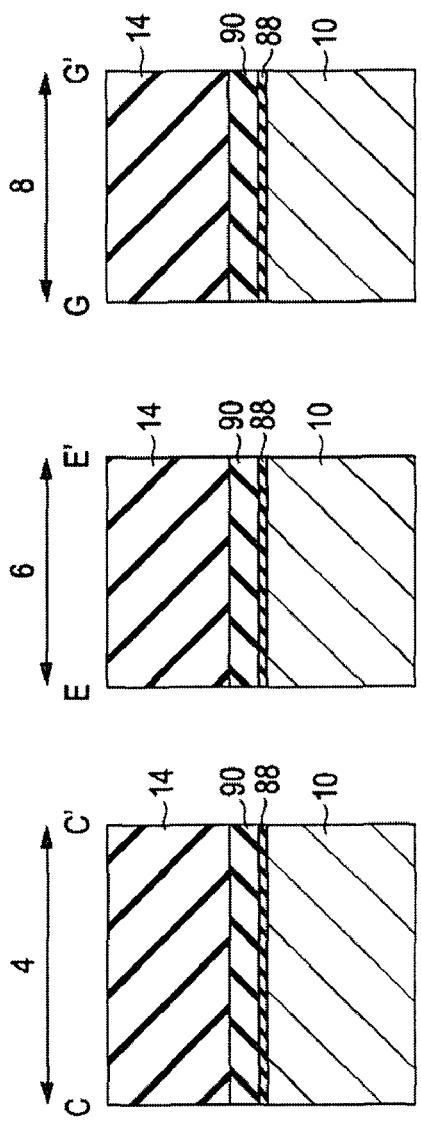
FIGS. 36A and 36B are cross-sectional views showing the step of manufacturing the semiconductor device according to the second embodiment of the present technique.
Figure 36B:
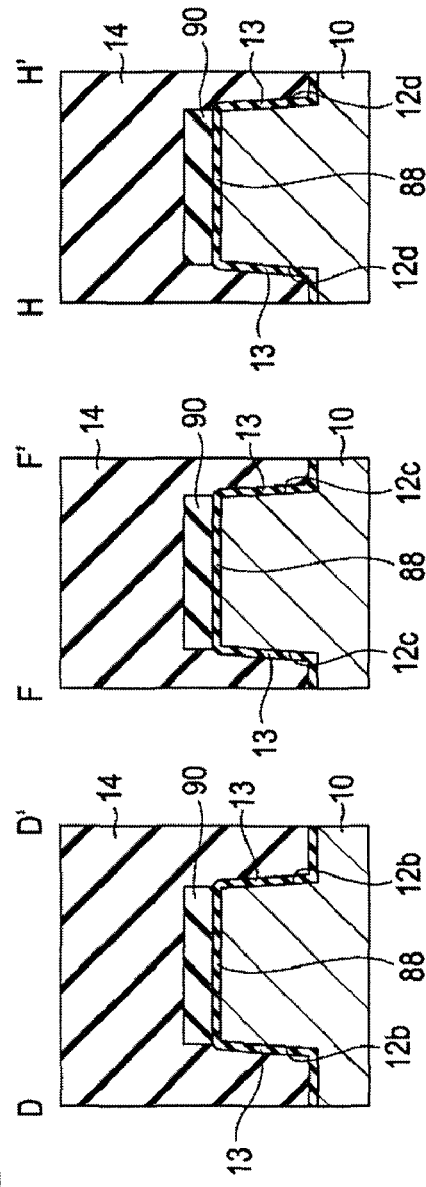

Subsequently, with a high-density plasma CVD method to the whole substrate, the silicon oxidation film 14 is with a thickness of 200 nm (refer to FIGS. 36A and 36B).

Figure 37A:
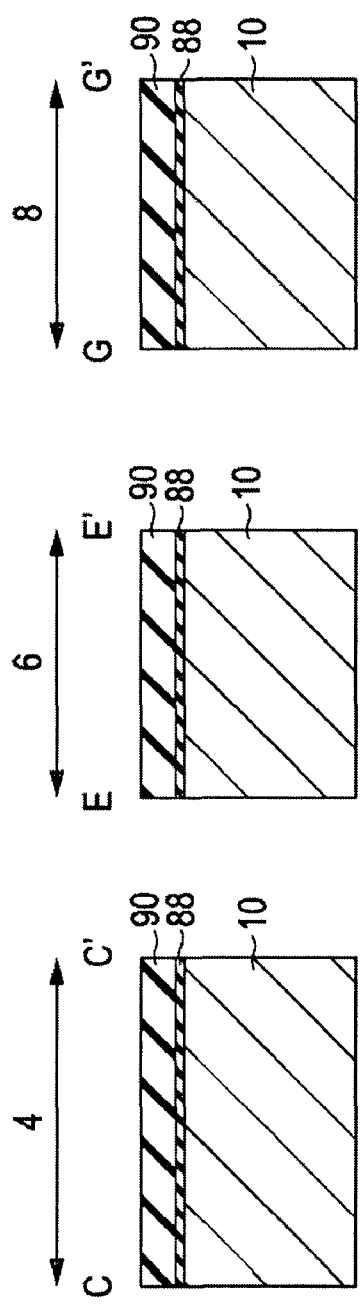
FIGS. 37A and 37B are cross-sectional views showing the step of manufacturing the semiconductor device according to the second embodiment of the present technique.
Figure 37B:
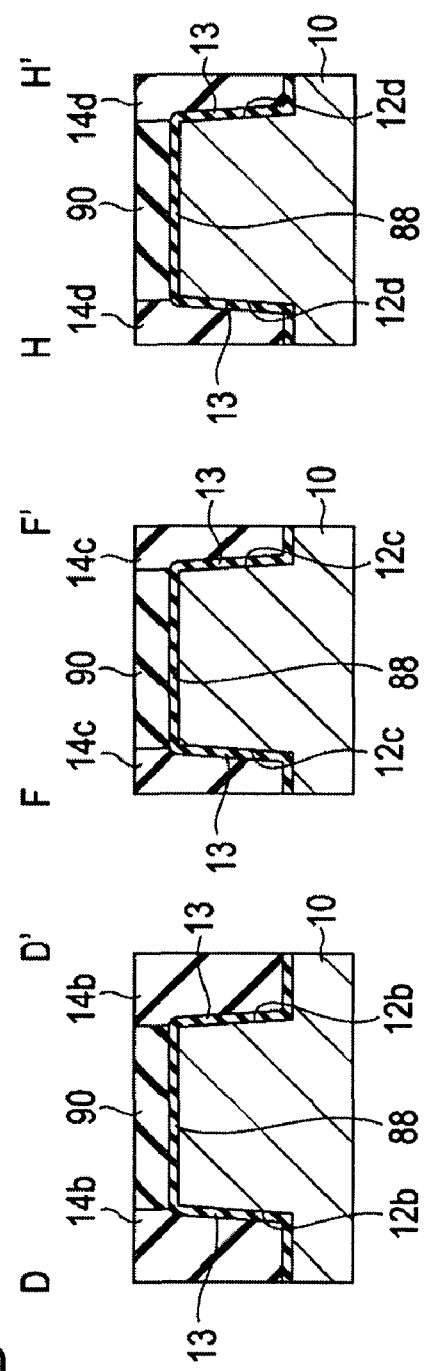

Subsequently, referring to FIGS. 37A and 37B, with the CMP method, the silicon oxidation film 14 is polished until exposing the surface of the silicon nitride film 90. In this case, since the surface of the silicon nitride film 90 is slightly polished, the thickness of the silicon nitride film 90 is 20 nm. The silicon nitride film 90 is formed on the silicon oxidation film 88 with a thickness of 10 nm formed on the semiconductor substrate 10, and the height of the top surface of the silicon nitride film 90 is therefore 30 nm from the surface of the semiconductor substrate 10. The heights of the top surfaces of the device separating areas 14b to 14d containing the silicon oxidation films embedded to trenches 14b to 14d are equal to the height of the top surface of the silicon nitride film 90. The top surfaces of the device separating areas 14b to 14d are higher, by 30 nm, than the surface of the semiconductor substrate 10.

Subsequently, with hydrofluoric acid, the device separating areas 14b to 14d are etched with a thickness of 6 nm. After etching the device separating areas 14b to 14d with the thickness of 6 nm, the top surfaces of the device separating areas 14b to 14d are higher, by 24 nm, than the surface of the semiconductor substrate 10. The device separating areas 14b to 14d are etched with the thick of 6 nm because the height of the top surface of the device separating area 14d of the low-voltage transistor forming region 8 is finally set to be substantially equal to the height of the top surface of the active region 16d.

Figure 38A:
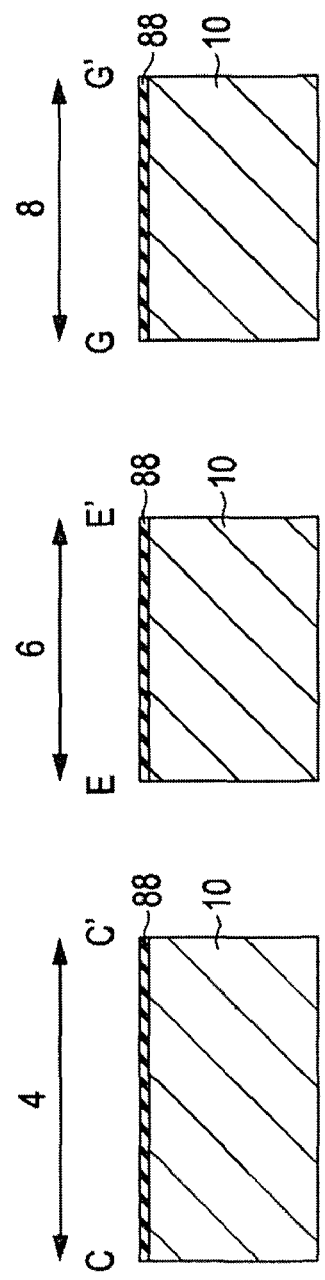
FIGS. 38A and 38B are cross-sectional views showing the step of manufacturing the semiconductor device according to the second embodiment of the present technique.
Figure 38B:
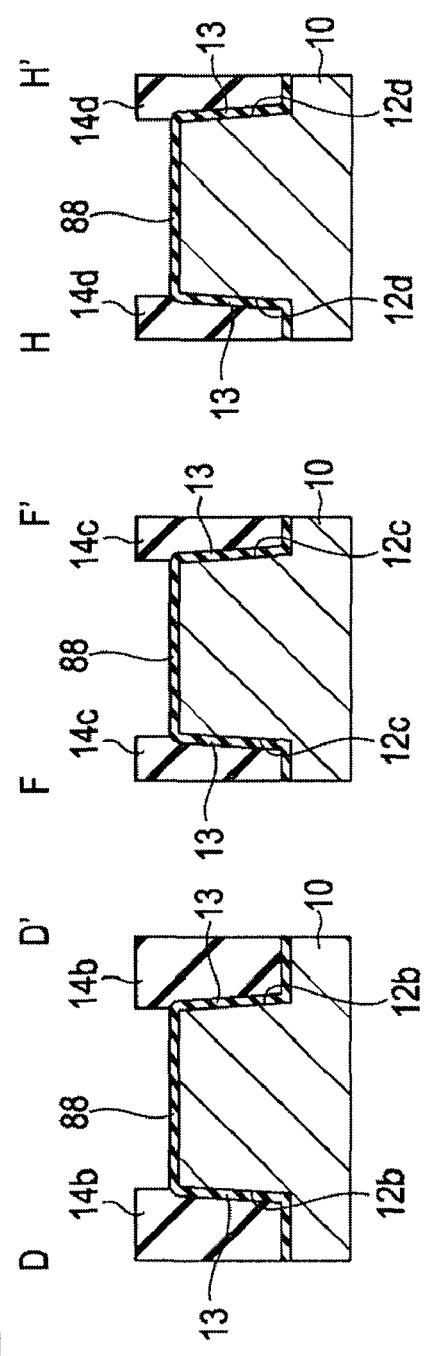

Subsequently, with heated phosphoric acid, the silicon nitride film 90 is removed by etching (refer to FIGS. 38A and 38B). The etching the silicon nitride film 90 with the phosphoric acid sufficiently ensures an etching selection ratio of the silicon nitride film 90 to the silicon oxidation film 88, and almost the silicon oxidation film 88 on the active regions 16b to 16d thus remains without etching. Therefore, the silicon oxidation films 88 remains with a thickness of 10 nm on the active regions 16b to 16d.

Figure 39A:
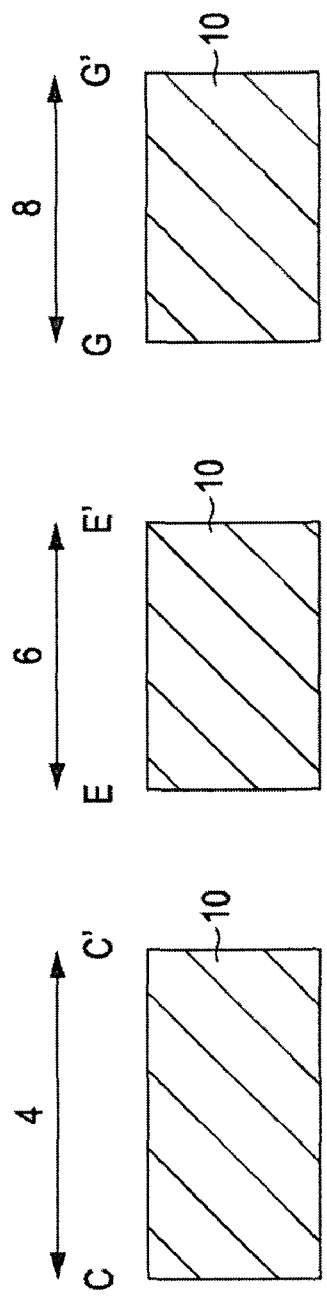
FIGS. 39A and 39B are cross-sectional views showing the step of manufacturing the semiconductor device according to the second embodiment of the present technique.
Figure 39B:
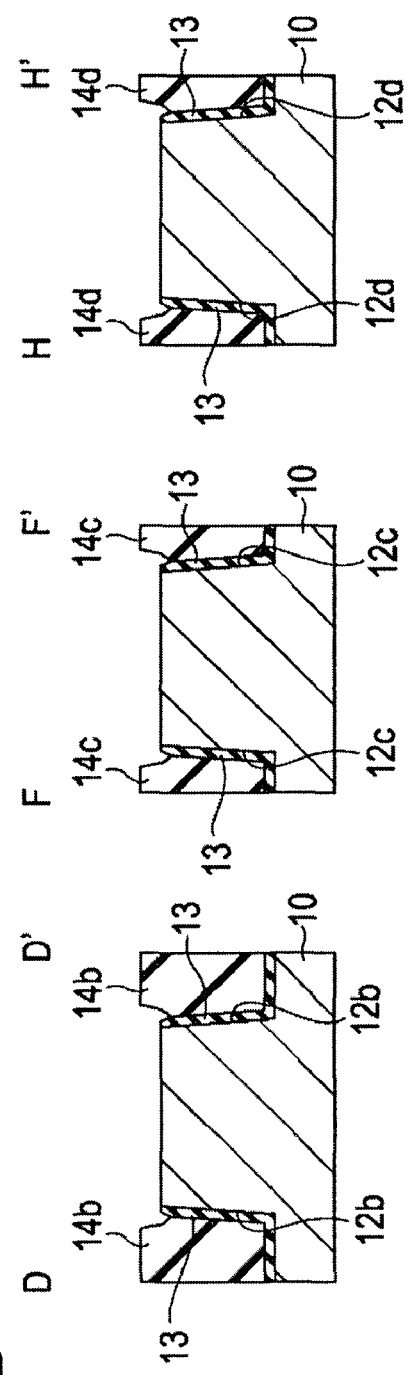

Subsequently, referring to FIGS. 39A and 39B, with hydrofluoric acid, the silicon oxidation films 88 on the active regions 16b to 16d are removed by etching. The silicon oxidation film 88 with the thickness of 10 nm is etched for a time period necessary for etching the silicon oxidation film with a thickness of 12 nm as that of 1.2 multiples of the silicon oxidation film 88. Therefore, the silicon oxidation film forming the device separating areas 14b to 14d is etched with the thickness of 12 nm. Therefore, after etching the silicon oxidation film 88, the top surfaces of the device separating areas 14b to 14d are higher, by 12 nm, than the top surfaces of the active regions 16b to 16d.

Figure 40A:
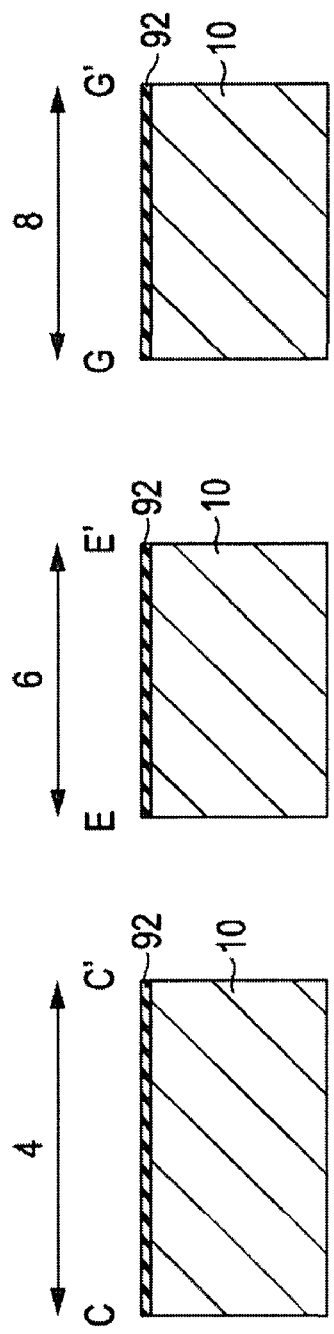
FIGS. 40A and 40B are cross-sectional views showing the step of manufacturing the semiconductor device according to the second embodiment of the present technique.
Figure 40B:
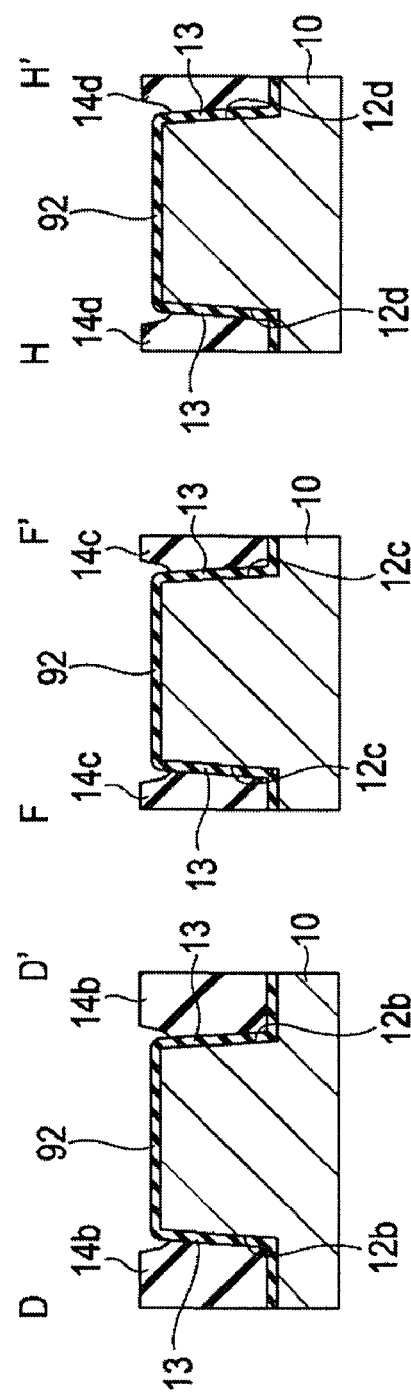

Subsequently, referring to FIGS. 40A and 40B, with the thermal oxidation method to the whole substrate, the sacrificial oxidation film 92 containing a silicon oxidation film with a thickness of 10 nm is formed.

Figure 41A:
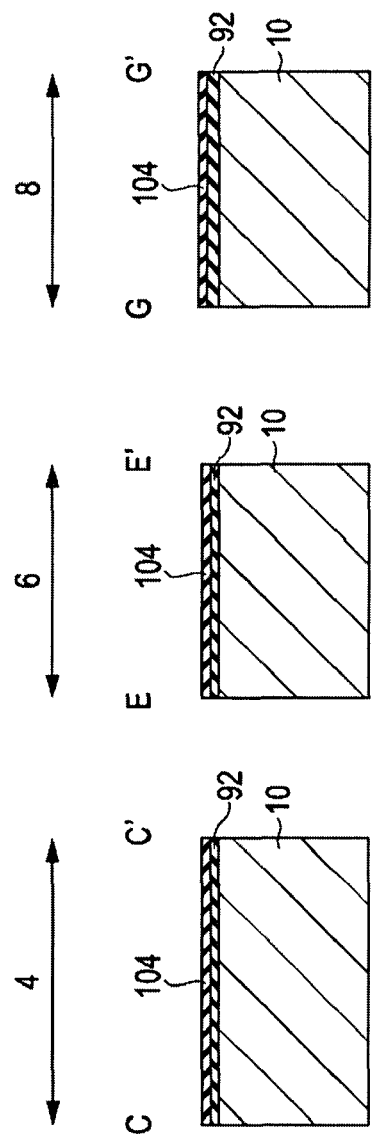
FIGS. 41A and 41B are cross-sectional views showing the step of manufacturing the semiconductor device according to the second embodiment of the present technique.
Figure 41B:
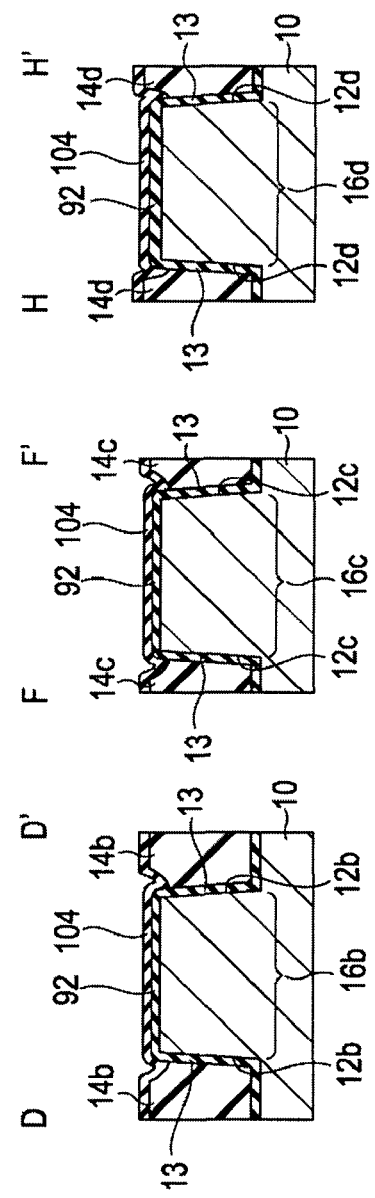

Subsequently, referring to FIGS. 41A and 41B, with the CVD method to the whole substrate, a silicon nitride film 104 with a thickness of 3 to 7 nm is formed. Herein, the thickness of the silicon nitride film 104 is, e.g., 5 nm.

Subsequently, with the ion-implantation method, dopant impurities are guided to the high-voltage transistor forming region 4, the intermediate-voltage transistor forming region 6, and the low-voltage transistor forming region 8, thereby properly forming a predetermined conductive well (not shown).

Further, with the ion-implantation method, dopant impurities are guided to the high-voltage transistor forming region 4, the intermediate-voltage transistor forming region 6, and the low-voltage transistor forming region 8, thereby properly forming a threshold-voltage control layer (not shown).

Herein, although the well and the threshold-voltage control layer are formed after forming the silicon nitride film 104, the well and the threshold-voltage control layer may be formed after forming the sacrificial oxidation film 92, before forming the silicon nitride film 104.

Subsequently, with the spin coat method to the whole substrate, a photoresist film 106 is formed.

Subsequently, with the photolithography technology, the photoresist film 106 is patterned. Thus, the photoresist film 106 for covering the low-voltage transistor forming region 8 is formed.

Figure 42A:
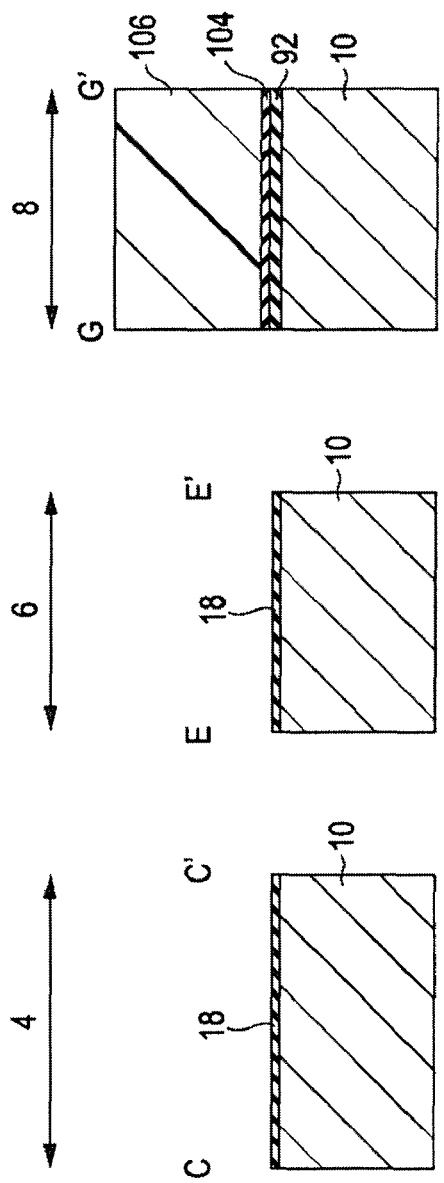
FIGS. 42A and 42B are cross-sectional views showing the step of manufacturing the semiconductor device according to the second embodiment of the present technique.
Figure 42B:
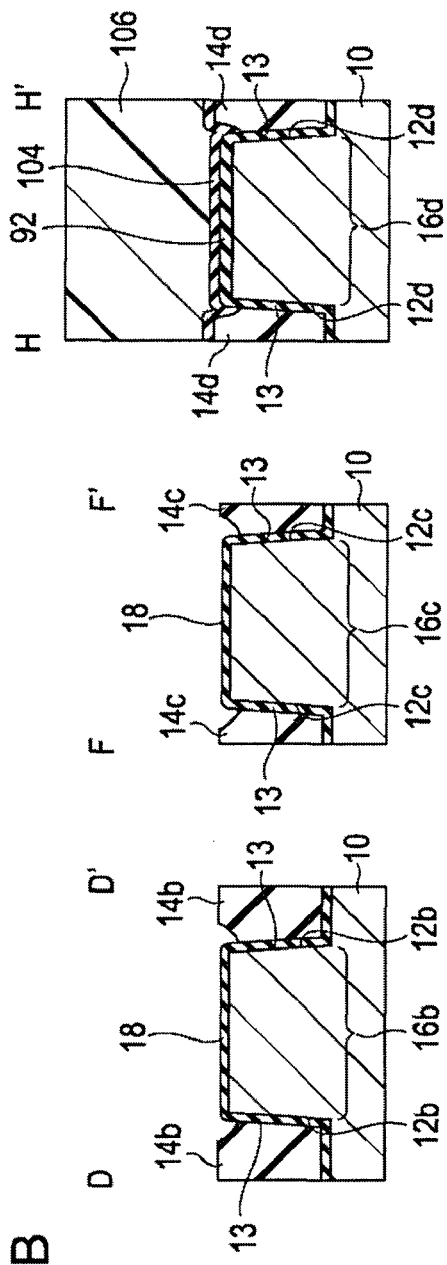

Subsequently, by using the photoresist film 106 as the mask, the silicon nitride films 104 in the high-voltage transistor forming region 4 and the intermediate-voltage transistor forming region 6 are removed by etching (refer to FIGS. 42A and 42B).

Figure 43A:
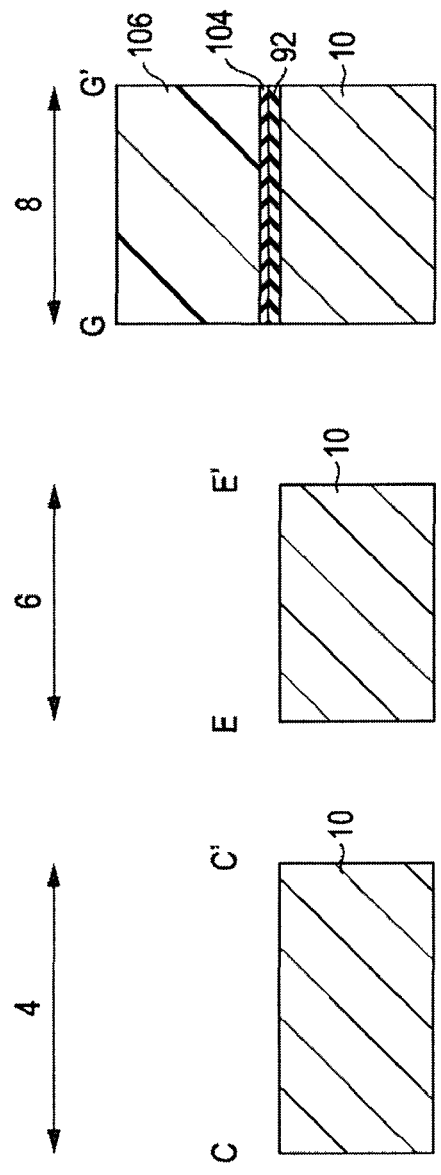
FIGS. 43A and 43B are cross-sectional views showing the step of manufacturing the semiconductor device according to the second embodiment of the present technique.
Figure 43B:
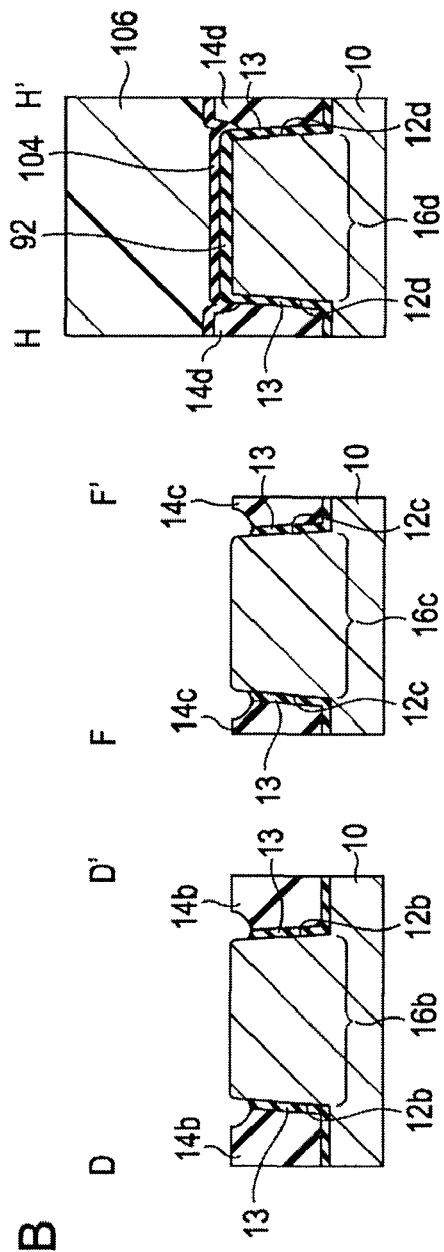

Subsequently, by using the photoresist film 106 as the mask, the sacrificial oxidation films 92 in the high-voltage transistor forming region 4 and the intermediate-voltage transistor forming region 6 are removed by etching (refer to FIGS. 43A and 43B). As etching solution, e.g., hydrofluoric acid is used. The sacrificial oxidation film 92 with a thickness of 10 nm is etched for a time period necessary for etching the silicon oxidation film with a thickness of 12 nm as that of 1.2 multiples of the sacrificial oxidation film 92. Therefore, after etching the sacrificial oxidation film 92, the height of the top surface of the device separating area 14*b* in the high-voltage transistor forming region 4 and the height of the top surface of the device separating area 14*c* in the intermediate-voltage transistor forming region 6 are substantially equal to the height of the top surface of the active regions 16*b* and 16*c*. Since the device separating area 16*d* in the low-voltage transistor forming region 8 is covered with the photoresist film 106, it is not etched. The top surface of the device separating area 14*d* in the low-voltage transistor forming region 8 maintains to be higher, by 12 nm, than the top surface of the active region 16*d*. Thereafter, the photoresist film 106 is peeled.

Herein, the description is given of the case of removing, by etching, the sacrificial oxidation film 92 in the intermediate-voltage transistor forming region 6. However, the sacrificial oxidation film 92 in the intermediate-voltage transistor forming region 6 may not be removed by the etching. The etching using the photoresist film for covering the intermediate-voltage transistor forming region 6 and the low-voltage transistor forming region 8 enables the etching of the sacrificial oxidation film 92 in the intermediate-voltage transistor forming region 6 to be prevented.

Subsequently, referring to FIGS. 44A and 44B, the gate insulating film 46 is formed with a thickness of 15 nm on the active region 16*b* of the high-voltage transistor forming region 4. In this case, the gate insulating film 46 is also formed with a thickness of 15 nm on the active region 16*c* of the intermediate-voltage transistor forming region 6. The silicon nitride film 104 has the oxidation resistance. Therefore, in a region covered by the silicon nitride film 104, i.e., the low-voltage transistor forming region 8, the silicon oxidation film is not grown.

Subsequently, with the spin coat method to the whole substrate, a photoresist film 108 is formed.

Subsequently, with the photolithography technology, the photoresist film 108 is patterned. Thus, the photoresist film 108 for exposing the intermediate-voltage transistor forming region 6 is formed.

Figure 45A:
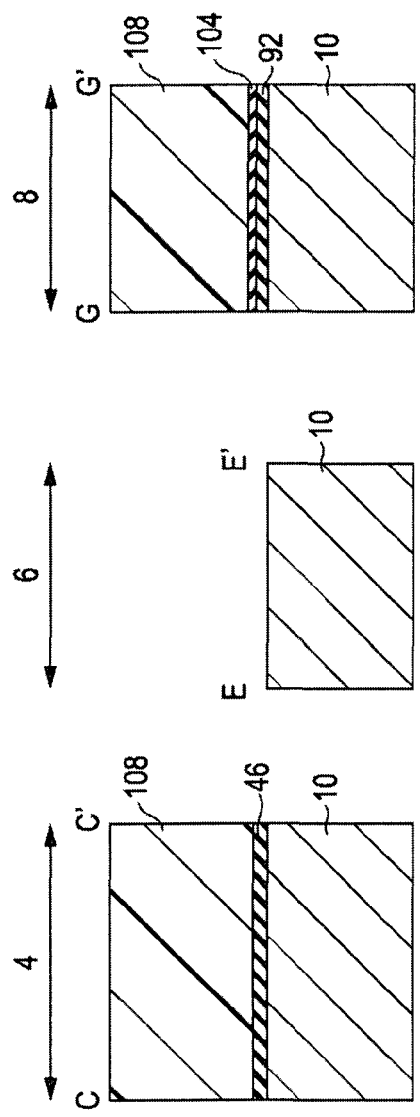
FIGS. 45A and 45B are cross-sectional views showing the step of manufacturing the semiconductor device according to the second embodiment of the present technique.
Figure 45B:
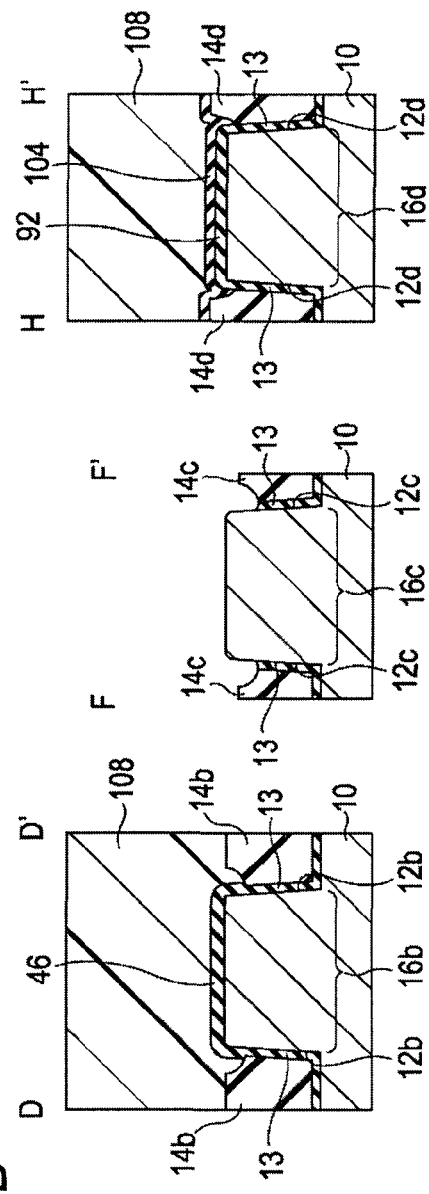

Subsequently, by using the photoresist film 108 as the mask, the gate insulating film 46 on the active region 16*c* of the intermediate-voltage transistor forming region 6 is removed by etching (refer to FIGS. 45A and 45B). As etching solution, e.g., hydrofluoric acid is used. The gate insulating film 46 with a thickness of 15 nm is etched for a time period necessary for etching the silicon oxidation film with a thickness of 18 nm, as that of 1.2 multiples of the gate insulating film 46. Therefore, after etching the gate insulating film 46, the top surface of the device separating area 14*c* of the intermediate-voltage transistor forming region 6 is lower, by 6 nm, than the top surface of the active region 16*c*. On the other hand, the height of the top surface of the device separating area 14*b* of the high-voltage transistor forming region 4 maintains to be substantially equal to the height of the top surface of the active region 16*b*. Further, the height of the top surface of the device separating area 14*d* of the low-voltage transistor forming region 8 also maintains to be substantially equal to the height of the top surface of the active region 16*d*. Thereafter, the photoresist film 108 is peeled.

Figure 46A:
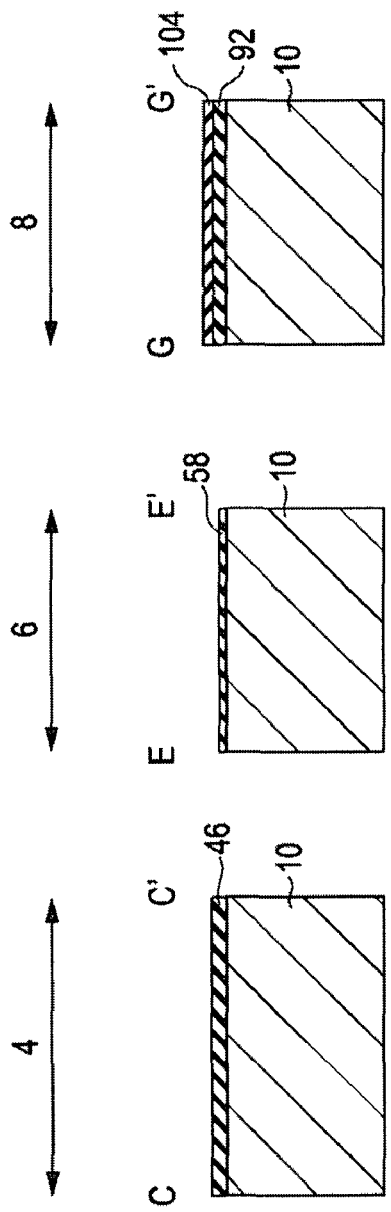
FIGS. 46A and 46B are cross-sectional views showing the step of manufacturing the semiconductor device according to the second embodiment of the present technique.
Figure 46B:
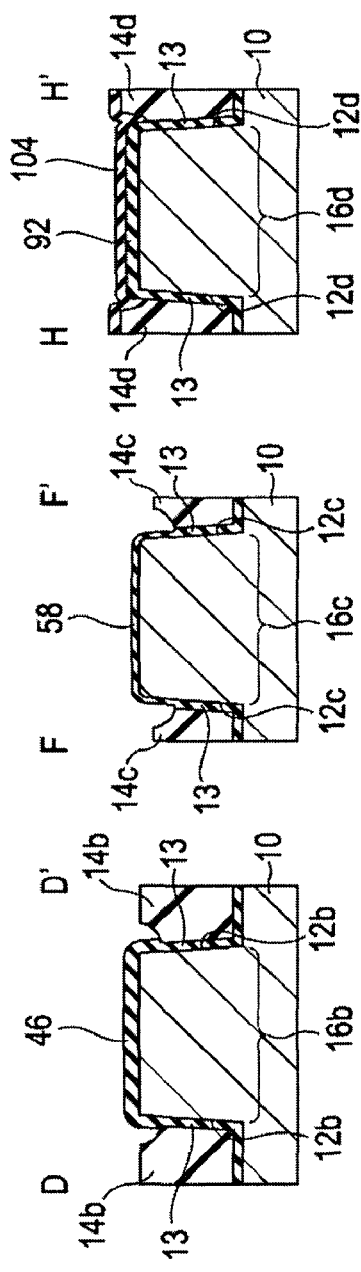

Subsequently, referring to FIGS. 46A and 46B, with the thermal oxidation method, the gate insulating film 58 is formed with a thickness of 7 nm on the active region 16*c* of the intermediate-voltage transistor forming region 6. As mentioned above, the silicon nitride film 104 has the oxidation resistance. Therefore, in a region covered by the silicon nitride film 104, i.e., the low-voltage transistor forming region 8, the silicon oxidation film is not grown.

Subsequently, with the spin coat method to the whole substrate, a photoresist film 110 is formed.

Subsequently, with the photolithography technology, the photoresist film 110 is patterned. Thus, the photoresist film 110 for exposing the low-voltage transistor forming region 8 is formed.

Figure 47A:
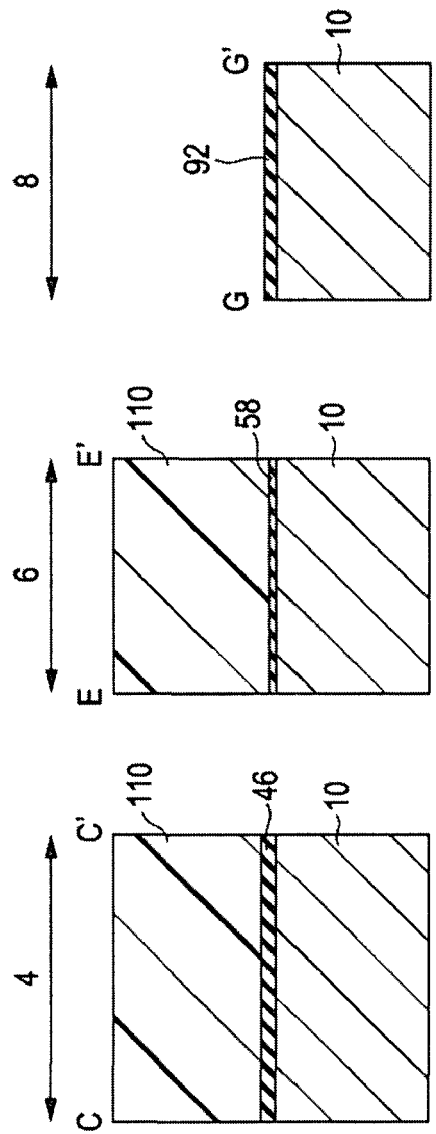
FIGS. 47A and 47B are cross-sectional views showing the step of manufacturing the semiconductor device according to the second embodiment of the present technique.
Figure 47B:
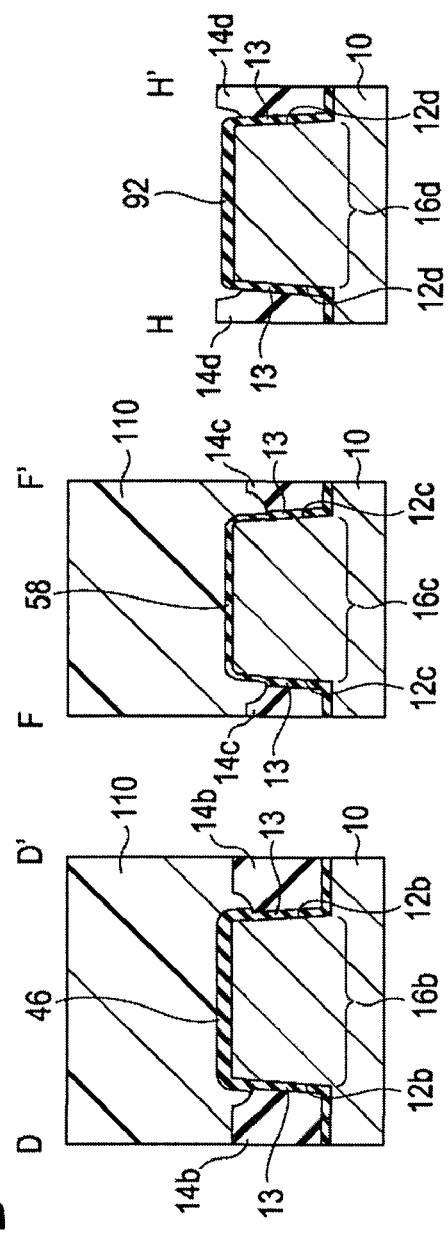

Subsequently, by using the photoresist film 110 as the mask, the silicon nitride film 104 on the active region 16*d* of the low-voltage transistor forming region 8 is removed by etching (refer to FIGS. 47A and 47B). The etching of the silicon nitride film 104 is used, e.g., dry etching.

Figure 48A:
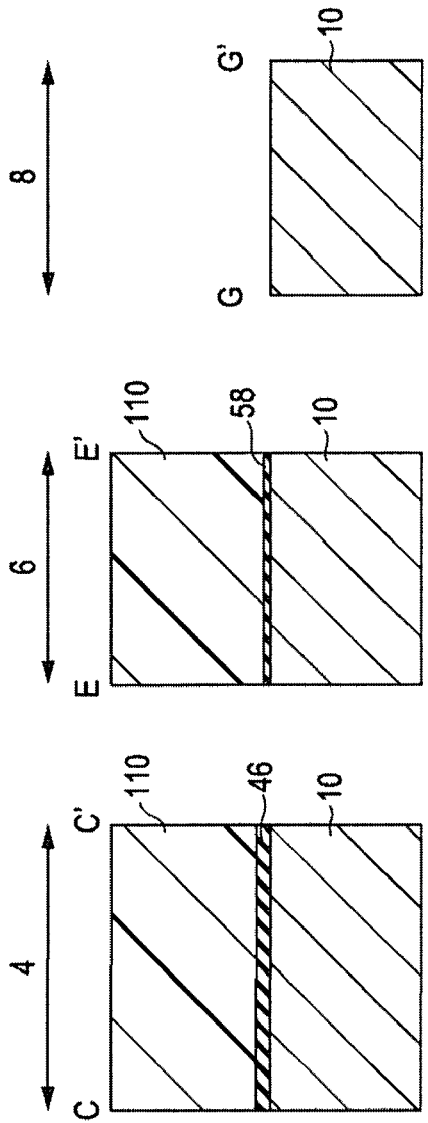
FIGS. 48A and 48B are cross-sectional views showing the step of manufacturing the semiconductor device according to the second embodiment of the present technique.
Figure 48B:
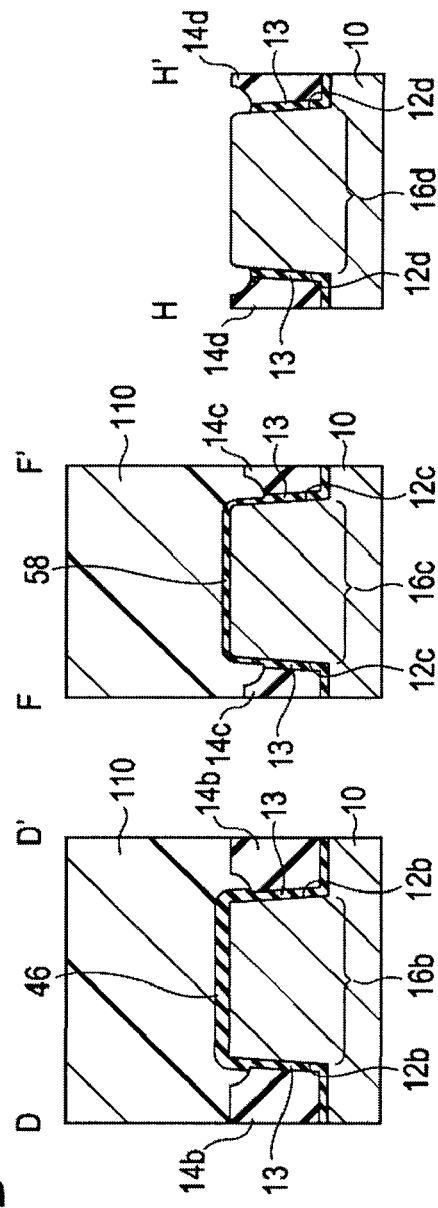

Subsequently, referring to FIGS. 48A and 48B, by using the photoresist film 110 as the mask, the silicon oxidation film 92 on the active region 16*d* of the low-voltage transistor forming region 8 is removed by etching. As etching solution, e.g., hydrofluoric acid is used. The silicon oxidation film 92 is etched for a time period necessary for etching a silicon oxidation film with a thickness of 12 nm as that of 1.2 multiples of the silicon oxidation film 92. Therefore, after etching the gate insulating film 92, the height of the top surface of the device separating area 14*d* of the low-voltage transistor forming region 8 is substantially equal to the height of the top surface of the active region 16*d*. On the other hand, the height of the top surface of the device separating area 14*b* in the high-voltage transistor forming region 4 maintains to be substantially equal to the height of the top surface of the active region 16*b*. Further, the top surface of the device separating area 14*c* of the intermediate-voltage transistor forming region 6 maintains to be lower, by 6 nm, than the top surface of the active region 16*c*. Thereafter, the photoresist film 110 is peeled.

Subsequently, referring to FIGS. 49A and 49B, with the thermal oxidation method, the gate insulating film 68 is formed with a thickness of 1.5 nm on the active region 16*d* of the low-voltage transistor forming region 8.

Figure 50A:
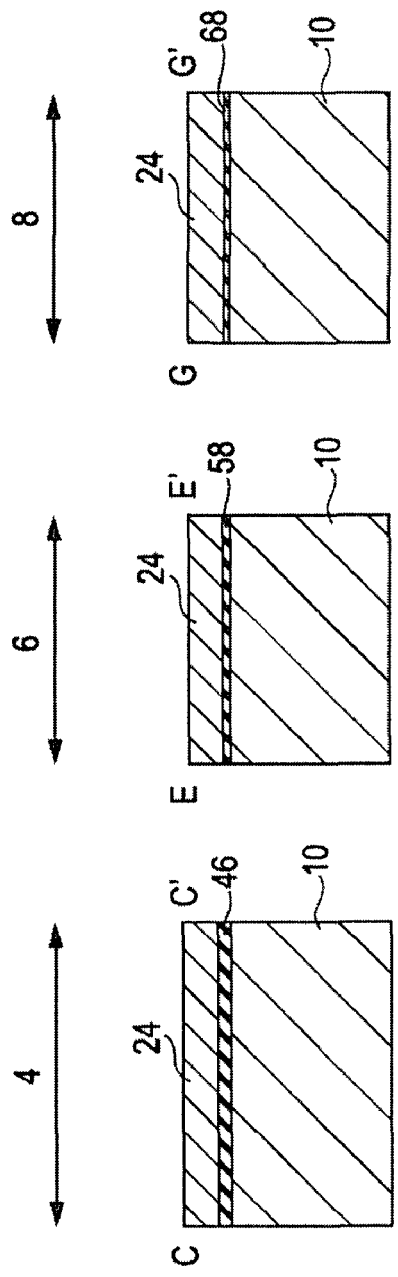
FIGS. 50A and 50B are cross-sectional views showing the step of manufacturing the semiconductor device according to the second embodiment of the present technique.
Figure 50B:
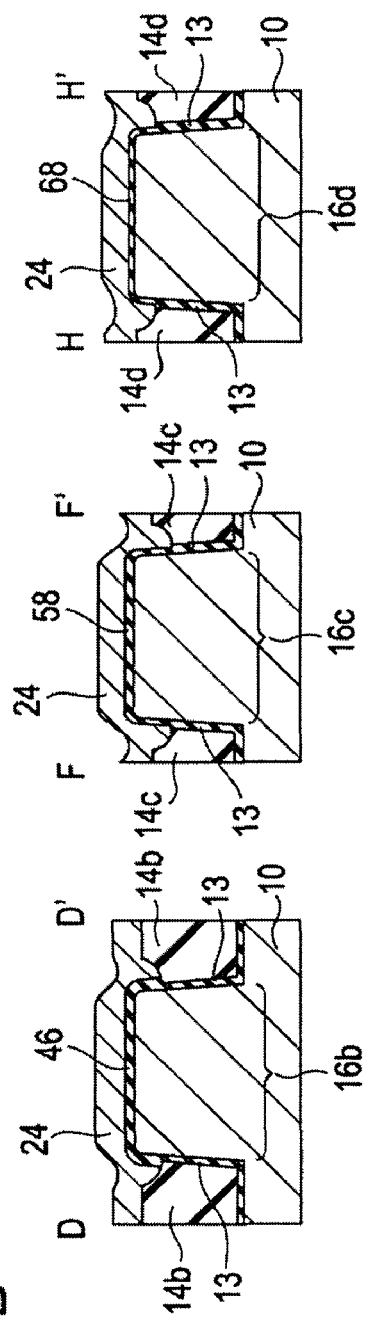
Figure 51A:
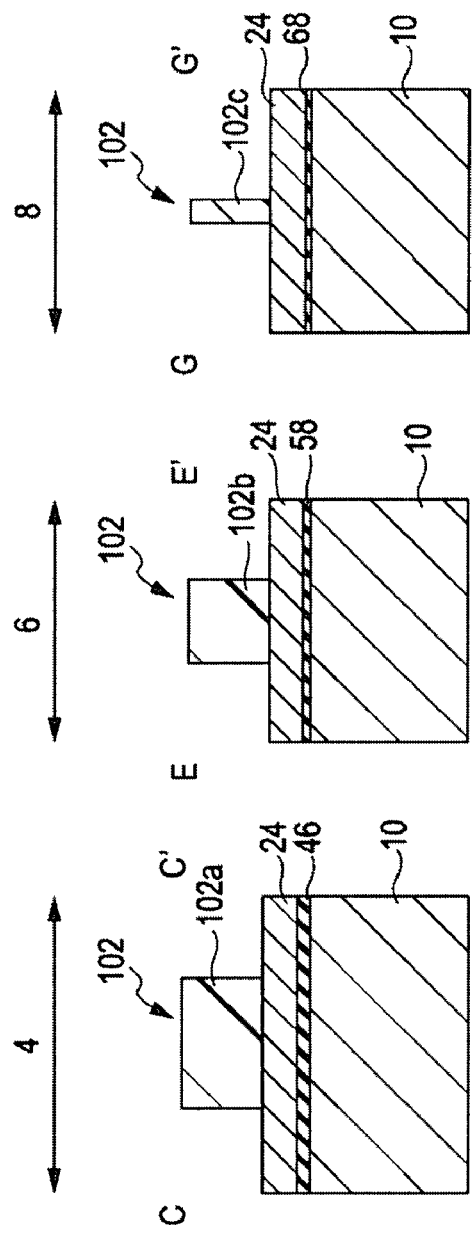
FIGS. 51A and 51B are cross-sectional views showing the step of manufacturing the semiconductor device according to the second embodiment of the present technique.
Figure 51B:
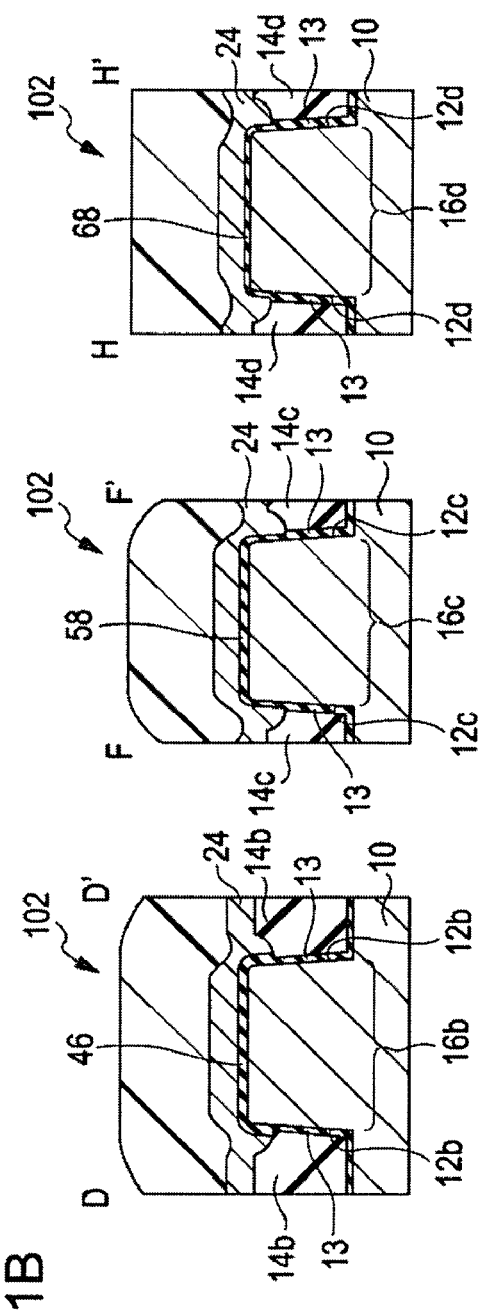
Figure 52A:
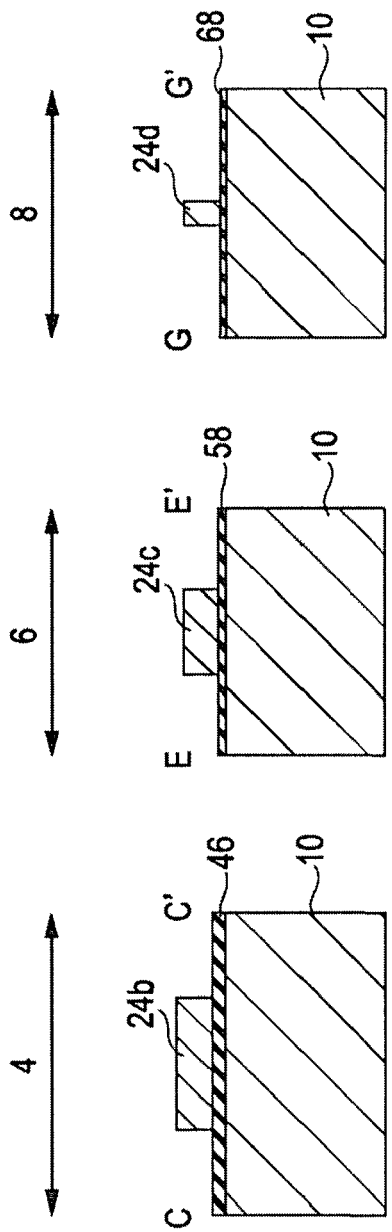
FIGS. 52A and 52B are cross-sectional views showing the step of manufacturing the semiconductor device according to the second embodiment of the present technique.
Figure 52B:
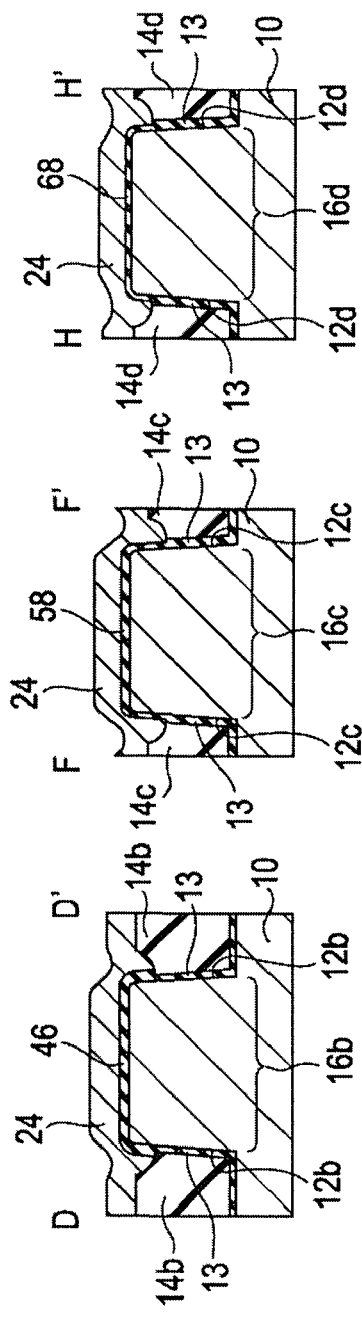

Subsequently, referring to FIGS. 50A and 50B, with the CVD method, the polysilicon film 24 is formed with a thickness of 100 nm.

Subsequently, with the spin coat method to the whole substrate, a photoresist film 102 is formed.

Subsequently, with the photolithography technology, the photoresist film 102 is patterned. Thus, the pattern 102*a* of the photoresist film for patterning the gate electrode 24*b* of the high-voltage transistor 56, the pattern 102*b* of the photoresist film for patterning the gate electrode 24*c* of the intermediate-voltage transistor 66, and the pattern 102*c* of the photoresist film for patterning the gate electrode 24*d* of the low-voltage transistor 76 are formed (refer to FIGS. 51A and 51B).

Referring to FIGS. 34A and 34B, in the high-voltage transistor forming region 4, the height of the top surface of the device separating area 14*b* is substantially equal to the height of the top surface of the active region 16*b*. Further, in the intermediate-voltage transistor forming region 6, the height of the top surface of the device separating area 14*c* is lower, by 6 nm, than the top surface of the active region 16*c*. Furthermore, in the low-voltage transistor forming region 8, the height of the top surface of the device separating area 14*d* is substantially equal to the height of the top surface of the active region 16*d*.

In the low-voltage transistor forming region 8, since the height of the top surface of the device separating area 14*d* is substantially equal to the height of the top surface of the active region 16*d*, it is possible to prevent, from being strongly pulled in the longitudinal direction, the pattern 102*c* of the photoresist film for patterning the gate electrode 24*d* of the low-voltage transistor 76. Therefore, according to the second embodiment, it is possible to prevent, from being excessively thin, the pattern 102c of the photoresist film for patterning the gate electrode 24d of the low-voltage transistor 76. Accordingly, according to the second embodiment, the low-voltage transistor 76 having the gate electrode 24d with a desired gate length can formed, and the semiconductor device having preferable electrical characteristics can be also provided.

Also in the intermediate-voltage transistor forming region 6, since the top surface of the device separating area 14c is lower than the top surface of the active region 16c to some degree, the pattern 102b of the photoresist film for patterning the gate electrode 24c of the intermediate-voltage transistor 66 is pulled in the longitudinal direction. However, since the gate length of the gate electrode 24c of the intermediate-voltage transistor 66 is relatively long, i.e., 350 nm, even if the pattern 102b of the photoresist film for patterning the gate electrode 24c is thinner by several nanometers, this does not influence on electrical characteristics of the intermediate-voltage transistor 66.

Further, also in the high-voltage transistor forming region 4, since the top surface of the device separating area 14b is lower than the top surface of the active region 16b to some degree, the pattern 102a of the photoresist film for patterning the gate electrode 24b of the high-voltage transistor 56 is pulled in the longitudinal direction. However, the gate length of the gate electrode 24b of the high-voltage transistor 56 is relatively long, i.e., 700 nm, even if the pattern 102a of the photoresist film for patterning the gate electrode 24b is thinner by several nanometers, this does not influence on electrical characteristics of the high-voltage transistor 56.

Subsequently, by using the photoresist film 102 as the mask, the polysilicon film 24 is etched. Thus, the gate electrode 24b of the high-voltage transistor 56, the gate electrode 24c of the intermediate-voltage transistor 66, and the gate electrode 24d of the low-voltage transistor 76 are individually formed (refer to FIGS. 52A and 52B).

Subsequently, with the ion-implantation method, dopant impurities are guided to the active region 16a on both sides of the control gate 24a, and the extension area 26 and a pocket area (not shown) are formed.

Further, dopant impurities are guided to the active region 16b on both sides of the gate electrode 24b, and the extension area 50 and a pocket area (not shown) are formed.

Furthermore, dopant impurities are guided to the active region 16c on both sides of the gate electrode 24c, thereby forming the extension area 60 and a pocket area (not shown).

Figure 53A:
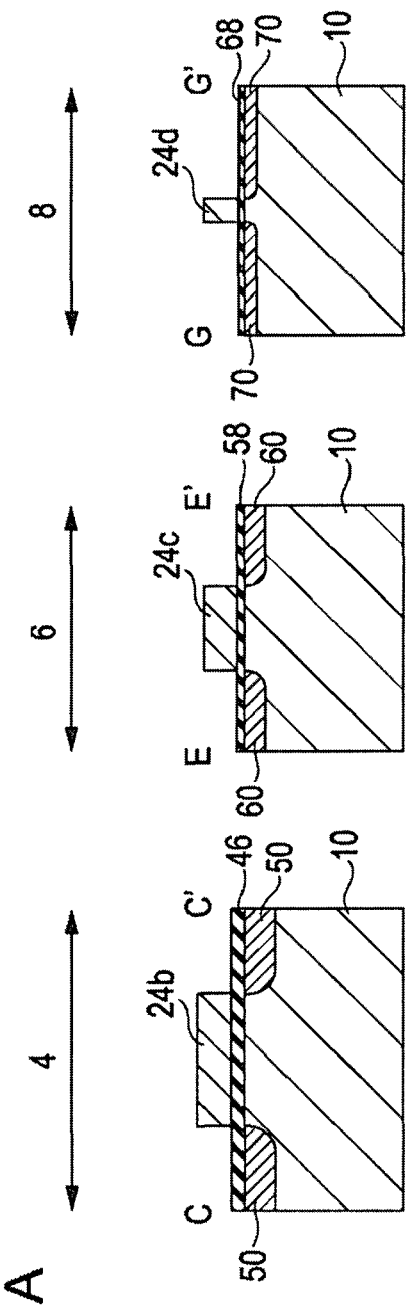
FIGS. 53A and 53B are cross-sectional views showing the step of manufacturing the semiconductor device according to the second embodiment of the present technique.
Figure 53B:
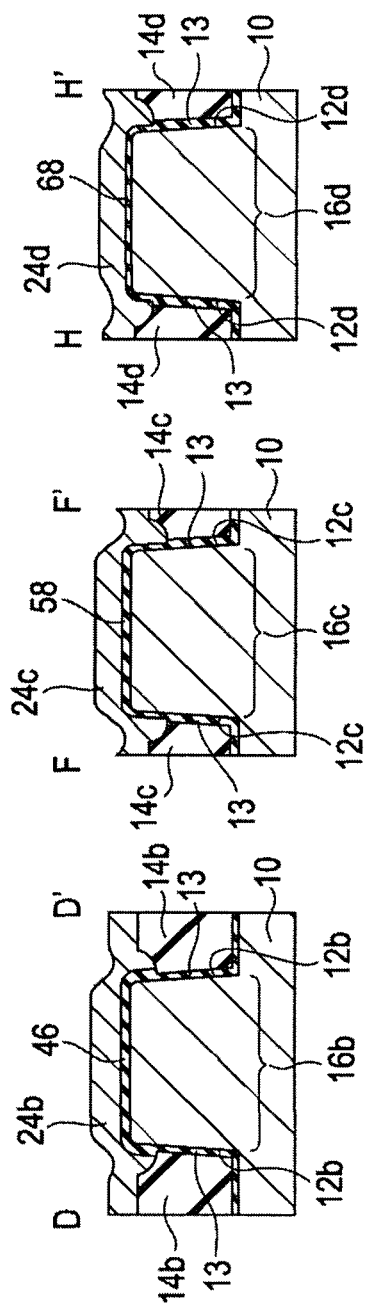

In addition, dopant impurities are guided to the active region 16d on both sides of the gate electrode 24d, and the extension area 70 and a pocket area (not shown) are formed (refer to FIGS. 53A and 53B).

Subsequently, the side-wall insulating films (side-wall spacer) 28 is formed to a side wall portion of the gate electrode 24b of the high-voltage transistor 56, a side wall portion of the gate electrode 24c of the intermediate-voltage transistor 66, and a side wall portion of the gate electrode 24d of the low-voltage transistor 76.

Subsequently, with the ion-implantation method, within the active region 16b on both sides of the gate electrode 24b to which the side-wall insulating film 28 is formed, the high-concentration impurity area 52 is formed. As mentioned above, the source and the drain region 54 has the extension area 50 and the high-concentration impurity area 52.

Further, with the ion-implantation method, within the active region 16c on both sides of the gate electrode 24c to which the side-wall insulating film 28 is formed, the high-concentration impurity area 62 is formed. As mentioned above, the source and the drain region 64 has the extension area 60 and the high-concentration impurity area 62.

Furthermore, with the ion-implantation method, within the active region 16d on both sides of the gate electrode 24d to which the side-wall insulating film 28 is formed, the high-concentration impurity area 72 is formed. As mentioned above, the source and the drain region 74 has the extension area 70 and the high-concentration impurity area 72.

Figure 54A:
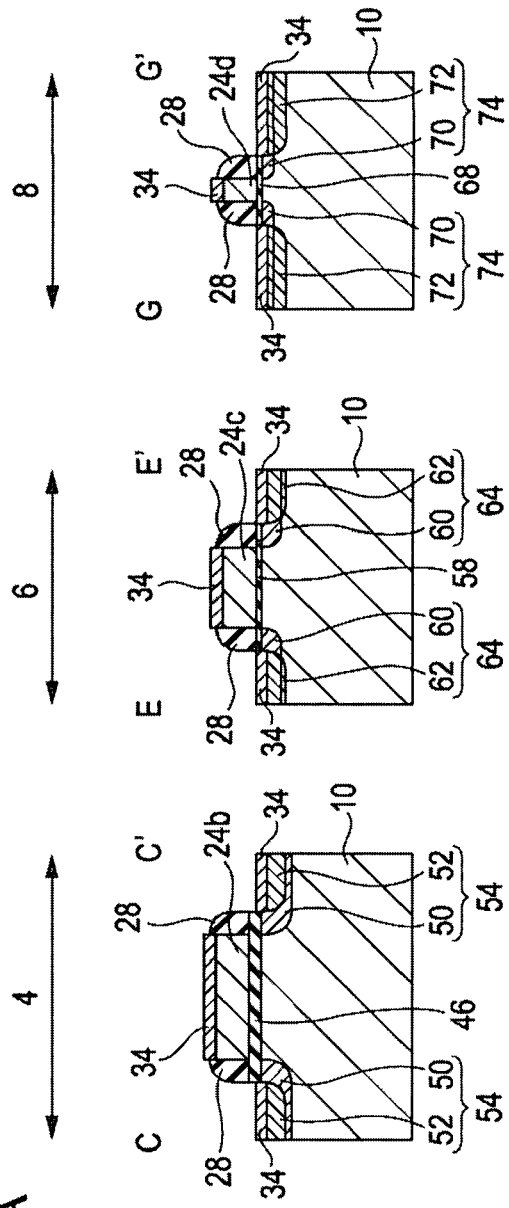
FIGS. 54A and 54B are cross-sectional views showing the step of manufacturing the semiconductor device according to the second embodiment of the present technique.
Figure 54B:
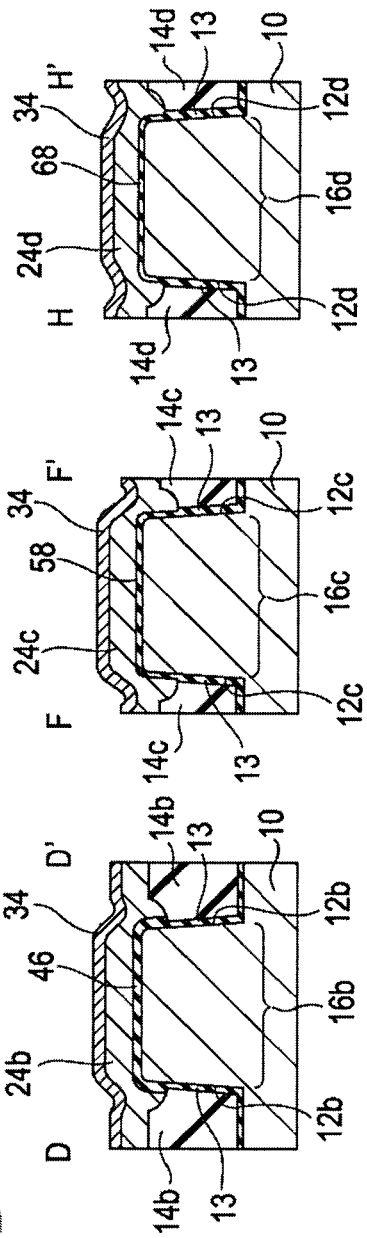

Subsequently, on the gate electrodes 24b to 24d and the source and the drain regions 54, 64, and 74, the silicide films 34 are formed (refer to FIGS. 54A and 54B). The silicide films 34 on the source and the drain regions 54, 64, and 74 function as the source and the drain electrodes.

Subsequently, with the CVD method to the whole substrate, the inter-layer insulating film 78 containing a silicon oxidation film is formed.

Subsequently, with the photolithography technology, the contact hole 80 reaching the source and the drain electrode 34 is formed.

Subsequently, with the CVD method to the whole substrate, a conductive film is formed.

Subsequently, with the CMP method, a conductive film is polished until exposing the surface of the inter-layer insulating film 78. Thus, the conductive plug 82 containing the conductive film is embedded into the contact hole 80 (refer to FIGS. 55A and 55B).

Subsequently, with the CVD method to the whole substrate, the inter-layer insulating film 84 containing a silicon oxidation film is formed.

Subsequently, the trench 85 for embedding the wiring 86 is formed to the inter-layer insulating film 84.

Subsequently, with the sputtering method to the whole substrate, a conductive film is formed.

Subsequently, the conductive film is patterned. Thus, the wiring 84 having the conductive film is embedded into the trench 85.

Figure 56A:
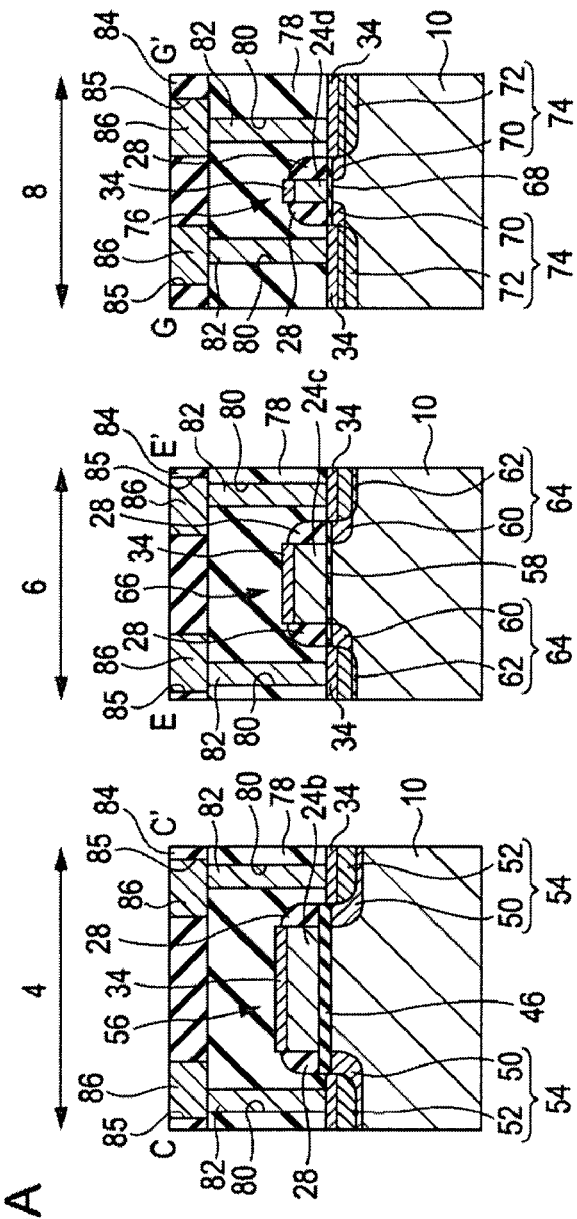
FIGS. 56A and 56B are cross-sectional views showing the step of manufacturing the semiconductor device according to the second embodiment of the present technique.
Figure 56B:
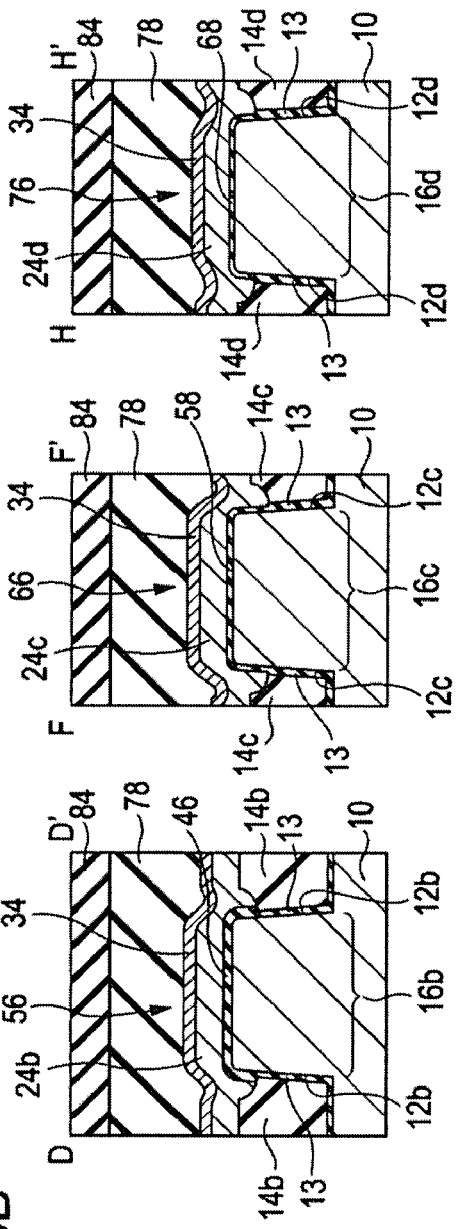

Accordingly, the semiconductor device according to the first embodiment is manufactured (refer to FIGS. 56A and 56B).

As mentioned above, according to the second embodiment, while there is the silicon nitride film 104 on the active region 16d of the low-voltage transistor forming region 8 without removing the silicon nitride film 104 on the active region 16d of the low-voltage transistor forming region 8, the gate insulating film 46 of the high-voltage transistor 56 and the gate insulating film 58 of the intermediate-voltage transistor 66 are formed. Therefore, it is possible to prevent, from being grown to be thin, the silicon oxidation film 92 on the active region 16d of the low-voltage transistor 76. Further, it is possible to prevent the excessive etching of the device separating area 14d of the low-voltage transistor forming region 8 upon removing the silicon oxidation film 92 on the active region 16d of the low-voltage transistor forming region 8. Furthermore, it is possible to prevent the height of the top surface of the device separating area 14d of the low-voltage transistor forming region 8 from being excessively lower than the active region 16d. Consequently, according to the second embodiment, it is possible to prevent the pattern 102c of the photoresist film for patterning the gate electrode 24d of the low-voltage transistor 76 from being strongly pulled in the longitudinal direction. In addition, it is possible to prevent the pattern 102d of the photoresist film for patterning the gate electrode 24d of the low-voltage transistor 76 from being excessively thin. Therefore, according to the second embodiment, it is possible to form the low-voltage transistor 76 having the gate electrode 24d with a desired gate length, and the semiconductor device having preferable electrical characteristics can also be provided.

The present technique is not limited to the embodiments and can be variously modified.

According to the second embodiment, while there is the silicon nitride film 102 on the active region 16d of the low-voltage transistor forming region 8, the gate insulating film 46 is formed on the active region 16b of the high-voltage transistor forming region 4 and the gate insulating film 58 is also formed on the active region 16c of the intermediate-voltage transistor forming region 4. However, the silicon nitride film 102 may not be formed. If forming the gate insulating film 46 on the active region 16b of the high-voltage transistor forming region 4 and further forming the gate insulating film 58 on the active region 16c of the intermediate-voltage transistor forming region 4 while there is the silicon oxidation film 92 on the active region 16d of the low-voltage transistor forming region 8, it is possible to prevent the silicon oxidation film from being grown to be thin on the active region 16d of the low-voltage transistor forming region 8. However, if forming the gate insulating film 46 on the active region 16b of the high-voltage transistor forming region 4 and further forming the gate insulating film 58 on the active region 16c of the intermediate-voltage transistor forming region 4 while forming the silicon nitride film 104 on the active region 16d of the low-voltage transistor forming region 8, it is possible to prevent the silicon oxidation film from being grown on the active region 16d of the low-voltage transistor forming region 8 without fail. Consequently, preferably, while forming the silicon nitride film 104 on the active region 16d of the low-voltage transistor forming region 8, the gate insulating film 46 is formed on the active region 16b of the high-voltage transistor forming region 4 and the gate insulating film 58 is also formed on the active region 16c of intermediate-voltage transistor forming region 4.

Further, according to the embodiments, the description is given of the example of forming the high-voltage transistor 56, the intermediate-voltage transistor 66, and the low-voltage transistor 76. However, the three types of transistors including the high-voltage transistor, the intermediate-voltage transistor, and the low-voltage transistor may not be provided. The present technique can be widely applied to the semiconductor device having two or more types of transistors having different withstand-voltages, i.e., the semiconductor device including two or more types of transistors with different thicknesses of the gate insulating film.

Furthermore, according to the embodiments, as the film having the oxidation resistance, the silicon nitride film is formed as the example. However, the film having the oxidation resistance is not limited to the silicon nitride film 104. For example, as the film having the oxidation resistance, a carbonized silicon film may be formed.

As mentioned above in details, the features of the present technique are summarized as follows.

What is claimed is:

1. A method of manufacturing a semiconductor device comprising a first transistor formed over a first device region surrounded by a first device separating area in a first area of a substrate, and a second transistor formed over a second device region surrounded by a second device separating area in a second area of the substrate, comprising:

forming an oxidation film over the first and the second device region;

forming an first etching preventing film extending over the first and the second area;

removing the first etching preventing film over the first area;

removing the oxidation film over the first device region and exposing a surface of the first device region;

forming a first gate insulating film having a first thickness over the first device region while the second device region is covered by the oxidation film;

removing the oxidation film over the second device region;

forming a second gate insulating film over the second device region, the second gate insulating film having a second thickness less than the first thickness of the first gate insulating film;

forming a first gate electrode over the first gate insulating film, and forming a second gate electrode over the second gate insulating film; and forming first source and drain regions in the first device region at both sides of the first gate electrode and forming second source and drain regions in the second device region at both sides of the second gate electrode.

2. The method according to claim 1, wherein the forming the first gate electrode over the first gate insulating film, and the forming the second gate electrode over the second gate insulating film forms a conductive film over the first area and the second area, forms a photoresist film on the conductive film, forms a first resist pattern film on the conductive film on the first area, and a second resist pattern film on the conductive film on the second area, and forms the first and second gate electrode being made of the conductive film by etching the conductive film using the first resist pattern film and the second resist pattern film as a mask.

3. The method according to claim 1, the semiconductor device further comprising a memory cell formed on a third device region surrounded by a third device separation area in a third area of the substrate, the method further comprising;

forming the oxidation film extending over the third device region while the oxidation film extending over the first and the second device regions is formed;

forming the first etching preventing film over the third area while the first etching preventing film extending over the first area and the second area is formed;

removing the first etching preventing film over the third area removing the oxidation film over the third device region and exposing a surface of the third device region;

forming a tunnel insulating film over the third device;

forming a floating gate on the tunnel insulating film on the third device region;

forming a laminate film comprising a silicon nitride film extending over the first, the second, and the third area;

forming a control gate over the floating gate while the first gate electrode is formed on the first gate insulating film and the second gate electrode is formed on the second gate insulating film; and forming third source and drain regions in the third device region at both sides of the control gate while the first source and drain regions in the first device region at both sides of the first gate electrode, and the second source and drain regions in the second device region at both sides of the second gate electrode are formed.

4. The method according to claim 3, wherein the forming the control gate over the floating gate forms the conductive film over the third area, forms the photoresist film on the conductive film on the third area, forms a third resist pattern film on the conductive film on the third area, and forms the control gate being made of the conductive film by etching the conductive film the third resist pattern film as a mask.

5. The method according to claim 3, wherein
the laminate film comprises a first silicon oxidation film, the silicon nitride film formed on the first silicon nitride film, and a second silicon oxidation film formed on the silicon nitride film.

6. The method according to claim 1, the semiconductor device further comprising a memory cell formed on a third device region surrounded by a third device separation area in a third area of the substrate, a third transistor formed on a fourth region surrounded by a fourth device separation area in a fourth area of the substrate, the method further comprising:

forming the oxidation film extending over the third and the fourth device regions while the oxidation film extending over the first and the second device regions is formed;

forming the first etching preventing film over the third and the fourth areas while the first etching preventing film extending over the first area and the second area is formed;

removing the first etching preventing film over the third area and the fourth area removing the oxidation film over the third device region and fourth device region and exposing a surface of the third device region and a surface of the fourth device region;

forming a tunnel insulating film over the third device region;

forming a floating gate on the tunnel insulating film on the third device region;

forming a laminate film comprising a silicon nitride film extending over the first, the second, the third, and the fourth area;

exposing a surface of the fourth device region while the second area are covered by the laminate film;

forming a third gate insulating film extending over the fourth device region, and the third gate insulating film having a third thickness greater than the first thickness of the first gate insulating film while the second area are covered by the laminate film;

forming a third gate electrode on the third gate insulating film, and forms a control gate over the floating; and forming third source and drain regions in the third device region at both sides of the control gate, and fourth source and drain regions in the fourth device region at both sides of the third gate electrode while the first source and drain regions in the first device region at both sides of the first gate electrode and the second source and drain regions in the second device region at both sides of the second gate electrode are formed.

7. The method according to claim 1, the semiconductor device further comprising a third transistor formed on a third device region surrounded by a third device separation area in a third area of the substrate, the method further comprising:

forming the oxidation film extending over the third device region while the oxidation film extending over the first and the second device regions is formed;

forming the first etching preventing film extending over the third area while the first etching preventing film extending over the first area and the second area is formed;

exposing a surface of the third device region while the second device region and the second area are covered by the first etching preventing film and the oxidation film;

forming a third gate insulating film over the third device region, the third gate insulating film having a third thickness greater than the first thickness of the first insulating film while the second device region and the second area are covered by the oxidation film;

forming a third gate electrode on the third gate insulating film, while the first gate electrode is formed on the first gate insulating film, and the second gate electrode is formed on the second gate insulating film;

forming third source and drain regions in the third device region at both sides of the third gate electrode while the first source and drain regions in the first device region at both sides of the first gate electrode, and the second source and drain regions in the second device region at both sides of the second gate electrode are formed.

8. The method according to claim 7, further comprising:

forming a conducive film over the first area, the second area and the third area;

forming a photoresist film on the conductive film;

forming a first pattern film on the first device region, a second pattern film on the second device region and a third pattern film on the third device region being made of the photoresist film; and forming the first, the second, and the third gate electrode made of the conductive film by etching the conductive film using the first, the second and the third pattern film as a mask.

9. The method according to claim 1, wherein the first etching preventing film is silicon nitride.

* * * * *